US011791782B2

(12) United States Patent
Kondo et al.

(10) Patent No.: US 11,791,782 B2
(45) Date of Patent: Oct. 17, 2023

(54) POWER AMPLIFICATION MODULE

(71) Applicant: Murata Manufacturing Co., Ltd., Kyoto-fu (JP)

(72) Inventors: Masao Kondo, Nagaokakyo (JP);
Kiichiro Takenaka, Nagaokakyo (JP);
Satoshi Tanaka, Nagaokakyo (JP);
Takayuki Tsutsui, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 489 days.

(21) Appl. No.: 17/123,230

(22) Filed: Dec. 16, 2020

(65) Prior Publication Data
US 2021/0194444 A1    Jun. 24, 2021

(30) Foreign Application Priority Data

Dec. 20, 2019   (JP) .................................. 2019-230221
Sep. 15, 2020   (JP) .................................. 2020-155001

(51) Int. Cl.
*H03F 3/14*        (2006.01)
*H03F 3/213*       (2006.01)
(Continued)

(52) U.S. Cl.
CPC ............. *H03F 3/213* (2013.01); *H01L 23/66* (2013.01); *H01L 24/16* (2013.01); *H03F 1/565* (2013.01);
(Continued)

(58) Field of Classification Search
CPC .... H03F 3/213; H03F 1/565; H03F 2200/222; H03F 2200/451; H03F 3/195; H03F 3/602; H03F 3/20; H03F 3/14; H01L 23/66; H01L 24/16; H01L 2223/6655; H01L 2224/16227; H01L 2924/1421; H01L 2924/30111; H01L 2224/16225; H01L 2224/17; H01L 23/5223; H01L 23/5227; H01L 2924/3011; H05K 1/181; H05K 2201/10166
(Continued)

(56) References Cited

U.S. PATENT DOCUMENTS 5,111,157 A * 5/1992 Komiak .................. H03F 3/604
330/307
5,955,926 A * 9/1999 Uda ........................ H03F 3/604
330/295
(Continued)

FOREIGN PATENT DOCUMENTS

JP      2000-106386 A    4/2000

*Primary Examiner* — Khanh V Nguyen
(74) *Attorney, Agent, or Firm* — Studebaker & Brackett PC

(57) ABSTRACT

A semiconductor chip includes a plurality of transistor rows. Corresponding to the plurality of transistor rows, a first bump connected to a collector of the transistor is arranged, and a second bump connected to an emitter is arranged. The transistor rows are arranged along sides of a convex polygon. A first land and a second land provided in a circuit board are connected to the first bump and the second bump, respectively. A first impedance conversion circuit connects the first land and the signal output terminal. A plurality of transistors in the transistor row are grouped into a plurality of groups, and the first impedance conversion circuit includes a reactance element arranged for each of the groups.

20 Claims, 39 Drawing Sheets

(51) Int. Cl.
*H03F 1/56* (2006.01)
*H05K 1/18* (2006.01)
*H01L 23/66* (2006.01)
*H01L 23/00* (2006.01)

(52) U.S. Cl.
CPC ...... *H05K 1/181* (2013.01); *H01L 2223/6655* (2013.01); *H01L 2224/16227* (2013.01); *H01L 2924/1421* (2013.01); *H01L 2924/30111* (2013.01); *H03F 2200/222* (2013.01)

(58) Field of Classification Search
USPC ...................................... 330/124 R, 295, 307
See application file for complete search history.

(56) References Cited

U.S. PATENT DOCUMENTS

| | | | |
|---|---|---|---|
| 9,712,142 B2* | 7/2017 | Takagi | H03K 5/1252 |
| 9,741,673 B2* | 8/2017 | Andre | H01G 5/38 |
| 10,742,178 B2* | 8/2020 | Zhu | H03F 3/195 |
| 11,070,171 B2* | 7/2021 | Datta | H03F 1/0211 |

* cited by examiner

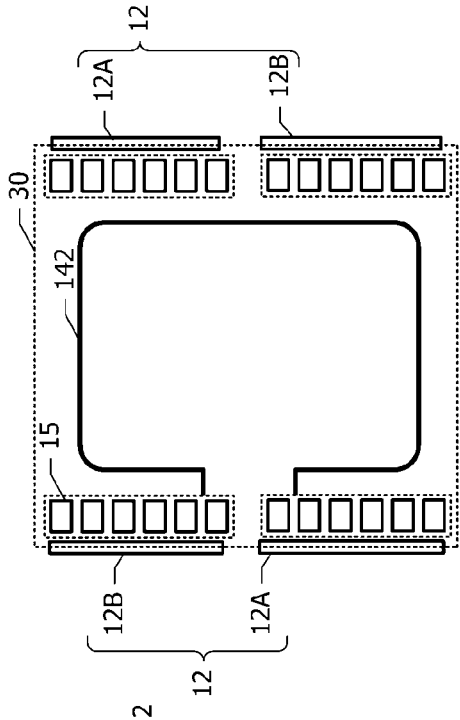
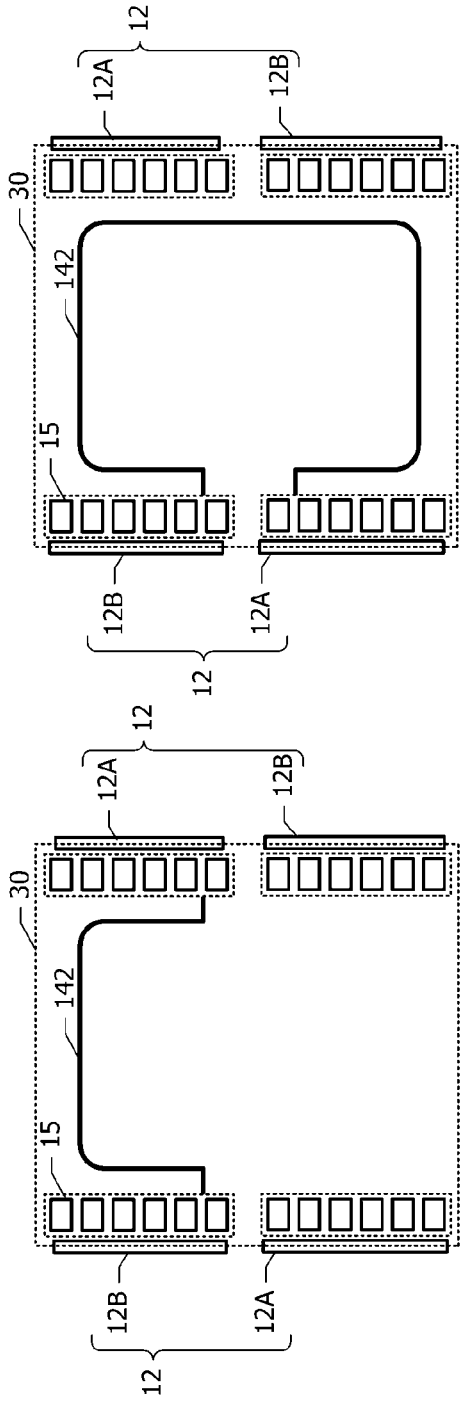
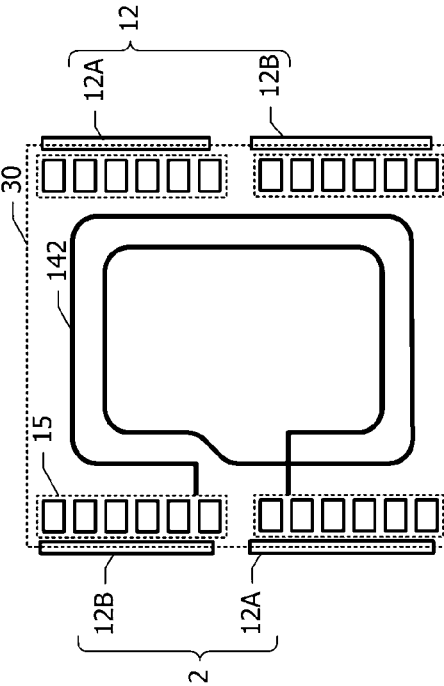
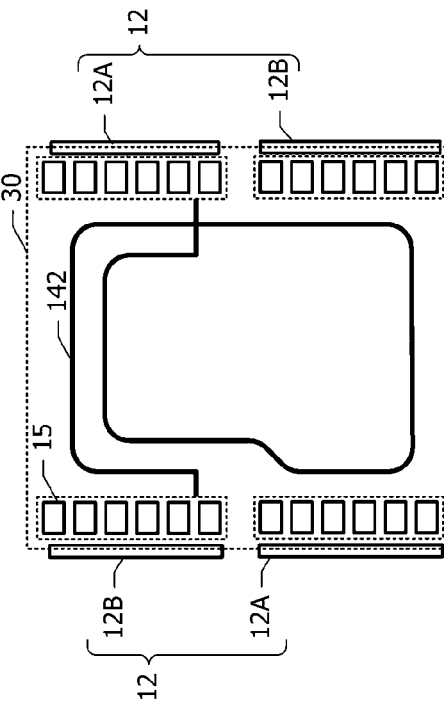

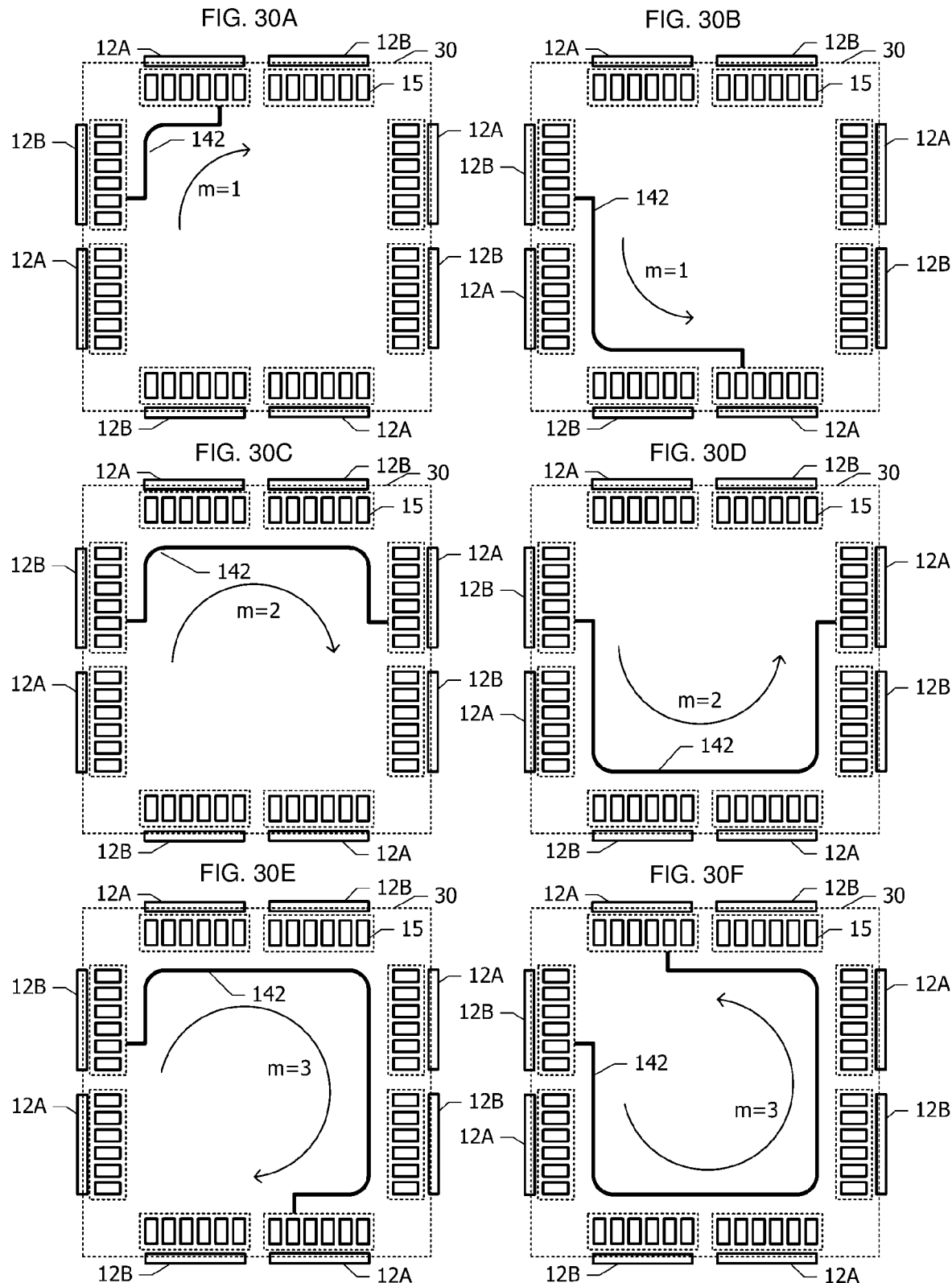

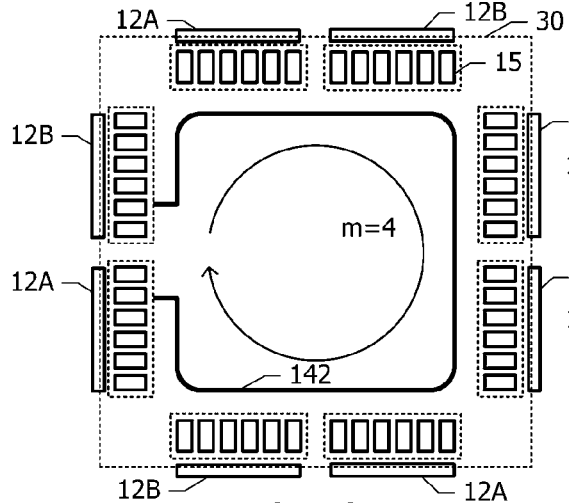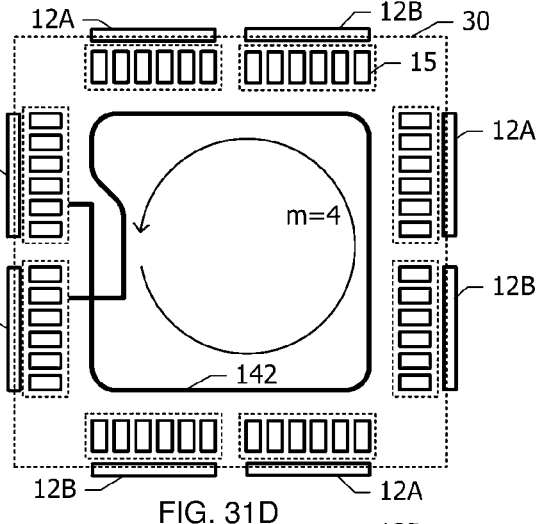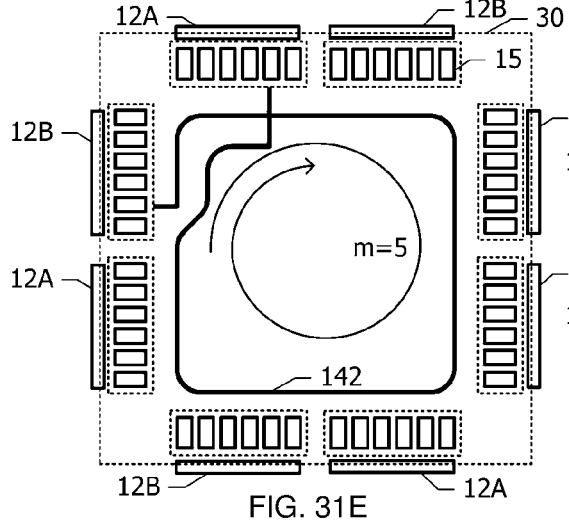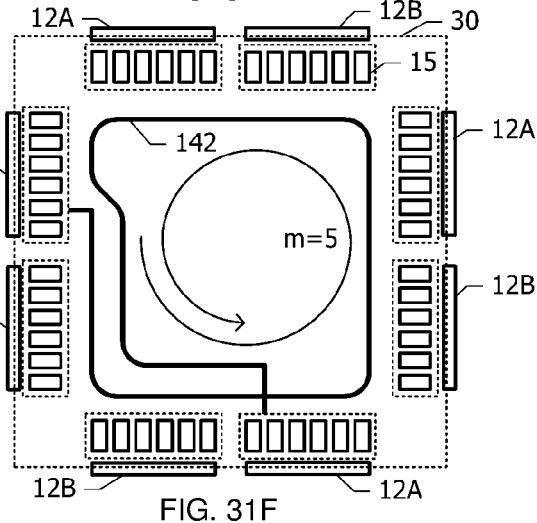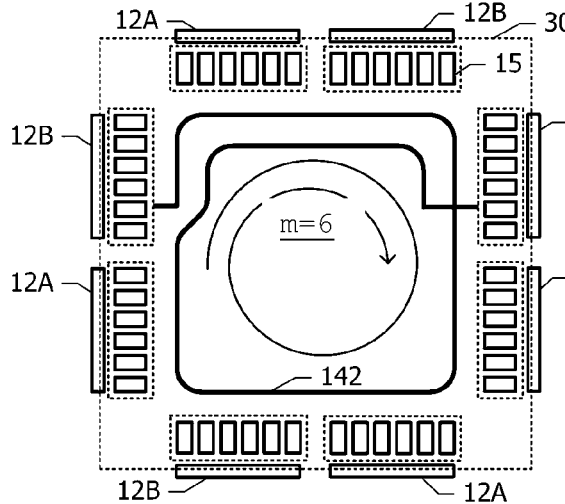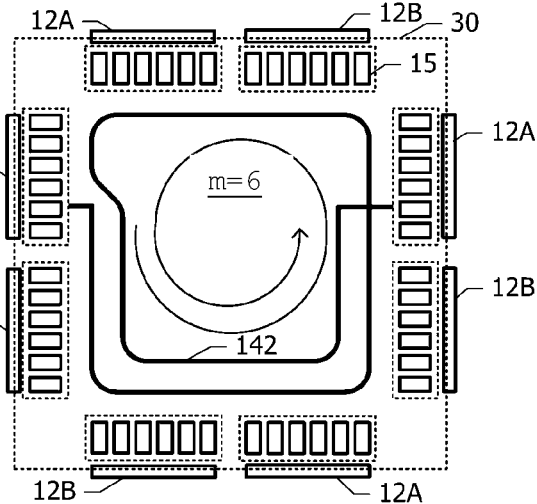

POWER AMPLIFICATION MODULE

CROSS-REFERENCE TO RELATED APPLICATIONS

This application claims benefit of priority to Japanese Patent Application No. 2020-155001, filed Sep. 15, 2020, and to Japanese Patent Application No. 2019-230221, filed Dec. 20, 2019, the entire contents of which are incorporated herein by reference.

BACKGROUND

Technical Field

The present disclosure relates to a power amplification module.

Background Art

A plurality of transistors connected in parallel to each other is used as a final stage (power stage) of a high-frequency power amplifier circuit in a multistage configuration. An impedance conversion circuit for impedance matching is inserted between a power stage amplifier circuit and a load. Generally, an impedance conversion circuit that converts an output impedance of a power stage amplifier circuit to a high impedance is used.

In order to increase output of the power amplifier circuit, it is necessary to flow a large current through a signal path from a collector as a signal output port of a transistor group to an input port of the impedance conversion circuit. The loss in the signal path is proportional to a product of the square of a current and a parasitic resistance. For this reason, when the flowing current increases, the loss increases in proportion to the square of the current. On the other hand, since the impedance is increased after passing through the impedance conversion circuit and the current is decreased, a contribution of the parasitic resistance that affects the loss becomes smaller. Therefore, in order to reduce the loss and achieve the high output, it is desirable to reduce the parasitic resistance of the signal path through which the large current flows from the collector of the transistor to the input port of the impedance conversion circuit.

Further, in the individual transistors, when the parasitic resistance and the parasitic inductance generated in the signal path from the collector to the input port of the impedance conversion circuit vary between the plurality of transistors, the operation varies among the plurality of transistors. The variation in the operation between the plurality of transistors causes a decrease in the output of the high-frequency power amplifier circuit.

In order to achieve high output, there has been proposed a power amplification module in which the arrangement of a plurality of transistors in a power stage amplifier circuit is devised, as described in Japanese Unexamined Patent Application Publication No. 2000-106386. In this power amplification module, a plurality of transistors is arranged in a row, and collectors of the plurality of transistors are connected to each other and are connected to a signal output bump.

When the number of transistors is increased in order to further increase the output of the power amplifier circuit, a region occupied by the plurality of transistors arranged in a row becomes longer. As a result, depending on the transistor, the signal path from the signal output port to the impedance conversion circuit becomes longer, and the parasitic resistance increases. In addition, the variation in length from the signal output port of the transistor to the impedance conversion circuit becomes large.

SUMMARY

Accordingly, the present disclosure provides a power amplification module capable of suppressing an increase in the length of a region occupied by a plurality of transistor rows and suppressing an increase in parasitic resistance from the transistor to the impedance conversion circuit and an increase in a variation in parasitic inductance even when the number of transistors is increased.

According to an aspect of the present disclosure, a power amplification module including a circuit board and a semiconductor chip mounted on the circuit board is provided, in which the semiconductor chip includes a substrate; and a plurality of transistor rows formed in or on the substrate. Each of the plurality of transistor rows includes a plurality of power stage transistors arranged in a straight line. Each of the plurality of power stage transistors is a bipolar transistor or an electric field effect transistor having an emitter or a source as a ground port, a collector or a drain as a signal output port, and a base or a gate as a signal input port. The semiconductor chip further includes a plurality of first bumps arranged respectively corresponding to the plurality of transistor rows and connected to a signal output port of the plurality of power stage transistors included in a corresponding transistor row, and a plurality of second bumps arranged respectively corresponding to the plurality of transistor rows and connected to a ground port of the plurality of power stage transistors included in a corresponding transistor row. The plurality of transistor rows is respectively arranged along a plurality of sides of a convex polygon. The circuit board includes a plurality of first lands respectively connected to the plurality of first bumps, a plurality of second lands respectively connected to the plurality of second bumps, a ground pattern connected to the plurality of second lands, a signal output terminal, and a first impedance conversion circuit that connects the plurality of first lands and the signal output terminal. The plurality of power stage transistors is grouped into a plurality of groups, and the first impedance conversion circuit includes a plurality of individual reactance elements arranged for each of the plurality of groups.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 29A to FIG. 29D are schematic diagrams illustrating a connection mode of a secondary coil of a second transformer in a case where transistor rows are arranged in two rows;

FIG. 30A to FIG. 30F are schematic diagrams illustrating a connection mode of the secondary coil of the second transformer in a case where the transistor rows are arranged in four rows;

FIG. 31A to FIG. 31F are schematic diagrams illustrating a connection mode of the secondary coil of the second transformer in a case where the transistor rows are arranged in four rows;

DETAILED DESCRIPTION

First Embodiment

A power amplification module according to a first embodiment will be described with reference to the drawings illustrated in FIG. 1 to FIG. 5.

Figure 1:
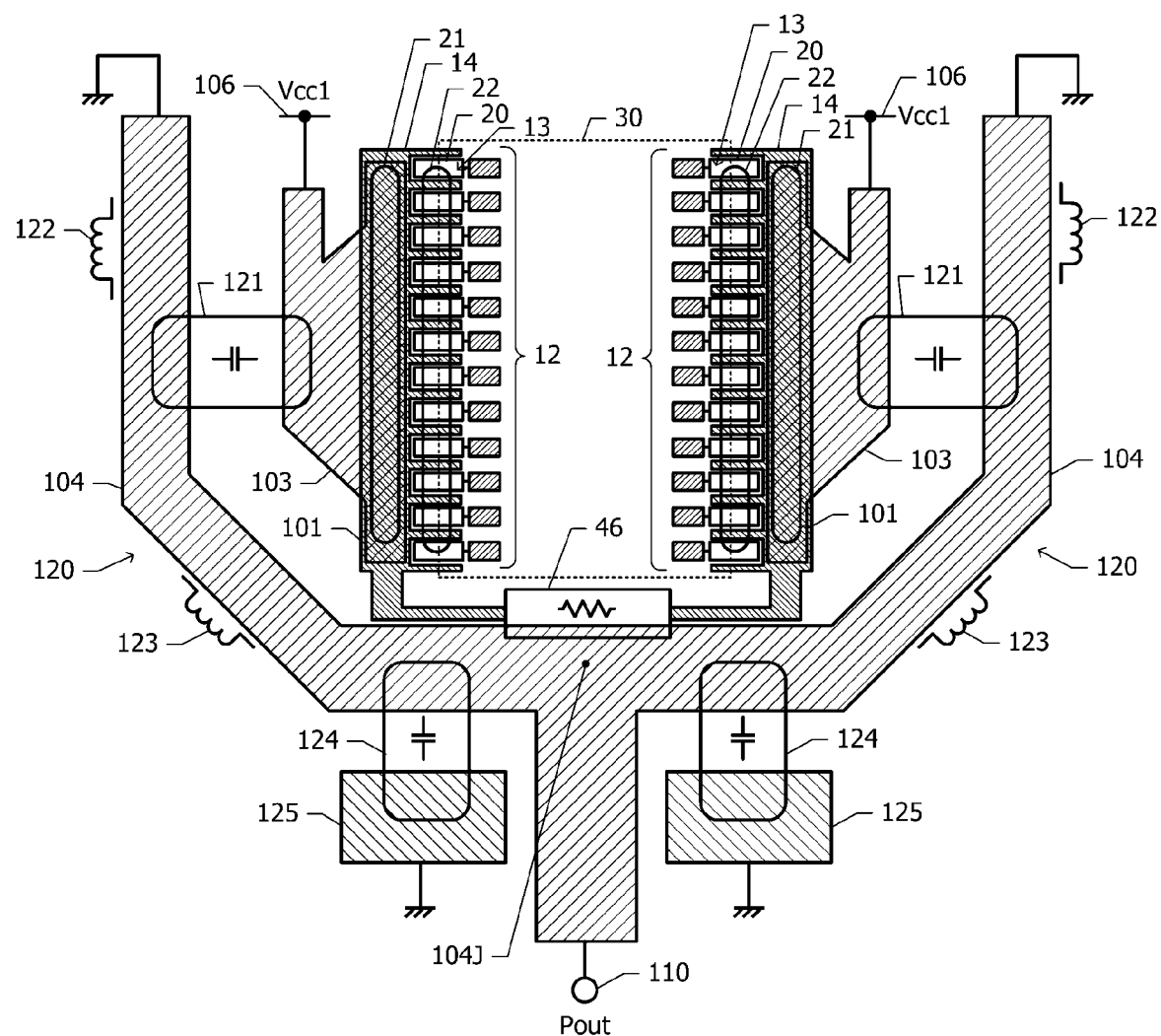
FIG. 1 is a diagram illustrating a positional relationship between a plurality of components of a power stage amplifier circuit and an output impedance conversion circuit of a power amplification module according to a first embodiment in a plan view.

FIG. 1 is a diagram illustrating a positional relationship between a plurality of components of a power stage amplifier circuit and an output impedance conversion circuit of the power amplification module according to the first embodiment in a plan view. The power amplification module according to the first embodiment includes a semiconductor chip and a circuit board. In FIG. 1, a conductor film formed in the semiconductor chip is marked with a relatively thick hatching, and a conductor film formed in the circuit board is marked with a relatively thin hatching.

First, a configuration of the semiconductor chip will be described. The semiconductor chip includes a substrate made of a semiconductor and two transistor rows 12 arranged in or on the substrate. Each of the two transistor rows 12 includes a plurality of (for example, 12 pieces) power stage transistors 13 arranged in a straight line. Each of the plurality of power stage transistors 13 belongs to any one of the two transistor rows 12. Each of the power stage transistors 13 is a bipolar transistor provided with a collector serving as a signal output port, a base serving as a signal input port, and an emitter serving as a ground port. The detailed structure of the power stage transistor 13 will be described later with reference to FIG. 3 and FIG. 4. In the present specification, the signal output port, the signal input port, and the ground port of the plurality of power stage transistors 13 of the transistor row 12 may be referred to as a signal output port of the transistor row 12, a signal input port of the transistor row 12, and a ground port of the transistor row 12, respectively in some cases.

Each of the plurality of power stage transistors 13 includes a collector mesa 20 long in a direction orthogonal to an array direction of the power stage transistors 13 (hereinafter referred to as a length direction of the transistor row 12) in a plan view. The collector mesa 20 includes a collector layer, a base layer, and an emitter layer that are laminated on each other.

The two transistor rows 12 are arranged along two sides facing each other of a virtual convex polygon 30 having a substantially rectangular shape in a plan view, respectively. A first bump 21 and a second bump 22 are arranged respectively corresponding to the two transistor rows 12. As viewed from a geometric center of the convex polygon 30, each of the plurality of first bumps 21 is arranged at a position farther than the corresponding second bump 22. Each of the two first bumps 21 is connected to the signal output port of the corresponding transistor row 12 via a collector wiring 14. Each of the two second bumps 22 is connected to the ground port of the corresponding transistor row 12. Base wirings 15 (see FIG. 3) are connected to bases of the plurality of power stage transistors 13, respectively. That is, the plurality of base wirings 15 is connected to the respective signal input ports of the two transistor rows 12.

In a plan view, the base wirings 15 are respectively drawn out from a region in which the collector mesa 20 of the power stage transistor 13 is arranged toward an inner side portion of the convex polygon 30. The second bump 22 is arranged at a position overlapping the collector mesa 20 of the power stage transistor 13 in a plan view, and has a shape substantially long in an array direction of the power stage transistors 13. The collector wirings 14 are drawn out from a region between the collector mesas 20 of the plurality of power stage transistors 13 toward an outer side portion of the convex polygon 30, and are bundled to one for each of the transistor rows 12. The first bump 21 is arranged at a position overlapping the bundled portion of the collector wirings 14. Each of the first bumps 21 has a shape substantially elongated in a direction parallel to the length direction of the corresponding transistor row 12.

Two collector wirings 14 arranged for each of the two transistor rows 12 are connected to each other via a resistor element 46 provided in the semiconductor chip.

Next, a configuration of the circuit board will be described. In a plan view, first lands 101 are respectively arranged in regions overlapping the two first bumps 21. From each of the two first lands 101, an output wiring 103 is extended toward the outer side portion of the convex polygon 30. The two output wirings 103 are connected to first power supply wirings 106, respectively. A power supply voltage Vcc1 is applied to a collector of the power stage transistor 13 from the first power supply wiring 106 via the output wiring 103, the first land 101, the first bump 21, and the collector wiring 14.

One terminals of chip capacitors 121 are connected to tips of two output wirings 103, respectively. The other terminals of the two chip capacitors 121 are respectively connected to an output wiring 104.

The output wiring 104 extends in two directions from a portion connected to each of the two chip capacitors 121. Portions of the output wiring 104 that extend in one directions are grounded at tips thereof. Portions of the output wiring 104 that are from the portions connected to the chip capacitors 121 to the ground portions function as an inductor 122. A portion of the output wiring 104 that extends in another direction from the portion connected to one chip capacitor 121 and a portion of the output wiring 104 that extends in another direction from the portion connected to the other chip capacitor 121 are connected at a junction point 104J. The junction point 104J is connected to a signal output terminal 110. An amplified output signal Pout is output from the signal output terminal 110.

One terminals of chip capacitors 124 are respectively connected to the output wiring 104 between the junction point 104J and the portions connected to the two chip capacitors 121. The other terminals of the two chip capacitors 124 are connected to ground lands 125, respectively. The ground land 125 is grounded. A portion of the output wiring 104 that is from the portion connected to the chip capacitor 121 to the portion connected to the chip capacitor 124 functions as an inductor 123.

The chip capacitors 121 and 124 respectively connected to the output wiring 104 from the junction point 104J to the two ground portions, and the inductors 122 and 123 made of the output wiring 104 configure a first impedance conversion circuit 120. Two first impedance conversion circuits 120 respectively connect the first lands 101 and the signal output terminal 110. Two first lands 101 respectively function as an input portion of the first impedance conversion circuit 120.

The first impedance conversion circuits 120 are arranged for each first land 101. That is, the first impedance conversion circuit 120 is arranged corresponding to each of the signal output ports of the two transistor rows 12. The first impedance conversion circuit 120 has a function of converting an output impedance of the corresponding transistor row 12 and a function of synthesizing the power of high-frequency signals respectively output from the two transistor rows 12.

Lengths of signal paths from the first bump 21 respectively corresponding to the two transistor rows 12 reaching the signal output terminal 110 are approximately equal. Therefore, no phase shift occurs in the signal output terminal 110 by the high-frequency signal output from one transistor row 12 and the high-frequency signal output from the other transistor row 12. For example, when the difference in length between two signal paths is equal to or less than about 20% of an average value of the lengths of the two signal paths, it can be said that the lengths are "substantially equal".

Figure 2:
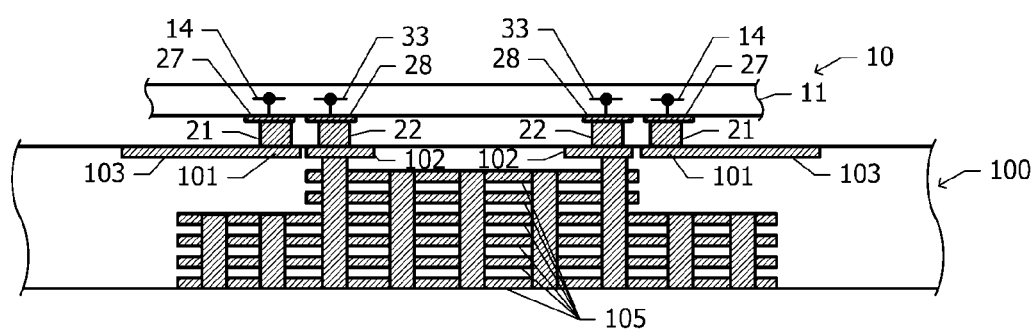
FIG. 2 is a cross-sectional view of a part of the power amplification module according to the first embodiment.

FIG. 2 is a cross-sectional view of a part of the power amplification module according to the first embodiment. The semiconductor chip 10 is flip-chip mounted on a circuit board 100. As the circuit board 100, for example, a printed circuit board is used. The semiconductor chip 10 includes a substrate 11 made of a semiconductor, and two collector pads 27 and two emitter pads 28 are provided on a surface of the substrate 11 facing the circuit board 100. Two first bumps 21 are respectively formed on surfaces of the two collector pads 27. Two second bumps 22 are respectively formed on surfaces of the two emitter pads 28.

The two collector pads 27 are respectively connected to the signal output ports of the plurality of power stage transistors 13 (FIG. 1) via the collector wirings 14 (FIG. 1) provided in the semiconductor chip 10. The two emitter pads 28 are respectively connected to emitters (ground ports) of the plurality of power stage transistors 13 (FIG. 1) of the corresponding transistor rows 12.

The circuit board 100 has two first lands 101 and two second lands 102 provided on a surface on which the semiconductor chip 10 is mounted. Two output wirings 103 respectively extend from the two first lands 101. A plurality of ground patterns 105 is arranged on inner layers of the circuit board 100 and on a surface on the side opposite to the surface on which the semiconductor chip 10 is mounted. The plurality of ground patterns 105 is connected to each other by a plurality of via conductors. The second lands 102 are connected to the plurality of ground patterns 105.

Next, a configuration of the power stage transistor 13 will be described with reference to FIG. 3 and FIG. 4.

Figure 3:
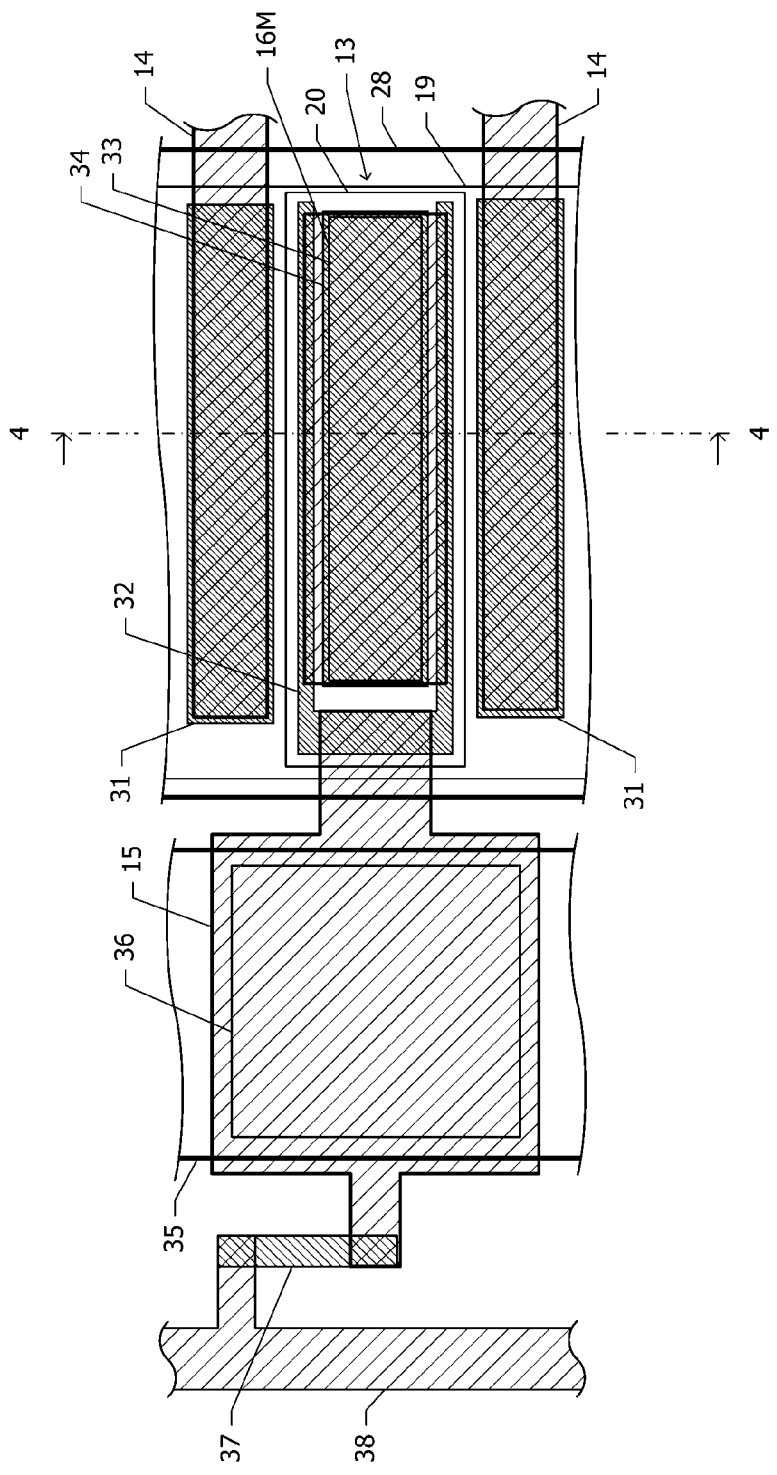
FIG. 3 is a diagram illustrating a positional relationship between a plurality of components of the power stage transistor in a plan view.
Figure 4:
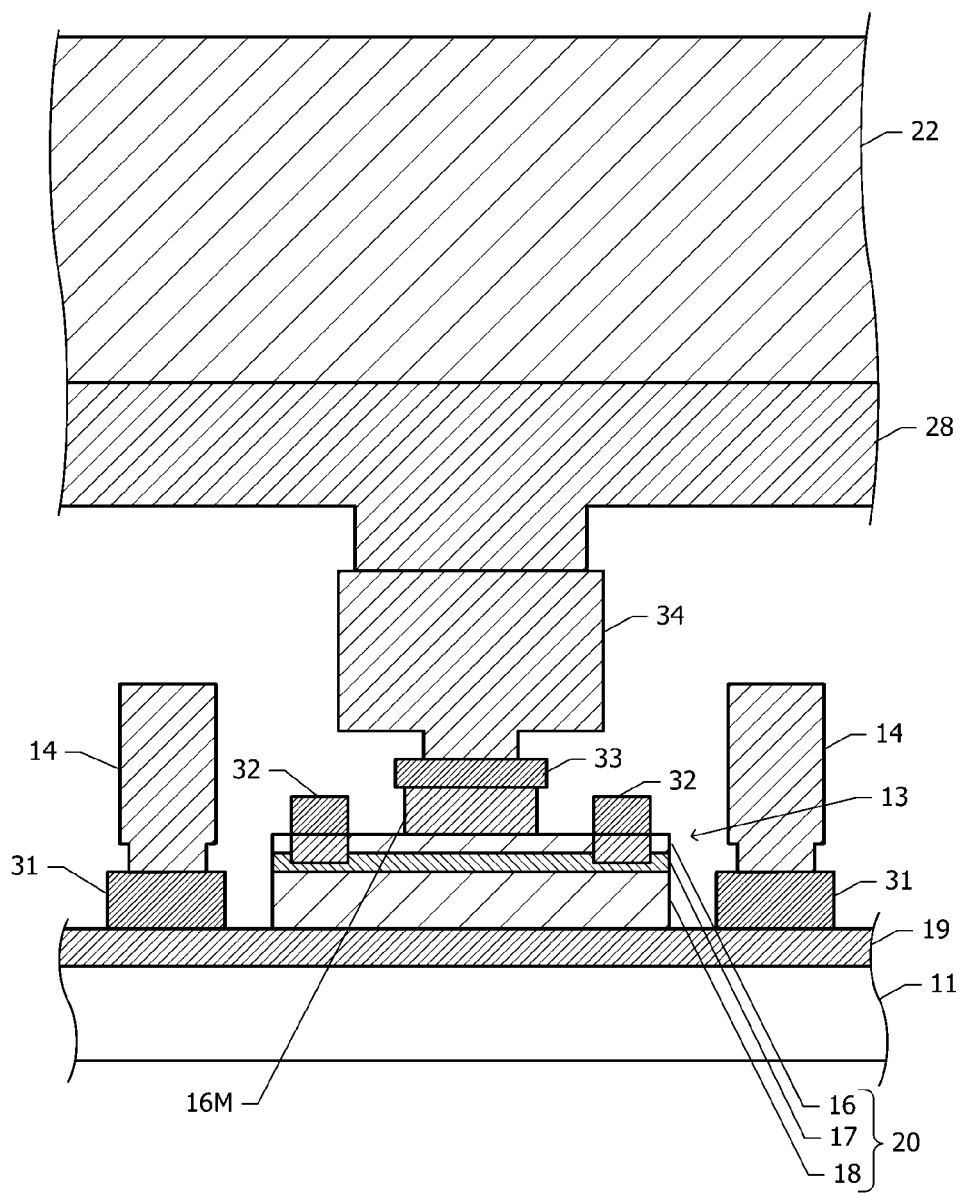
FIG. 4 is a cross-sectional view taken along a dashed-dotted line 4-4 in FIG. 3.

FIG. 3 is a diagram illustrating a positional relationship between a plurality of components of the power stage transistor 13 in a plan view, and FIG. 4 is a cross-sectional view taken along a dashed-dotted line 4-4 in FIG. 3. In FIG. 4, an illustration of an insulating film between metal wiring layers is omitted.

An n-type sub-collector layer 19 is arranged on the substrate 11 made of a semiconductor. An n-type collector layer 18, a p-type base layer 17, and an n-type emitter layer 16 are laminated in this order on a partial region of the sub-collector layer 19. The collector layer 18, the base layer 17, and the emitter layer 16 configure the collector mesa 20. An n-type emitter mesa 16M is arranged on a partial region of the emitter layer 16. The collector layer 18, the base layer 17, and the emitter layer 16 are formed of, for example, n-type GaAs, p-type GaAs, and n-type InGaP, respectively, and configure a heterojunction bipolar transistor (HBT).

Collector electrodes 31 are arranged on the sub-collector layer 19 so as to sandwich the collector mesa 20 in a plan view. The collector electrodes 31 are connected to the collector layer 18 via the sub-collector layer 19.

A base electrode 32 is arranged on the emitter layer 16 so as to surround the emitter mesa 16M from three sides in a plan view. The base electrode 32 is connected to the base layer 17 via an alloy layer that passes through the emitter layer 16 in a thickness direction. An emitter electrode 33 is arranged on the emitter mesa 16M. The emitter electrode 33 is connected to the emitter layer 16 via the emitter mesa 16M. In FIG. 1, the collector electrode 31, the base electrode 32, the emitter electrode 33, and the like are not illustrated.

On the collector electrode 31, the collector wiring 14 is arranged. An emitter wiring 34 is arranged on the emitter electrode 33. The emitter pad 28 is arranged on the emitter wiring 34. The emitter pad 28 is arranged corresponding to each of the two transistor rows 12, and connects the emitter electrodes 33 of the plurality of power stage transistors 13 of the corresponding transistor row 12 to each other. The second bump 22 is arranged on the emitter pad 28.

Although not shown in the cross-section illustrated in FIG. 4, a collector pad arranged in the same conductor layer as that of the emitter pad 28 is also arranged on the collector wiring 14. The first bump 21 (FIG. 1) is connected to the collector wiring 14 via this collector pad.

The base wiring 15 is connected to the base electrode 32. The base wiring 15 intersects an inter-stage signal wiring 35, and a capacitor 36 is formed at an intersection portion. The inter-stage signal wirings 35 are arranged respectively corresponding to the two transistor rows 12. The base wiring 15 is connected to a bias wiring 38 via a base ballast resistor element 37. In FIG. 1, an illustration of the inter-stage signal wiring 35, the base ballast resistor element 37, the bias wiring 38, and the like is omitted.

Figure 5:
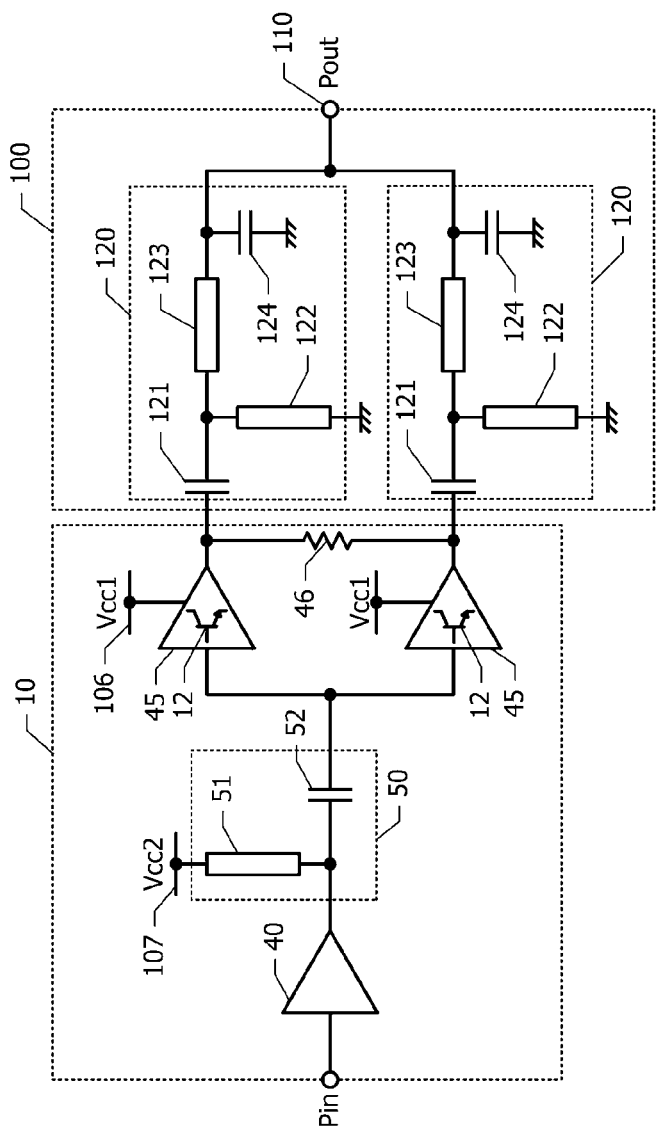
FIG. 5 is an equivalent circuit diagram of the power amplification module according to the first embodiment.

FIG. 5 is an equivalent circuit diagram of the power amplification module according to the first embodiment.

Two transistor rows 12 formed in the semiconductor chip 10 respectively configure two power stage amplifier circuits 45. Further, the semiconductor chip 10 is provided with a preceding stage amplifier circuit 40, a second impedance conversion circuit 50, and the resistor element 46. A high-frequency input signal Pin is input to the preceding stage amplifier circuit 40.

A power supply voltage Vcc2 is applied from a second power supply wiring 107 to a signal output port of the preceding stage amplifier circuit 40 via an inductor 51. The signal output port of the preceding stage amplifier circuit 40 is connected to the two power stage amplifier circuits 45 through a capacitor 52. Specifically, the signal output port of the preceding stage amplifier circuit 40 is connected to the signal input port of the transistor row 12 via the capacitor 52 and the capacitor 36, and the base wiring 15 (FIG. 3). The capacitor 52 and the inductor 51 configure the second impedance conversion circuit 50. The second impedance conversion circuit 50 has a function of matching an output impedance of the preceding stage amplifier circuit 40 with an input impedance of the power stage amplifier circuit 45. In FIG. 1, an illustration of the preceding stage amplifier circuit 40 and the second impedance conversion circuit 50 is omitted.

The power supply voltage Vcc1 is applied to each of the two power stage amplifier circuits 45 from the first power supply wiring 106. The resistor element 46 is connected between signal output ports of the two power stage amplifier circuits 45. The resistor element 46 has a function of stabilizing a high-frequency operation.

Two first impedance conversion circuits 120 are provided in the circuit board 100. Each of the two first impedance conversion circuits 120 includes the chip capacitors 121 and 124 and the inductors 122 and 123. Output ends of the two first impedance conversion circuits 120 are both connected to the signal output terminal 110. The amplified output signal Pout is output from the signal output terminal 110.

The two first impedance conversion circuits 120 respectively convert an output impedance of the power stage amplifier circuits 45 into a high impedance. Further, the two first impedance conversion circuits 120 have a function of synthesizing power of output signals of the two power stage amplifier circuits 45.

When each of the two transistor rows 12 is considered as one group so that the two transistor rows 12 and two groups are respectively in a one-to-one correspondence, reactance elements, such as the inductors 122 and 123 and the chip capacitors 121 and 124 that configure the first impedance conversion circuit 120, are arranged respectively corresponding to the two groups. In the present specification, the reactance element arranged corresponding to each of the groups will be referred to as an individual reactance element. In the first embodiment, since the two transistor rows 12 and the two groups are in a one-to-one correspondence, it is not necessary to distinguish the transistor row and the group from each other, but the "transistor row" is defined by focusing on a geometric arrangement of the power stage transistors 13, and the "group" is defined by focusing on a connection of the reactance elements. For example, it can be said that the power stage transistors 13 in which the collectors are short-circuited among the plurality of power stage transistors 13 belong to the same group.

Next, an excellent effect of the first embodiment will be described in comparison with comparative examples illustrated in FIG. 6, FIG. 7, and FIG. 8.

Figure 6:
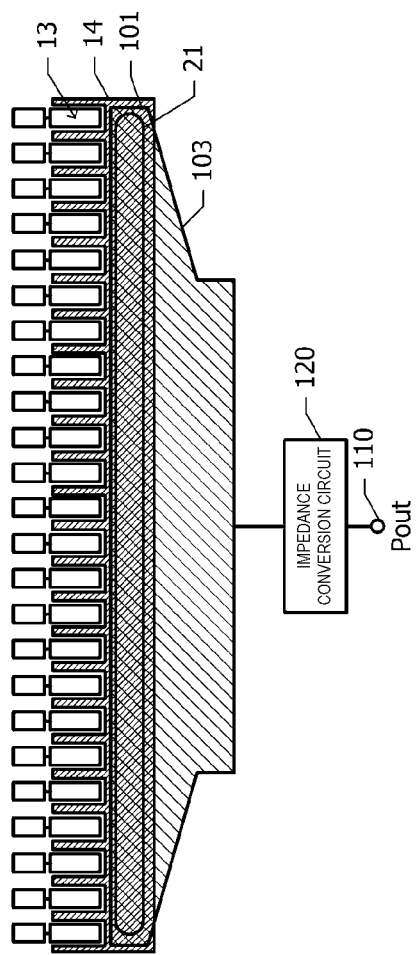
FIG. 6 is a diagram illustrating a positional relationship of a plurality of power stage transistors provided in a semiconductor chip and wirings on a circuit board of a power amplification module according to a comparative example in a plan view.
Figure 7:
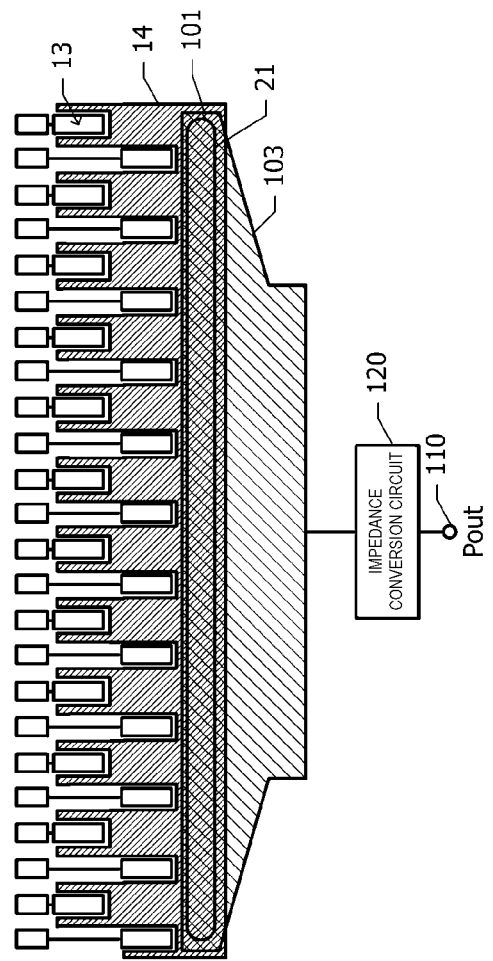
FIG. 7 is a diagram illustrating a positional relationship of a plurality of power stage transistors provided in a semiconductor chip and wirings on a circuit board of a power amplification module according to another comparative example in a plan view.
Figure 8:
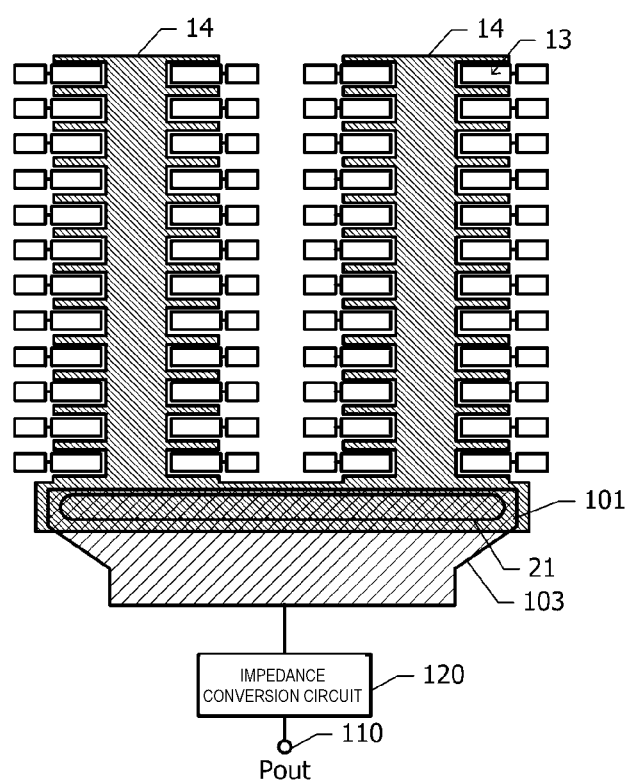
FIG. 8 is a diagram illustrating a positional relationship of a plurality of power stage transistors provided in a semiconductor chip and wirings on a circuit board of a power amplification module according to another comparative example in a plan view.

FIG. 6, FIG. 7, and FIG. 8 respectively are a diagram illustrating a positional relationship of the plurality of power stage transistors 13 provided in the semiconductor chip and the wiring on the circuit board 100 of the power amplification module according to the comparative example, in a plan view.

In the comparative example illustrated in FIG. 6, the plurality of power stage transistors 13 is arranged in a line along one virtual straight line. The first bump 21 connected to the collector is arranged on one side of the transistor row formed of the plurality of power stage transistors 13. The first land 101 on the circuit board 100 is connected to the first bump 21. The first land 101 is connected to the signal output terminal 110 via the output wiring 103 and one first impedance conversion circuit 120.

In the comparative example illustrated in FIG. 7, the plurality of power stage transistors 13 is arranged in a staggered manner.

In the power amplification module illustrated in FIG. 6 and FIG. 7, it is necessary to increase the power stage transistor 13 in order to achieve higher output. When the power stage transistor 13 is increased, the transistor row becomes longer, and as a result, the first bump 21 and the first land 101 are also required to be lengthened. Therefore, the size of the semiconductor chip 10 increases, leading to an increase in manufacturing cost. Further, the degree of freedom in arrangement in mounting on the circuit board is reduced.

On the other hand, in the first embodiment, since the plurality of power stage transistors 13 is arranged separately in the two transistor rows 12, it is possible to suppress an increase in the length of each of the two transistor rows 12. As a result, it becomes possible to suppress an increase in the size of the semiconductor chip 10. As a result, it becomes possible to suppress an increase in the manufacturing cost, and it is possible to suppress a decrease in the degree of freedom in arrangement in mounting on the circuit board 100.

In the comparative example illustrated in FIG. 8, the plurality of power stage transistors 13 is arranged in a plurality of transistor rows in the same manner as in the case of the first embodiment. The plurality of transistor rows is arranged in parallel to each other. The first bump 21 connected to the collector of each power stage transistor 13 is arranged in the vicinity of one end portion of the plurality of transistor rows. The collectors of the plurality of power stage transistors 13 are connected to the first bump 21 via the collector wiring 14. The first bump 21 is connected to the first land 101 of the circuit board. The first land 101 is connected to the signal output terminal 110 via the output wiring 103 and one first impedance conversion circuit 120.

In the comparative example illustrated in FIG. 8, the lengths of the collector wiring 14 extending from the collectors of the plurality of power stage transistors 13 reaching the first bumps 21 are greatly different for each of the power stage transistors 13. Since the collector wiring 14 is formed of the conductor film on a semiconductor chip, it is thinner than the conductor film on the circuit board, and it is difficult to achieve the low resistance and the low inductance. For this reason, for the power stage transistor 13 at a position far away from the first bump 21, a parasitic resistance and a parasitic inductance of the signal path are increased, and it becomes difficult to achieve the high output.

In contrast, in the first embodiment, the first bumps 21 (FIG. 1) that are long in a direction parallel to the length direction of the plurality of transistor rows 12 are arranged close to the transistor rows 12. Therefore, the signal path from the signal input port of each of the power stage transistors 13 to the first bump 21 is shortened, and the variation in the path length between the power stage transistors 13 is also small. It is possible to reduce the parasitic resistance and the parasitic inductance of the signal path from the first bump 21 to the signal output ports of the plurality of power stage transistors 13.

In the circuit board 100, from the first land 101 connected to the first bump 21 to the chip capacitor 121 of the first impedance conversion circuit 120 is connected by the output wiring 103. Since the output wiring 103 extends in a direction orthogonal to a longitudinal direction of the first land 101, the width thereof can be sufficiently widened.

Further, the individual reactance element such as the chip capacitor 121 is arranged for each of the two first lands 101, that is, for each of the signal output ports of the two transistor rows. Therefore, as compared with a configuration in which the common impedance conversion circuit is arranged for the two transistor rows 12, the signal path from the signal output port to the first impedance conversion circuit 120 can be shortened at the signal output port of any one of the transistor rows 12. Whereby, it is possible to reduce the parasitic resistance and the parasitic inductance of the signal path from each of the signal output ports of the two transistor rows 12 to the corresponding first impedance conversion circuit 120.

On the other hand, in the signal path on the signal output terminal 110 side from the first impedance conversion circuit 120, the output impedance is converted to the high impedance, and thus an amount of current is small. For this reason, the occurrence of a loss caused by the parasitic resistance or the like is small. Accordingly, it is possible to suppress the loss occurring in the signal path from the signal output ports of the plurality of power stage transistors 13 to the signal output terminal 110, and to achieve the high output.

Further, the variation in the parasitic resistance and the parasitic inductance of the signal path becomes small among the plurality of power stage transistors 13, and thus the excellent effect may be obtained that the variation in the operation between the plurality of power stage transistors 13 is also reduced.

Additionally, in the first embodiment, most part of the signal paths from the signal output ports of the plurality of power stage transistors 13 to the signal output terminal 110 are provided in the circuit board 100, and the signal paths provided in the semiconductor chip 10 are short. The signal path provided in the circuit board 100 is thicker than the signal path provided in the semiconductor chip 10, which is advantageous for reducing the parasitic resistance and the parasitic inductance. Further, the output signal mainly flows in the first bump 21 in a shorter side direction orthogonal to the longitudinal direction thereof. That is, a product of a height of the first bump 21 and a dimension in the longitudinal direction corresponds to a cross-sectional area of the signal path. As described above, the height and the length of the first bump 21 greatly contribute to the enlargement of the cross-sectional area of the signal path.

Further, in the first embodiment, it is possible to respectively arrange the first impedance conversion circuits 120 in accordance with the positions of the two transistor rows 12. Therefore, it is possible to arrange the two transistor rows 12 at an increased interval. When the interval between the two transistor rows 12 is increased, thermal interference therebetween is reduced, and a heat dissipation efficiency can be improved. As a result, it is possible to achieve higher output.

Next, a modification of the first embodiment will be described with reference to FIG. 9.

Figure 9:
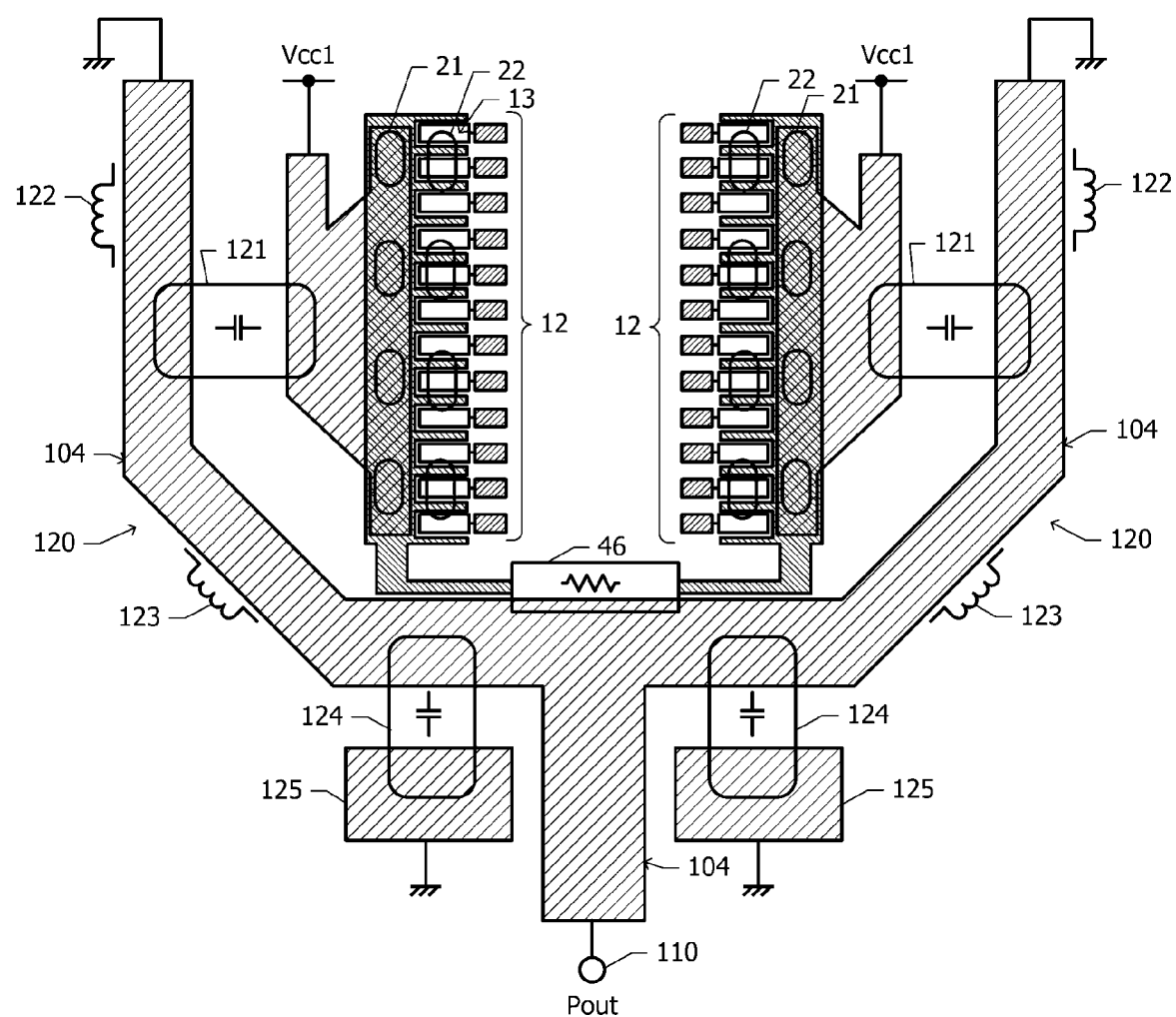
FIG. 9 is a diagram illustrating a positional relationship between a plurality of components of a power stage amplifier circuit and an output impedance conversion circuit of a power amplification module according to a modification of the first embodiment in a plan view.

FIG. 9 is a diagram illustrating a positional relationship between a plurality of components of a power stage amplifier circuit and an output impedance conversion circuit of a power amplification module according to a modification of the first embodiment in a plan view. In the first embodiment, the first bumps 21 (FIG. 1) are arranged one by one for each of the two transistor rows 12. On the other hand, in the modification, the plurality of first bumps 21 is arranged for each of the two transistor rows 12. The plurality of first bumps 21 is arranged side by side in a direction parallel to the arrangement direction of the plurality of power stage transistors 13 of the corresponding transistor row.

Further, a plurality of second bumps 22 is also arranged corresponding to each of the two transistor rows 12, and is arranged in a direction parallel to the arrangement direction of the plurality of power stage transistors 13 of the corresponding transistor row.

In the modification, an area for one first bump 21 and an area for one second bump 22 become small in a plan view. Accordingly, uniformity in the height of the first bump 21 and the second bump 22 can be improved. As a result, it is possible to obtain an excellent effect that the process of mounting the semiconductor chip 10 on the circuit board 100 is facilitated.

In the first embodiment, an HBT is used as the power stage transistor 13 (FIG. 3 and FIG. 4), but an electric field effect transistor may be used instead of the HBT. In a case where the electric field effect transistor is used as the power stage transistor 13, in the first embodiment, the collector, the base, and the emitter may be translated into a drain, a gate, and a source, respectively.

In the first embodiment, all the reactance elements of the first impedance conversion circuit 120 are arranged corresponding to the plurality of first lands 101, respectively. As another configuration, a configuration may be adopted in which a part of the reactance elements of the first impedance conversion circuit 120 is arranged corresponding to each of the plurality of first lands 101 and another part of the reactance elements is shared by two first lands 101. In the first embodiment, the transistor row 12 in which the plurality of power stage transistors 13 is arranged in a row along one virtual straight line is used, but instead of this configuration, a transistor row in which the plurality of power stage transistors 13 is arranged in a staggered manner as illustrated in FIG. 7 may be used. When the plurality of power stage transistors 13 is arranged in a staggered manner, the number of power stage transistors 13 per unit length of the transistor row 12 can be increased.

Second Embodiment

Next, a power amplification module according to a second embodiment will be described with reference to FIG. 10 and FIG. 11. Hereinafter, a description of a configuration common to that of the power amplification module according to the first embodiment (the drawings of FIG. 1 to FIG. 5) will be omitted.

Figure 10:
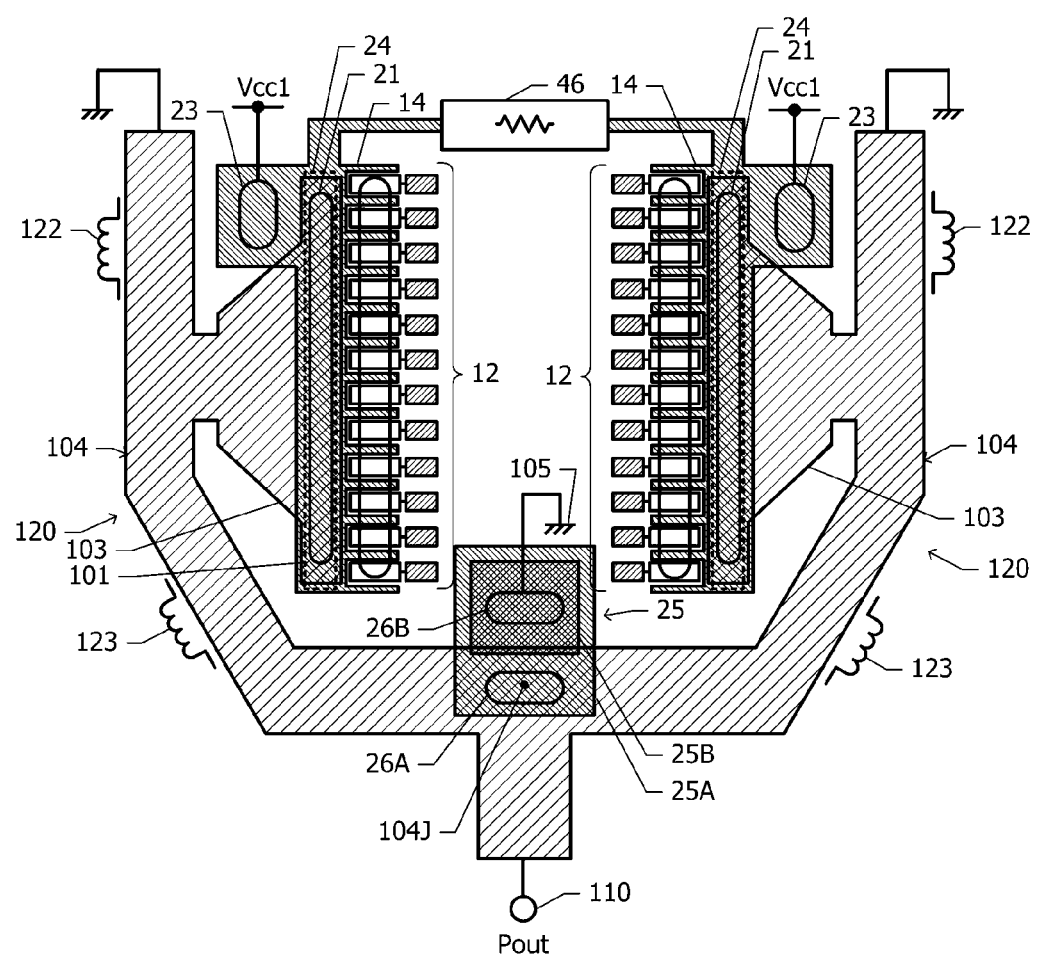
FIG. 10 is a diagram illustrating a positional relationship between a plurality of components of a power stage amplifier circuit and an output impedance conversion circuit of a power amplification module according to a second embodiment in a plan view.

FIG. 10 is a diagram illustrating a positional relationship between a plurality of components of a power stage amplifier circuit and an output impedance conversion circuit of the power amplification module according to the second embodiment in a plan view. In FIG. 10 as well, similarly to FIG. 1, a conductor film provided in the semiconductor chip 10 is marked with a relatively thick hatching, and a conductor film provided in the circuit board 100 (FIG. 2) is marked with a relatively thin hatching.

In the first embodiment, the first bump 21 and the collector wiring 14 (FIG. 1) are connected to each other in a DC manner. On the other hand, in the second embodiment, the first bump 21 and the collector wiring 14 are connected with a capacitor 24 interposed therebetween. In FIG. 10, a region in which the capacitor 24 is arranged is indicated by a broken line. The capacitor 24 has a metal-insulator-metal (MIM) structure, and is realized by, for example, arranging a dielectric film between the collector pad immediately below the first bump 21 and the collector wiring 14. The collector pad and the collector wiring 14 respectively function as a pair of electrodes of the capacitor 24.

The collector wiring 14 extends to a region overlapping neither the first land 101 nor the output wiring 103 of the circuit board 100 in a plan view, and a power supply bump 23 is arranged in this spread region. The power supply voltage Vcc1 is applied to the collector of the power stage transistor 13 from the circuit board 100 via the power supply bump 23 and the collector wiring 14.

The capacitor 24 provided in the semiconductor chip 10 corresponds to a chip capacitor 121 (FIG. 1) of the power amplification module according to the first embodiment. Therefore, in the second embodiment, the chip capacitor 121 (FIG. 1) is not mounted on the circuit board 100, and the output wiring 103 is directly connected to the output wiring 104.

Further, in the second embodiment, instead of the chip capacitor 124 of the power amplification module according to the first embodiment, a capacitor 25 having an MIM structure provided in the semiconductor chip 10 is used. The capacitor 25 is configured of a lower electrode 25A and an upper electrode 25B that are provided in different conductor layers of the semiconductor chip 10, and a dielectric film arranged between both electrodes. In a plan view, the lower electrode 25A extends to an outer side portion of the upper electrode 25B, and a part of the lower electrode 25A overlaps the junction point 104J of the output wiring 104.

A bump 26A is arranged at a position where the lower electrode 25A and the junction point 104J overlap each other. The bump 26A connects the lower electrode 25A of the semiconductor chip 10 and the output wiring 104 of the circuit board 100. In a plan view, a bump 26B is arranged at a position overlapping the upper electrode 25B. The upper electrode 25B is connected to the ground pattern 105 of the circuit board 100 with the bump 26B interposed therebetween.

Figure 11:
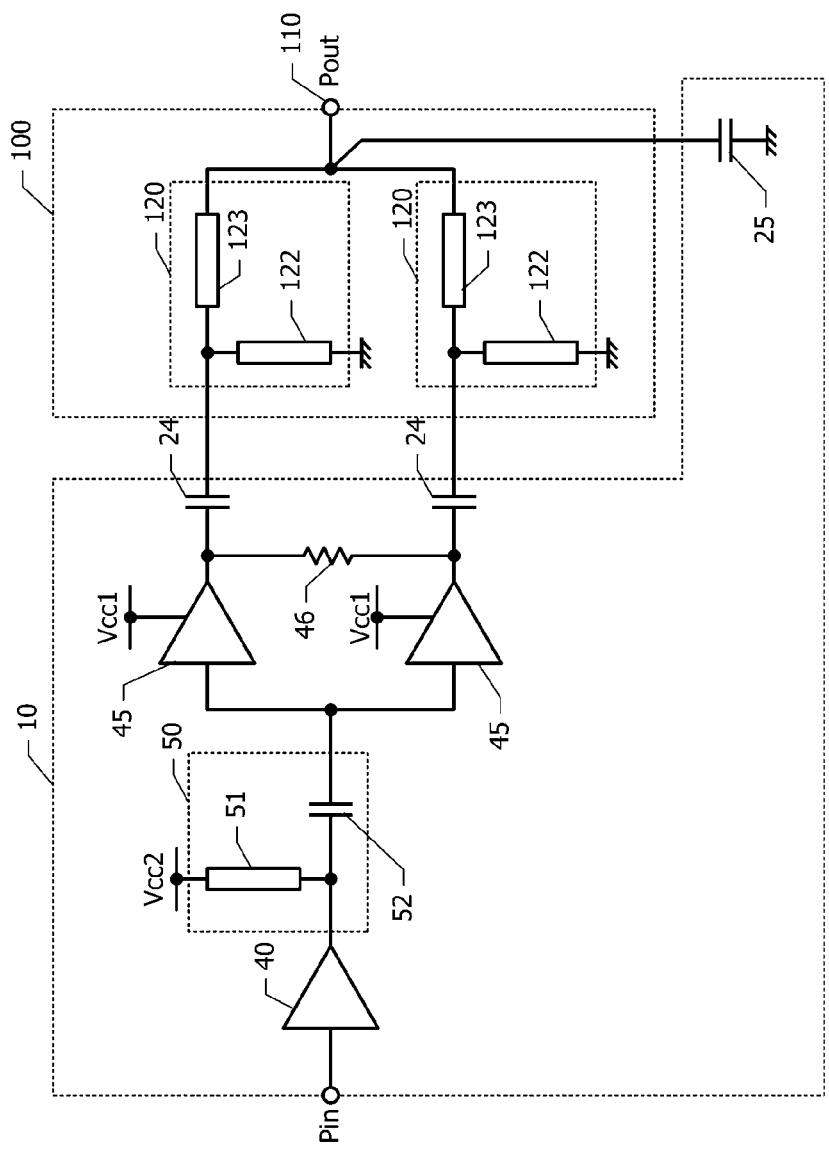
FIG. 11 is an equivalent circuit diagram of the power amplification module according to the second embodiment.

FIG. 11 is an equivalent circuit diagram of the power amplification module according to the second embodiment. In the first embodiment, the first impedance conversion circuit 120 (FIG. 5) provided in the circuit board 100 is configured by the chip capacitors 121 and 124 and the inductors 122 and 123. On the other hand, in the second embodiment, the first impedance conversion circuit 120 provided in the circuit board 100 includes only the inductors 122 and 123. Instead of the chip capacitor 121, the capacitor 24 having the MIM structure that is provided in the semiconductor chip 10 is used. Further, instead of the chip capacitor 124, the capacitor 25 having the MIM structure provided in the semiconductor chip 10 is used. The capacitor 25 is shared by the two first impedance conversion circuits 120.

In the second embodiment, the first impedance conversion circuit 120 provided in the circuit board 100, and the capacitors 24 and 25 provided in the semiconductor chip 10 have a function of converting the output impedance of the power stage amplifier circuit 45 and a function of synthesizing the power of the output signal.

Next, an excellent effect of the second embodiment will be described.

In the second embodiment as well, similarly to the first embodiment, it is possible to suppress the loss occurring in the signal paths from the respective signal output ports of the two transistor rows 12 to the signal output terminal 110, and to achieve the high output. Further, in the second embodiment, since the capacitors 24 and 25 having the MIM structure are used instead of the chip capacitors 121 and 124, it is possible to further reduce the size as compared with the first embodiment.

Third Embodiment

Next, a power amplification module according to a third embodiment will be described with reference to FIG. 12. Hereinafter, a description of a configuration common to that of the power amplification module according to the first embodiment illustrated in FIG. 1 to FIG. 5 will be omitted.

Figure 12:
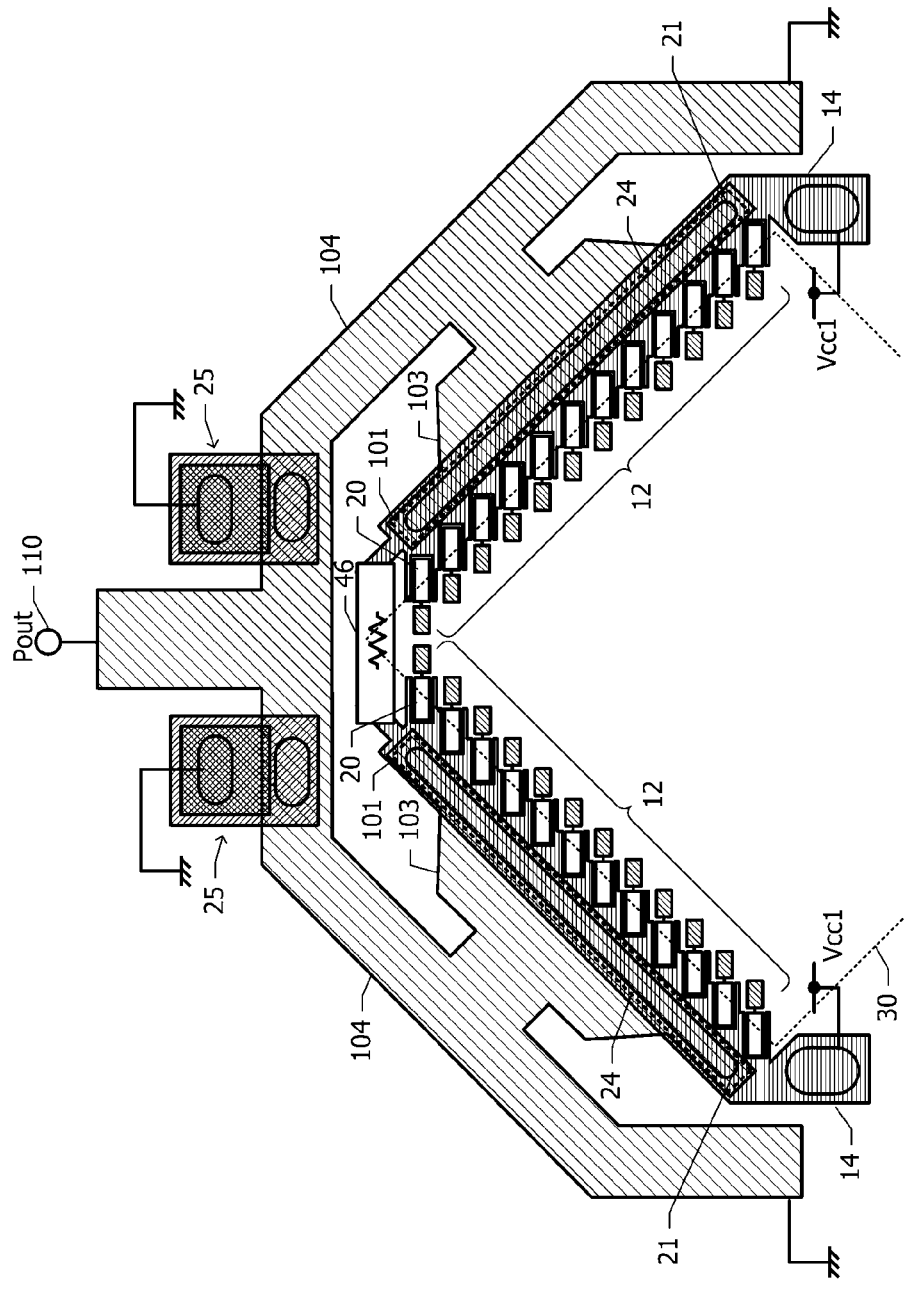
FIG. 12 is a diagram illustrating a positional relationship between a plurality of components of a power stage amplifier circuit and an output impedance conversion circuit of a power amplification module according to a third embodiment in a plan view.

FIG. 12 is a diagram illustrating a positional relationship between a plurality of components of a power stage amplifier circuit and an output impedance conversion circuit of the power amplification module according to the third embodiment in a plan view. In the first embodiment, two transistor rows 12 are arranged along two sides facing each other of the convex polygon 30 having a substantially rectangular shape. In contrast, in the third embodiment, the two transistor rows 12 are arranged along two sides adjacent to each other of the convex polygon 30 having a substantially square shape.

Each collector mesa 20 of the power stage transistor 13 has a shape substantially elongated in a direction that forms 45° with respect to the side of the convex polygon 30 in a plan view. The first bump 21 and the first land 101 also have a shape that is substantially long in a direction parallel to the arrangement direction of the plurality of power stage transistors 13 in a plan view. Similarly to the case of the second embodiment (FIG. 10), the first bump 21 is connected to the collector wiring 14 via the capacitor 24 having the MIM structure. In FIG. 12, a region in which the capacitor 24 is arranged is indicated by a broken line.

The output wiring 103 provided in the circuit board 100 (FIG. 2) is directly connected to the output wiring 104 in the same manner as in the second embodiment (FIG. 10). Instead of the two chip capacitors 124 (FIG. 1) of the power amplification module according to the first embodiment, two capacitors 25 having the MIM structure are provided in the semiconductor chip. The structure of each of the capacitors 25 is the same as the structure of the capacitor 25 (FIG. 10) of the power amplification module according to the second embodiment.

Next, a modification of the third embodiment will be described. In the third embodiment, it is described that two transistor rows 12 are arranged along two sides adjacent to each other of the virtual square, but it is also possible to say that two transistor rows 12 are arranged along two sides sandwiching a right angle of an isosceles right triangle. That is, the virtual convex polygon 30 is not limited to an even-numbered polygon, and may be an odd-numbered polygon. In addition, when the virtual convex polygon 30 is a triangle, the convex polygon 30 is not limited to an isosceles right triangle, and may be other triangles such as an isosceles triangle, an equilateral triangle, or the like, in which an angle formed by two equilateral sides is an angle other than a right angle, for example.

Next, an excellent effect of the third embodiment will be described. In the third embodiment as well, similarly to the first embodiment, it is possible to suppress the loss occurring in the signal paths from the respective signal output ports of the two transistor rows 12 to the signal output terminal 110, and to achieve the high output. Further, as in the second embodiment, it is possible to reduce the size of the power amplification module.

Fourth Embodiment

Next, a power amplification module according to a fourth embodiment will be described with reference to FIG. 13 and FIG. 14. Hereinafter, a description of a configuration common to that of the power amplification module according to the first embodiment illustrated in FIG. 1 to FIG. 5 will be omitted.

Figure 13:
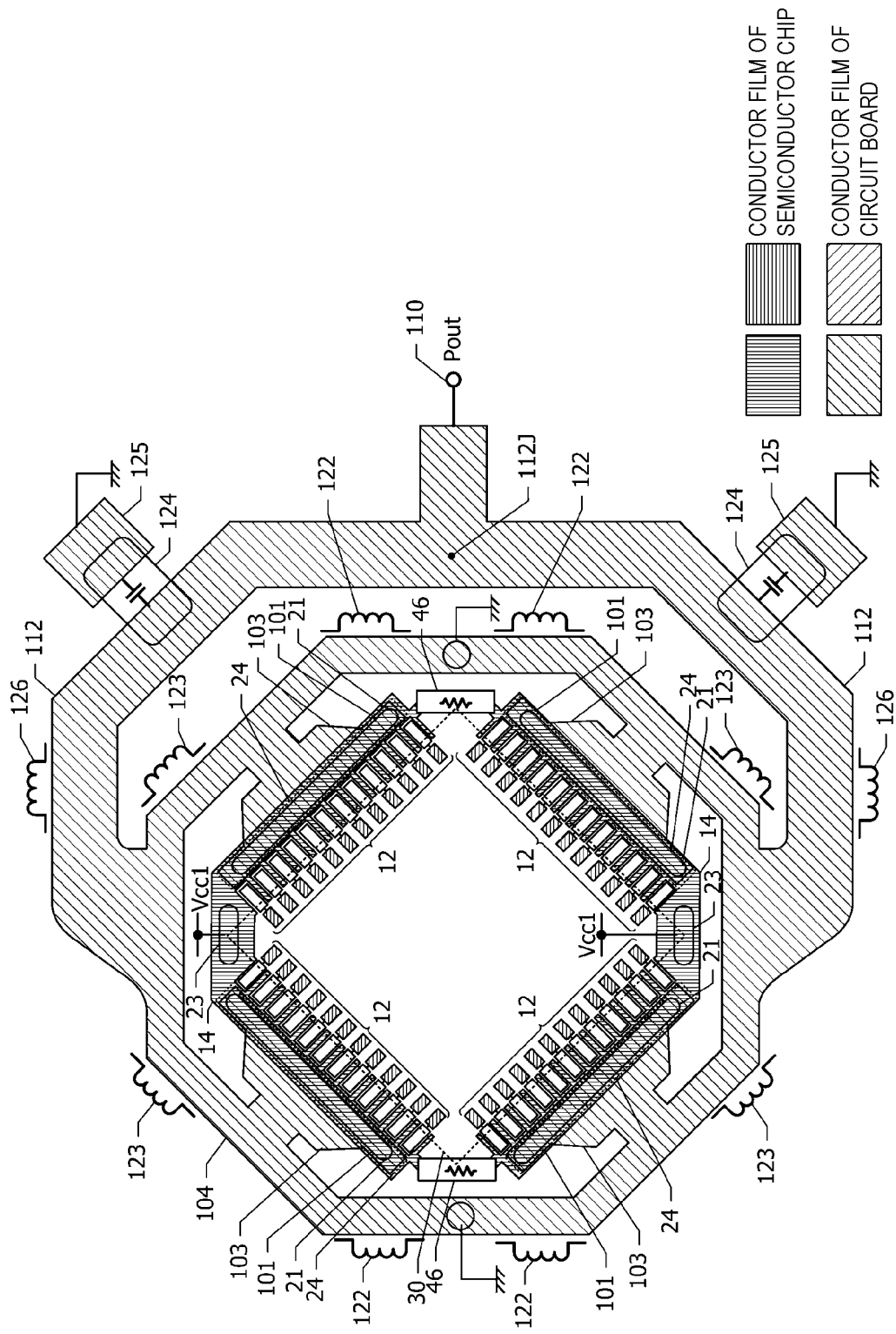
FIG. 13 is a diagram illustrating a positional relationship between a plurality of components of a power stage amplifier circuit and an output impedance conversion circuit of a power amplification module according to a fourth embodiment in a plan view.

FIG. 13 is a diagram illustrating a positional relationship between a plurality of components of a power stage amplifier circuit and an output impedance conversion circuit of a power amplification module according to the fourth embodiment in a plan view. In FIG. 13 as well, similarly to FIG. 1, a conductor film provided in the semiconductor chip 10 is marked with a relatively thick hatching, and a conductor film provided in the circuit board 100 (FIG. 2) is marked with a relatively thin hatching.

First, the configuration of the semiconductor chip 10 will be described. In the first embodiment, two transistor rows 12 are arranged along two sides facing each other of the convex polygon 30 having a substantially rectangular shape. On the contrary, in the fourth embodiment, four transistor rows 12 are arranged along four sides of the convex polygon 30 having a substantially square shape, respectively. A configuration of each of the four transistor rows 12 is the same as the configuration of the transistor row 12 (FIG. 1) of the power amplification module according to the first embodiment.

The collector wirings 14 arranged so as to correspond to two transistor rows 12 along sides adjacent to each other of the convex polygon 30 are connected to each other at positions of vertices (upper and lower vertices in FIG. 13) of the convex polygon 30. The power supply bump 23 is arranged at a portion where the collector wirings 14 are connected to each other. The power supply voltage Vcc1 is applied to the collectors of each of the power stage transistors 13 of the four transistor rows 12 via the power supply bump 23 and the collector wiring 14.

Corresponding to the four transistor rows 12, the first bumps 21 are arranged, respectively. Each of the first bumps 21 has a shape substantially elongated in a direction parallel to the length direction of the corresponding transistor row 12. The four first bumps 21 are respectively connected to the corresponding collector wiring 14 via the capacitors 24 having the MIM structure, as in the case of the second embodiment (FIG. 10).

The resistor elements 46 are arranged at positions of two vertexes (vertices on the right side and the left side in FIG. 13) in which the power supply bump 23 is not arranged among the four vertices of the convex polygon 30. The resistor element 46 connects two collector wirings 14 on both sides thereof to each other.

Next, the configuration of the circuit board 100 will be described. The first lands 101 are respectively arranged at different positions overlapping the four first bumps 21 in a plan view. The four first lands 101 are connected to the corresponding first bumps 21, respectively. The output wirings 103 extend from each of the four first lands 101 toward the outer side portion of the convex polygon 30 in a plan view. The four output wirings 103 are connected to the output wirings 104 at the tips thereof. The output wiring 104 has a substantially annular shape surrounding four transistor rows 12 in a plan view.

The output wiring 104 is divided into four parts at four connection points to which the four output wirings 103 are connected. Two portions (right and left portions in FIG. 13) of the output wiring 104 facing each other are respectively grounded at the center thereof. Output wirings 112 are respectively branched from centers of other two portions (upper and lower portions in FIG. 13) of the output wiring 104, and two output wirings 112 are connected to each other at a junction point 112J. The junction point 112J is connected to the signal output terminal 110.

One terminals of the chip capacitors 124 are respectively connected between the two connection points of the output wirings 112 and the output wiring 104, and the junction point 112J. The other terminals of the two chip capacitors 124 are respectively connected to the ground lands 125.

Four portions of the output wiring 104 between each of two ground portions and the portions connected to the output wirings 103 on both sides of the ground portions respectively function as the inductor 122. Four portions of the output wiring 104 between each of two portions from which the output wirings 112 branch and the portions connected to the output wirings 103 on both sides of the branch portions respectively function as the inductor 123. A portion of the output wiring 112 between the connection point with the output wiring 104 and the connection point of the chip capacitor 124 functions as an inductor 126.

The lengths of the four signal paths respectively extending from the four first bumps 21 reaching the signal output terminal 110 through the respective output wirings 103, 104, and 112 are all the same. Therefore, no phase shift of the high-frequency signals respectively output from the four transistor rows 12 occurs at the position of the signal output terminal 110.

Figure 14:
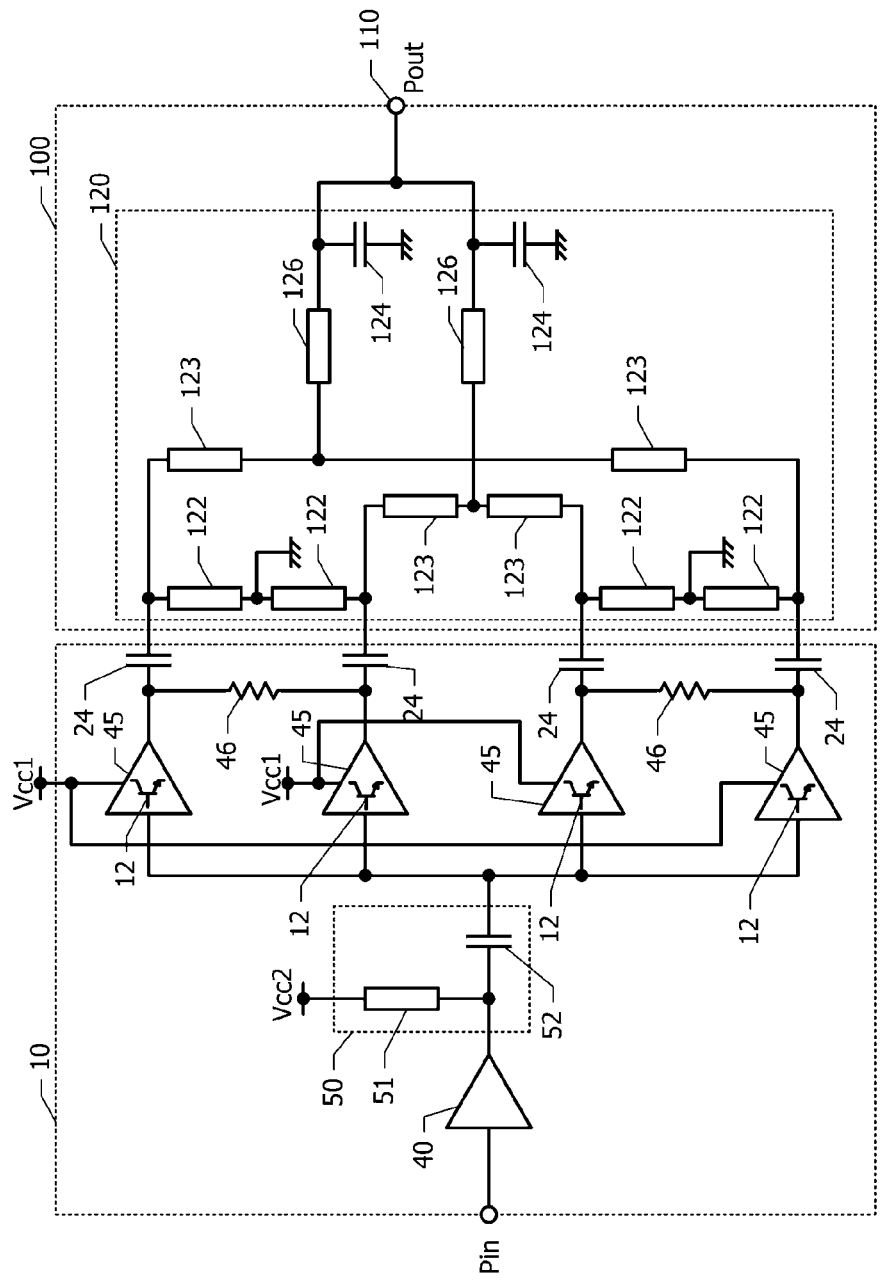
FIG. 14 is an equivalent circuit diagram of the power amplification module according to the fourth embodiment.

FIG. 14 is an equivalent circuit diagram of the power amplification module according to the fourth embodiment. The power amplification module (FIG. 5) according to the first embodiment includes two power stage amplifier circuits 45. In contrast, in the fourth embodiment, the power amplification module includes four power stage amplifier circuits 45 corresponding to four transistor rows 12. Output ends of two power stage amplifier circuits 45 of the four power stage amplifier circuits 45 are connected to each other by the resistor element 46. Further, the output ends of the other two power stage amplifier circuits 45 are connected to each other by the resistor element 46.

The output ends of the four power stage amplifier circuits 45 are respectively connected to the signal output terminal 110 through the capacitors 24, the inductors 123, and the inductors 126. A point connecting the capacitor 24 and the inductor 123 is grounded via the inductor 122. An end portion of the inductor 126 on the signal output terminal 110 side is grounded via the chip capacitor 124.

The four inductors 122, the four inductors 123, the two inductors 126, and the two chip capacitors 124 configure the first impedance conversion circuit 120. The first impedance conversion circuit 120 and the four capacitors 24 having the MIM structure have a function of converting the output impedances of the four power stage amplifier circuits 45.

The capacitors 24 and the inductors 122 and 123 are arranged corresponding to the four transistor rows 12, respectively. The inductor 126 and the chip capacitor 124 are shared by two transistor rows 12.

Next, an excellent effect of the fourth embodiment will be described.

In the fourth embodiment, the inductor 122 and the inductor 123 of the first impedance conversion circuit 120 are respectively provided corresponding to the four transistor rows 12. Four first lands 101 are arranged corresponding to the respective signal output ports of the four transistor rows 12, and four capacitors 24, and four inductors 122 and 123 are arranged corresponding to the four first lands 101, respectively. Therefore, the signal paths from the signal output ports of the four transistor rows 12 to the respectively corresponding first impedance conversion circuits 120 can be shortened. As a result, similarly to the case of the first embodiment, it is possible to suppress the loss occurring in the signal path from each of the signal output ports of the four transistor rows 12 to the signal output terminal 110, and to achieve the high output.

Further, in the fourth embodiment, since the power stage amplifier circuits 45 are configured by four transistor rows 12, it is possible to increase the number of power stage transistors 13 while keeping the length of the transistor row 12 equal, as compared with the first embodiment in which the power stage amplifier circuits 45 are configured by two transistor rows 12 (FIG. 1). Therefore, it is possible to further increase the output of the power amplification module.

Fifth Embodiment

Next, a power amplification module according to a fifth embodiment will be described with reference to FIG. 15.

Hereinafter, a description of a configuration common to that of the power amplification module according to the fourth embodiment (FIG. 13 and FIG. 14) will be omitted.

Figure 15:
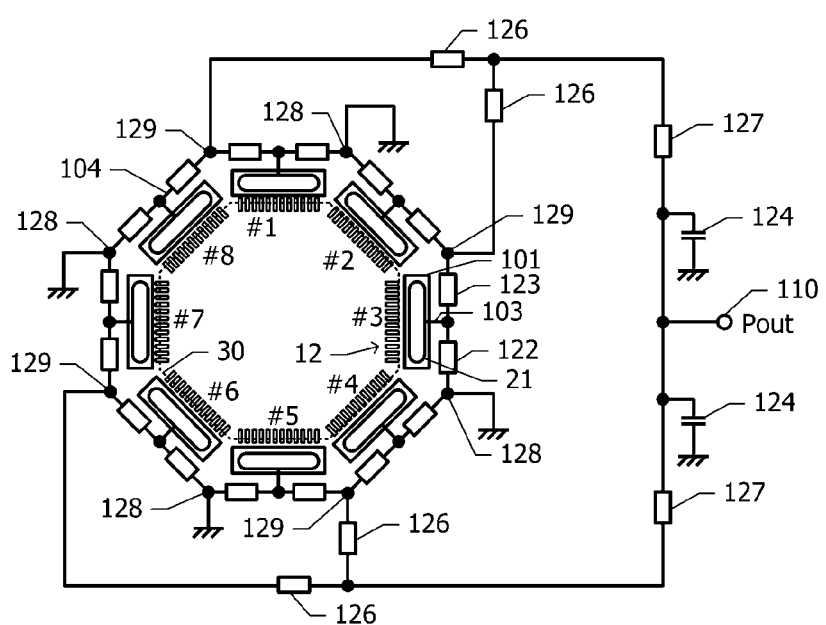
FIG. 15 is a diagram schematically illustrating components of a part of a power amplification module according to a fifth embodiment.

FIG. 15 is a diagram schematically illustrating components of a part of the power amplification module according to the fifth embodiment. In the fourth embodiment, the four transistor rows 12 (FIG. 13) are respectively arranged along four sides of the convex polygon 30 having a substantially square shape. In contrast, in the fifth embodiment, eight transistor rows 12 are respectively arranged along eight sides of the convex polygon 30 having a substantially regular octagonal shape. The first bumps 21 are arranged corresponding to the plurality of transistor rows 12, respectively.

The circuit board 100 (FIG. 2) includes the first land 101 arranged so as to overlap each of the eight first bumps 21 in a plan view. The output wiring 103 extends from each of the eight first lands 101 toward the outer side portion of the convex polygon 30. The annular output wiring 104 surrounds the convex polygon 30, and is connected to the tips of the eight output wirings 103.

In order to distinguish the eight transistor rows 12 from each other, serial numbers from 1 to 8 are sequentially given in a first rotation direction (clockwise direction in FIG. 15) in a circumferential direction of the convex polygon 30. In FIG. 15, the serial numbers assigned to the respective transistor rows 12 are represented by numerals with a sharp symbol. In the output wiring 104, an intermediate point 128 of a portion from a connection point with the output wiring 103 corresponding to an odd-numbered transistor row 12 reaching a connection point with the output wiring 103 corresponding to the transistor row 12 adjacent thereto in the first rotation direction in the circumferential direction is grounded.

In the output wiring 104, an intermediate point (hereinafter referred to as an output-side intermediate point 129) of a portion from a connection point with the output wiring 103 corresponding to an even-numbered transistor row 12 reaching a connection point with the output wiring 103 corresponding to the transistor row 12 adjacent thereto in the first rotation direction in the circumferential direction is connected to the signal output terminal 110. One signal output terminal 110 and four output-side intermediate points 129 are connected in a tournament manner, and the path lengths of the signal paths from each of the four output-side intermediate points 129 to the signal output terminal 110 are all equal to each other.

A part of the output wiring 104 functions as the inductors 122 and 123, similarly to the case of the fourth embodiment. A signal path from the output-side intermediate point 129 reaching the signal output terminal 110 functions as the inductors 126 and 127. The signal path from the output-side intermediate point 129 to a first junction point of the signal path from the output-side intermediate point 129 reaching the signal output terminal 110 functions as the inductor 126. One terminal of the chip capacitor 124 is connected to the signal path from the first junction point to the next junction point when viewed from the output-side intermediate point 129. The other terminal of the chip capacitor 124 is grounded. The signal path from the first junction point to a point to which the chip capacitor 124 is connected functions as the inductor 127 when viewed from the output-side intermediate point 129.

Next, an excellent effect of the fifth embodiment will be described.

In the fifth embodiment as well, similarly to the case of the fourth embodiment, it is possible to suppress the loss occurring in the signal path from the transistor row 12 to the signal output terminal 110, and to achieve the high output. Further, in the fifth embodiment, in a case where the total number of the power stage transistors 13 is constant, the length of each of the transistor rows 12 is shortened caused by increasing the number of the transistor rows 12. As a result, the variation in an operating condition of the power stage transistor 13 due to the position of the transistor row 12 can be further reduced.

Next, a modification of the fifth embodiment will be described. In the fifth embodiment, a regular octagon is adopted as the virtual convex polygon 30, but other general convex polygons may be adopted as the convex polygon 30. Note that, in order to branch the signal paths from the one signal output terminal 110 to the plurality of transistor rows 12 to be a tournament type and make the lengths of the signal paths equal to each other, it is preferable that the number of the transistor rows 12 be a power of 2. Even in a case where the number of the transistor rows 12 is a power of 2, it is not necessary to adopt a convex polygon in which the number of sides is a power of 2 as the virtual convex polygon 30. The number of sides corresponding to the number of the transistor rows 12 may be selected from the plurality of sides of the virtual convex polygon 30, and the plurality of transistor rows 12 may be arranged so as to follow each of the selected sides.

When considering a virtual straight line along which the plurality of transistor rows 12 respectively extends, in a case where the plurality of virtual straight lines configures at least a part of the plurality of sides of the convex polygon, it can be said that the plurality of transistor rows 12 is arranged along the sides of the virtual convex polygon.

Sixth Embodiment

Next, a power amplification module according to a sixth embodiment will be described with reference to FIG. 16 and FIG. 17. Hereinafter, a description of a configuration common to that of the power amplification module according to the first embodiment illustrated in FIG. 1 to FIG. 5 will be omitted. In the first embodiment, the configurations of the power stage amplifier circuit 45 (FIG. 5) and from the power stage amplifier circuit 45 to the signal output terminal 110 (FIG. 5) has been described in detail. In the sixth embodiment, a configuration from the preceding stage amplifier circuit 40 (FIG. 5) to the power stage amplifier circuit 45 (FIG. 5) will be described in detail.

Figure 16:
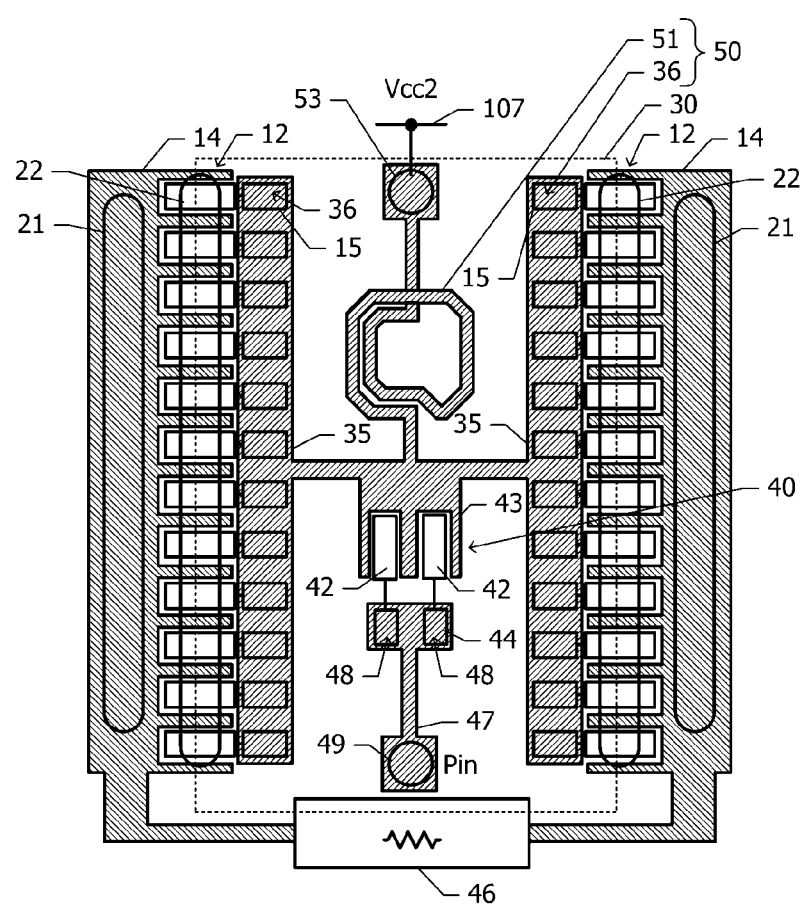
FIG. 16 is a diagram illustrating a positional relationship between a plurality of components of a preceding stage amplifier circuit and a power stage amplifier circuit provided in a semiconductor chip of a power amplification module according to a sixth embodiment in a plan view.

FIG. 16 is a diagram illustrating a positional relationship between a plurality of components of the preceding stage amplifier circuit 40 and the power stage amplifier circuit 45 (FIG. 5) provided in the semiconductor chip 10 (FIG. 2) of the power amplification module according to the sixth embodiment in a plan view. Configurations of the two transistor rows 12, the collector wiring 14, the first bump 21, the second bump 22, and the resistor element 46 are the same as those of the power amplification module (FIG. 1) according to the first embodiment. Configurations of the base wiring 15 and the inter-stage signal wiring 35 are also the same as the configurations of the base wiring 15 (FIG. 3) and the inter-stage signal wiring 35 (FIG. 3) of the power amplification module according to the first embodiment. The inter-stage signal wirings 35 are arranged respectively corresponding to the two transistor rows 12. The capacitor 36 is formed in a region where the base wiring 15 and the inter-stage signal wiring 35 overlap each other in a plan view.

The preceding stage amplifier circuit 40 is arranged inside the convex polygon 30 in a plan view. The preceding stage amplifier circuit 40 includes a plurality of preceding stage transistors 42. The plurality of preceding stage transistors 42 is connected in parallel to each other. Each of the plurality of preceding stage transistors 42 has a structure similar to that of the power stage transistor 13 (FIG. 3 and FIG. 4) of the power stage amplifier circuit 45 (FIG. 5). Note that, in some cases, the preceding stage transistor 42 and the power stage transistor 13 have components each having different dimensions in a plan view. A collector wiring 43 connected to a collector of the preceding stage transistor 42 is connected to two inter-stage signal wirings 35. In FIG. 16, an illustration of the base ballast resistor element 37 (FIG. 3) and the bias wiring 38 (FIG. 3) is omitted.

A base wiring 44 is connected to a base of each of the plurality of preceding stage transistors 42. One end of one signal input wiring 47 overlaps the plurality of base wirings 44 in a plan view. Capacitors 48 respectively are formed in regions where the plurality of base wirings 44 and the signal input wiring 47 overlap each other. The signal input wiring 47 is connected to the signal input bump 49 at another end portion thereof. The input signal Pin is input to a base of the preceding stage transistor 42 from the circuit board 100 (FIG. 2) through the signal input bump 49, the signal input wiring 47, the capacitor 48, and the base wiring 44. In FIG. 16, an illustration of the bias circuit of the preceding stage transistor 42 is omitted.

A collector wiring 43 connected to the collector of the preceding stage transistor 42 is connected to a power supply bump 53 with a substantially spiral inductor 51 interposed therebetween. The insulation is ensured by a multilayer wiring structure at a portion in which wirings configuring the inductor 51 intersect each other. The power supply bump 53 is connected to the second power supply wiring 107 of the circuit board 100 (FIG. 2). The power supply voltage Vcc2 is applied to the collector of the preceding stage transistor 42 through the inductor 51 and the collector wiring 43 from the second power supply wiring 107.

The inductor 51 and a plurality of capacitors 36 configure the second impedance conversion circuit 50. Note that, the plurality of capacitors 36 also functions as a DC cut capacitor that prohibits inflow of a direct current from the power supply voltage Vcc2 to the base of the power stage transistor 13. A plurality of capacitors 36 is arranged respectively corresponding to the two transistor rows 12. One inductor 51 is shared by two transistor rows 12.

Figure 17:
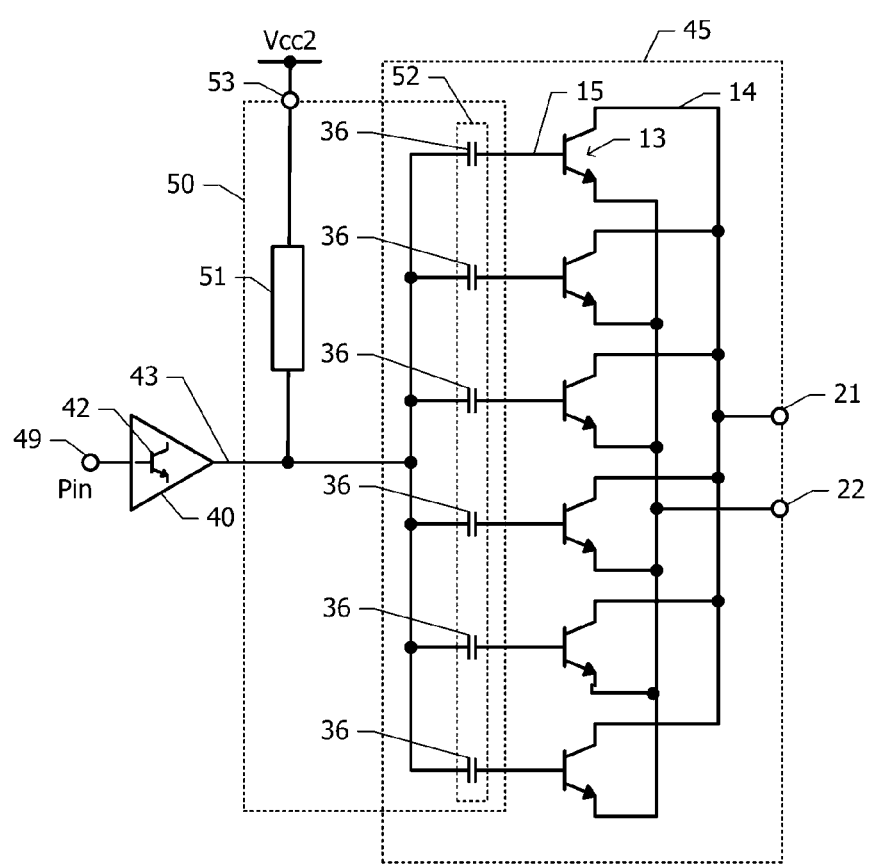
FIG. 17 is an equivalent circuit diagram of a preceding stage amplifier circuit, a second impedance conversion circuit, and a power stage amplifier circuit.

FIG. 17 is an equivalent circuit diagram of the preceding stage amplifier circuit 40, the second impedance conversion circuit 50, and the power stage amplifier circuit 45. In FIG. 17, only one of the two power stage amplifier circuits 45 (FIG. 5) is illustrated.

The collector of the preceding stage transistor 42 configuring the preceding stage amplifier circuit 40 functions as a signal output port of the preceding stage amplifier circuit 40. The collector wiring 43 is connected to a signal output port of the preceding stage transistor 42. The high-frequency signal amplified by the preceding stage amplifier circuit 40 is output from the signal output port. The bases of the plurality of power stage transistors 13 configuring the power stage amplifier circuit 45 function as a signal input port. The capacitor 36 is connected to the signal input port of the power stage transistor 13 via the base wiring 15. The second impedance conversion circuit 50 is inserted between the signal output port of the preceding stage amplifier circuit 40 and the signal input ports of the plurality of power stage transistors 13.

The plurality of capacitors 36 provided corresponding to the plurality of power stage transistors 13 corresponds to the capacitor 52 (FIG. 5) of the second impedance conversion circuit 50 according to the first embodiment. The collectors of the plurality of power stage transistors 13 are connected to the first bump 21 via the collector wiring 14. Emitters of the plurality of power stage transistors 13 are connected to the second bump 22.

Next, an excellent effect of the sixth embodiment will be described.

In the sixth embodiment, the base wiring 15 extends from the signal input port of the power stage transistor 13 toward the inner side portion of the convex polygon 30. Further, the preceding stage amplifier circuit 40 is arranged inside the convex polygon 30 in a plan view. For this reason, a distance from the signal output port of the preceding stage amplifier circuit 40 to the signal input port of the power stage transistor 13 can be shortened for all the transistor rows 12. As a result, the loss in the signal path including the second impedance conversion circuit 50 from the preceding stage amplifier circuit 40 to the power stage amplifier circuit 45 is reduced, and a gain of the power amplification module can be kept high.

Further, the plurality of elements of the preceding stage amplifier circuit 40 can be arranged in a concentrated manner in a narrow region. Whereby, the plurality of preceding stage transistors 42 can be easily shared by the plurality of transistor rows 12 of the power stage amplifier circuit 45. Further, in the sixth embodiment, the inductor 51 of the second impedance conversion circuit 50 is shared by the plurality of transistor rows 12 of the power stage amplifier circuit 45. As described above, by sharing the preceding stage amplifier circuit 40 and a part of the reactance elements of the second impedance conversion circuit 50 with the plurality of transistor rows 12, an exclusive area of a part of the reactance elements in the second impedance conversion circuit 50 can be reduced in the semiconductor chip 10 (FIG. 2).

Next, a modification of the sixth embodiment will be described. In the sixth embodiment, the inductor 51, which is an inductance element of the second impedance conversion circuit 50, is shared between the two transistor rows 12. As another configuration, a capacitance element may be shared between the two transistor rows 12. In the sixth embodiment, a substantially spiral shape is used as the inductor 51, however, a substantially arc shape or a substantially helical shape may be used in accordance with the required inductance.

Seventh Embodiment

Next, a power amplification module according to a seventh embodiment will be described with reference to FIG. 18. Hereinafter, a description of a configuration common to that of the power amplification module according to the sixth embodiment (FIG. 16 and FIG. 17) will be omitted.

Figure 18:
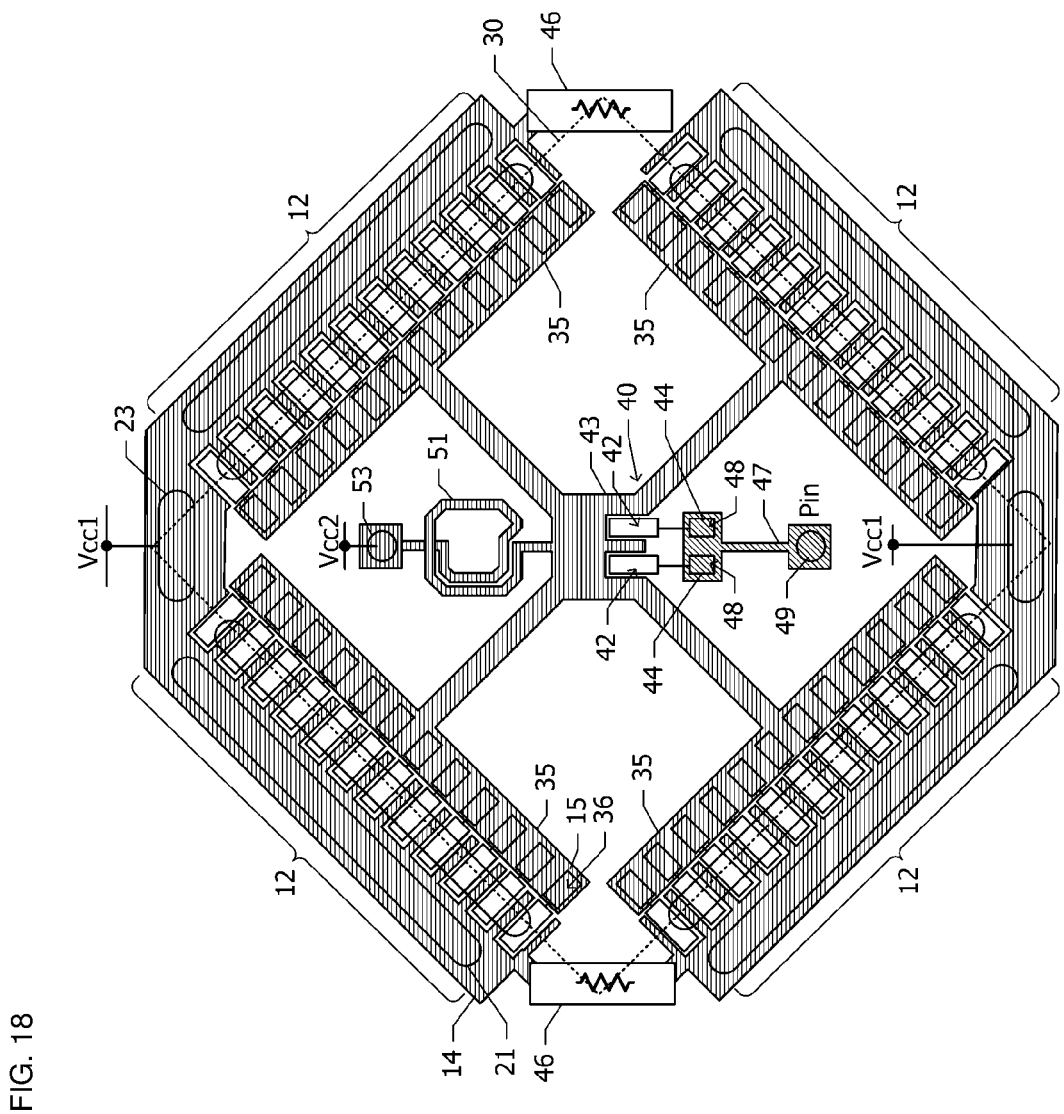
FIG. 18 is a diagram illustrating a positional relationship between a plurality of components of a preceding stage amplifier circuit and a power stage amplifier circuit provided in a semiconductor chip of a power amplification module according to a seventh embodiment in a plan view.

FIG. 18 is a diagram illustrating a positional relationship between a plurality of components of the preceding stage amplifier circuit 40 and the power stage amplifier circuit 45 (FIG. 5) provided in the semiconductor chip 10 (FIG. 2) of the power amplification module according to the seventh embodiment in a plan view. In the sixth embodiment, two transistor rows 12 are arranged. On the contrary, in the seventh embodiment, four transistor rows 12 are arranged as in the case of the fourth embodiment (FIG. 13). The inter-stage signal wiring 35 is arranged corresponding to each of the four transistor rows 12.

In the seventh embodiment as well, similarly to the case of the sixth embodiment, the preceding stage amplifier circuit 40 and the inductor 51 are arranged inside the convex polygon 30 in a plan view. The collector wiring 43 connected to collectors (signal output ports) of the plurality of preceding stage transistors 42 that configures the preceding stage amplifier circuit 40 is connected to four inter-stage signal wirings 35. The capacitors 36 formed in the region where the inter-stage signal wiring 35 and the base wiring 15 overlap each other in a plan view configure the second impedance conversion circuit 50 together with the inductor 51.

Next, an excellent effect of the seventh embodiment will be described.

In the seventh embodiment as well, similarly to the sixth embodiment, the loss in the signal path including the second impedance conversion circuit 50 from the preceding stage amplifier circuit 40 to the power stage amplifier circuit 45 is reduced, and the gain of the power amplification module can be kept high. Further, the plurality of elements of the preceding stage amplifier circuit 40 can be arranged in a concentrated manner in a narrow region.

Eighth Embodiment

Next, a power amplification module according to an eighth embodiment will be described with reference to the drawings of FIG. 19A to FIG. 23D. Hereinafter, a description of a configuration common to that of the power amplification module according to the first embodiment illustrated in FIG. 1 to FIG. 5 will be omitted.

Figure 19A:
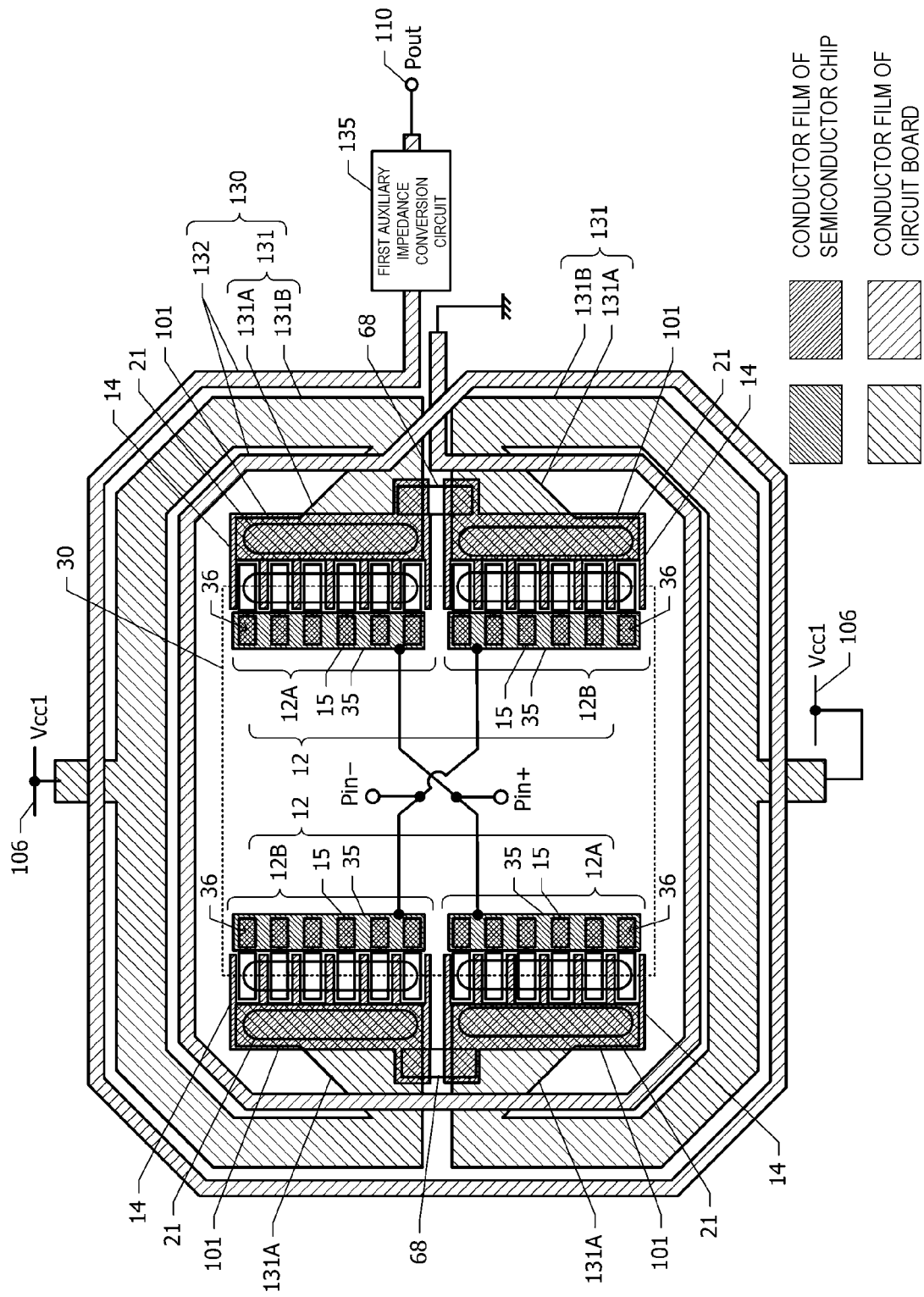
FIG. 19A is a diagram illustrating a positional relationship between a plurality of components of a power stage amplifier circuit and an output impedance conversion circuit of a power amplification module according to an eighth embodiment in a plan view.

FIG. 19A is a diagram illustrating a positional relationship between a plurality of components of a power stage amplifier circuit and an output impedance conversion circuit of the power amplification module according to the eighth embodiment in a plan view. In FIG. 19A, similarly to FIG. 1, a conductor film provided in the semiconductor chip 10 (FIG. 2) is marked with a relatively thick hatching, and a conductor film provided in the circuit board 100 (FIG. 2) is marked with a relatively thin hatching.

First, the semiconductor chip 10 (FIG. 2) will be described. In the eighth embodiment as well, similarly to the case of the first embodiment (FIG. 1), two transistor rows 12 are arranged along two sides facing each other of the convex polygon 30 having a substantially rectangular shape.

In the eighth embodiment, each of the two transistor rows 12 is divided into two blocks in the center in the length direction thereof. The plurality of power stage transistors 13 belongs to any one of the blocks. One of the two blocks is defined as a first block 12A, and the other is defined as a second block 12B. Further, the first block 12A and the second block 12B are defined so that the first block 12A and the second block 12B are alternately arranged in the circumferential direction of the convex polygon 30. In a case where the two transistor rows 12 are arranged in parallel to each other, the first block 12A of one transistor row 12 faces the second block 12B of the other transistor row 12.

The collector wiring 14, the first bump 21, and the inter-stage signal wiring 35 are arranged corresponding to each of the plurality of blocks. The collector wiring 14 is connected to the collectors (signal output ports) of the plurality of power stage transistors 13 in the corresponding block. The plurality of first bumps 21 are respectively connected to the corresponding collector wirings 14. The inter-stage signal wirings 35 overlap the base wirings 15 respectively drawn out from the bases (signal input ports) of the plurality of power stage transistors 13 in the corresponding block. The capacitor 36 is formed in the overlapping region of both wirings.

A high-frequency input signal Pin+ is input to the signal input port (hereinafter, may be referred to as a signal input port of the first block 12A) of the power stage transistor 13 belonging to the first block 12A through the inter-stage signal wiring 35, the capacitor 36, and the base wiring 15. An input signal Pin− that is opposite in phase to the input signal Pin+ is input to the signal input port (hereinafter, may be referred to as a signal input port of the second block 12B) of the power stage transistor 13 belonging to the second block 12B. As described above, a differential signal is input to the signal input port of the first block 12A and the signal input port of the second block 12B. A circuit configuration that generates the differential signal will be described later with reference to FIG. 20.

The collector wirings 14 respectively corresponding to the first block 12A and the second block 12B in the same transistor row 12 are connected to each other by a capacitor 68 having the MIM structure.

Next, the circuit board 100 (FIG. 2) will be described. In a plan view, the first lands 101 are arranged at positions overlapping the four first bumps 21, respectively. The first land 101 corresponding to the second block 12B of one transistor row 12 and the first land 101 corresponding to the first block 12A of the other transistor row 12 are connected by a primary coil 131 of a first transformer 130. In other words, the primary coil 131 connects the first land 101 corresponding to the second block 12B of each of the plurality of transistor rows 12 and the first land 101 corresponding to the first block 12A of the transistor row 12 at a position shifted by one row, which is the number of the transistor rows 12, in the first rotation direction in the circumferential direction of the convex polygon 30.

Each of the two primary coils 131 is arranged at the outer side portion of the convex polygon 30, and has an approximately half turn around the convex polygon 30. Lengths of the two primary coils 131 are approximately equal to each other. Here, the "approximately equal" means that, as will be described later with reference to FIG. 21, a certain degree of variation in length not to interfere with a differential operation of the power stage amplifier circuit 45 is allowed. As an example, when a difference between the lengths of the two primary coils (an actual length instead of an electrical length) is equal to or less than about 20% of an average value of the lengths of both coils, it can be said that the lengths are "approximately equal". There are two primary coils 131, which are arranged so as to surround substantially the entire circumference of the convex polygon 30.

Each of the primary coils 131 includes a first portion 131A extending from the first land 101 toward the outer side portion of the convex polygon 30 in a plan view, and a second portion 131B extending from a tip of the first portion 131A in the circumferential direction of the convex polygon 30. The first portion 131A has a substantially trapezoidal shape in a plan view. The first portion 131A is connected to the first land 101 at a lower base of a trapezoid, and is connected to the second portion 131B at an upper base. The lower base is longer than the upper base. A leg located on the center side of the transistor row 12 of two legs of the trapezoid and the lower base are orthogonal to each other.

The primary coils 131 are respectively connected to the first power supply wirings 106 at approximately the center in a length direction. Here, the "approximately the center" means that, as described later with reference to FIG. 21, a certain degree of variation in position not to interfere with the differential operation of the power stage amplifier circuit 45 is allowed. The power supply voltage Vcc1 is applied to the collector of the power stage transistor 13 from the first power supply wiring 106 through the primary coil 131, the first land 101, the first bump 21, and the collector wiring 14.

A secondary coil 132 of the first transformer 130 is arranged so as to extend along the second portion 131B of the two primary coils 131 in a plan view. The secondary coil 132 has approximately two turns around the convex polygon 30. One end of the secondary coil 132 is grounded, and the other end thereof is connected to the signal output terminal 110 via a first auxiliary impedance conversion circuit 135. A first-turn portion of the secondary coil 132 that has an end portion being grounded as a start point is arranged at an inner side portion from the second portion 131B of the primary coil 131, and a second-turn portion is arranged at an outer side portion from the second portion 131B of the primary coil 131. With this configuration, strength of the coupling with the primary coil 131 is equalized between the first-turn portion and the second-turn portion of the secondary coil 132. The secondary coil 132 is arranged in a distributed manner in a plurality of layers of a surface layer or the inner layer of the circuit board 100 (FIG. 2).

Next, a description will be given of a group in which a plurality of power stage transistors 13 is classified with reference to FIG. 19B.

Figure 19B:
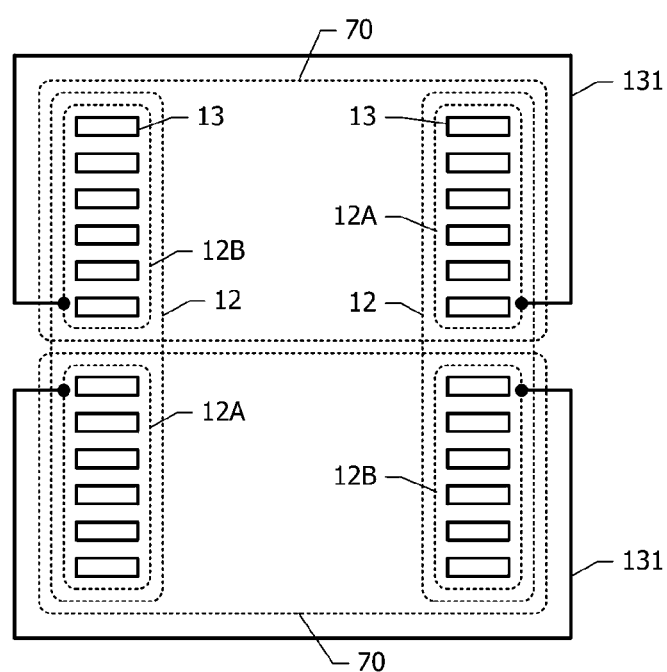
FIG. 19B is a schematic diagram for explaining a difference between a transistor row and a group of power stage transistors.

FIG. 19B is a schematic diagram for explaining a difference between the transistor row 12 and a group 70. As described above with reference to FIG. 19A, each of the two transistor rows 12 is divided into the first block 12A and the second block 12B. The power stage transistor 13 of the first block 12A of one transistor row 12 and the power stage transistor 13 of the second block 12B of the other transistor row 12 belong to one group 70. The primary coil 131 connects the power stage transistor 13 of the first block 12A and the power stage transistor 13 of the second block 12B in the same group 70.

The plurality of power stage transistors 13 belonging to each of the first block 12A and the second block 12B has the collectors that are short-circuited to each other. The plurality of power stage transistors 13 in which the collectors are short-circuited to each other belongs to the same group. Further, even when the collectors are not short-circuited to each other, the plurality of power stage transistors 13 in which the collectors are connected to each other via the common primary coil 131 also belongs to the same group. As described above, the plurality of power stage transistors 13 may be divided into two groups 70 depending on whether or not they are connected to the common primary coil 131.

Figure 20:
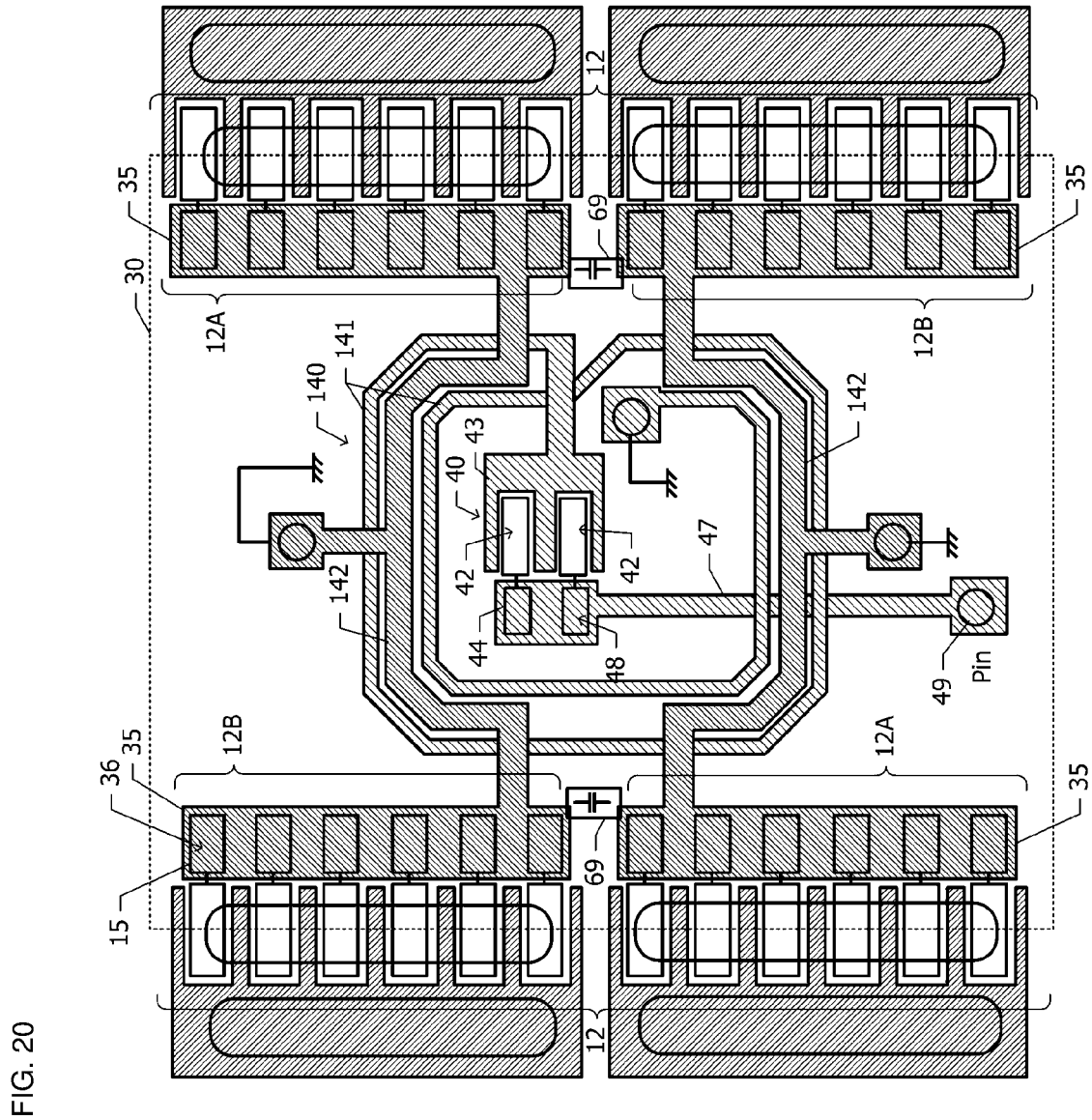
FIG. 20 is a diagram illustrating a positional relationship between a circuit that generates a differential signal input to a plurality of power stage transistors and components of a preceding stage amplifier circuit in a plan view.

FIG. 20 is a diagram illustrating a positional relationship of a circuit that generates a differential signal input to the plurality of power stage transistors 13 and the components of the preceding stage amplifier circuit 40 in a plan view. The circuit that generates the differential signal and the preceding stage amplifier circuit 40 are provided in the semiconductor chip 10 (FIG. 2).

The preceding stage amplifier circuit 40 is arranged inside the convex polygon 30. The preceding stage amplifier circuit 40 is configured by two preceding stage transistors 42 connected in parallel to each other, similarly to the preceding stage amplifier circuit 40 of the power amplification module (FIG. 16) according to the sixth embodiment. The base wiring 44 connected to the base of the preceding stage transistor 42 is connected to the signal input wiring 47 via the capacitor 48. The signal input wiring 47 is connected to the signal input bump 49. The high-frequency input signal Pin is input from the signal input bump 49 to the base of the preceding stage transistor 42 via the signal input wiring 47, the capacitor 48, and the base wiring 44.

One end of a primary coil 141 of a second transformer 140 is connected to the collector wiring 43 connected to the collector (signal output port) of the preceding stage transistor 42. The other end of the primary coil 141 is grounded. The primary coil 141 surrounds the preceding stage transistor 42, and has two turns around the preceding stage transistor 42. In FIG. 20, the primary coil 141, the collector wiring 43, and the signal input wiring 47 are marked with a relatively thin hatching.

The inter-stage signal wirings 35 are respectively arranged corresponding to the first blocks 12A and the second blocks 12B of the two transistor rows 12. Two inter-stage signal wirings 35 corresponding to the first block 12A and the second block 12B of the same transistor row 12 are connected by a capacitor 69 having the MIM structure.

A secondary coil 142 of the second transformer 140 connects the inter-stage signal wiring 35 corresponding to the second block 12B of one transistor row 12 and the inter-stage signal wiring 35 corresponding to the first block 12A of the other transistor row 12 to each other. The preceding stage amplifier circuit 40 is arranged between two secondary coils 142. The lengths of the two secondary coils 142 are approximately equal to each other, and the two secondary coils 142 are grounded at approximately the center in the length direction thereof. Here, "substantially equal" and "approximately the center" mean that, as will be described later with reference to FIG. 21, a certain degree of variation in length and in position not interfere with the differential operation of the power stage amplifier circuit 45 is allowed. A part of the secondary coil 142 is arranged along the primary coil 141, and the primary coil 141 and the secondary coil 142 configure the second transformer 140. A portion of the secondary coil 142 of the second transformer 140 that extends along the primary coil 141 is arranged between a first-turn portion and a second-turn portion of the primary coil 141.

A connection point between the secondary coil 142 and the inter-stage signal wiring 35 is arranged at a position biased toward the center side in the length direction of the transistor row 12 with respect to the length direction of the inter-stage signal wiring 35. That is, the connection point between the secondary coil 142 and the inter-stage signal wiring 35 is biased in a direction in which the number of turns of each of the two secondary coils 142 increases. The secondary coil 142 is connected to the base (signal input port) of the power stage transistor 13 via the inter-stage signal wiring 35, the capacitor 36, and the base wiring 15. Note that, in FIG. 20, an illustration of a circuit for supplying power to the preceding stage transistor 42 is omitted.

Figure 21:
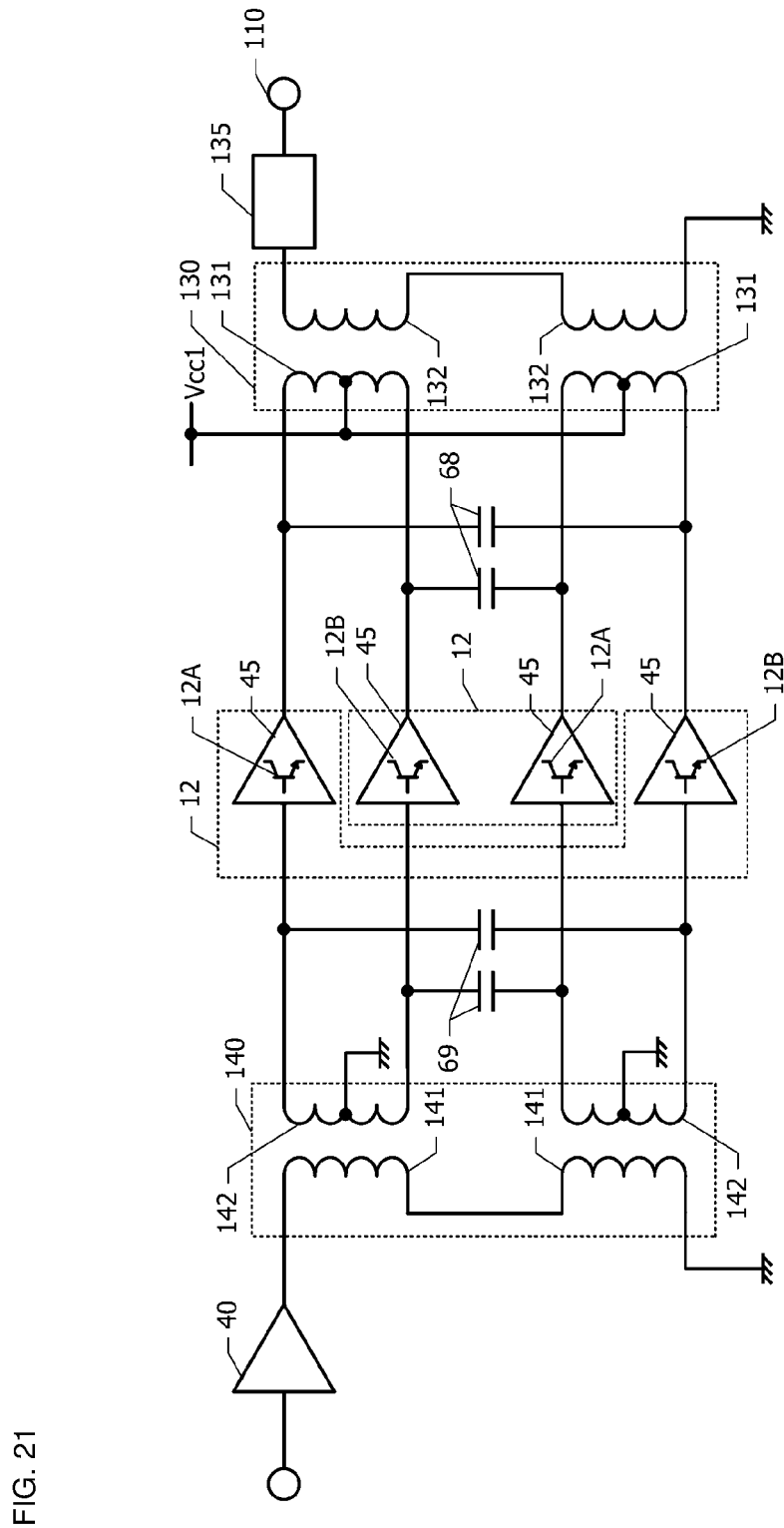
FIG. 21 is an equivalent circuit diagram of the power amplification module according to the eighth embodiment.

FIG. 21 is an equivalent circuit diagram of the power amplification module according to the eighth embodiment. The signal output port of the preceding stage amplifier circuit 40 and a signal input port of the power stage amplifier circuit 45 are connected via the second transformer 140. The primary coil 141 is connected between the signal output port of the preceding stage amplifier circuit 40 and the ground. Two secondary coils 142 are coupled to the primary coil 141.

The secondary coils 142 respectively connects the signal input port of the first block 12A of one transistor row 12 and the signal input port of the second block 12B of the other transistor row 12 to each other. Each of the secondary coils 142 is grounded at the center in the length direction. High-frequency signals with phases opposite to each other are input to the power stage amplifier circuit 45 of the first block 12A and the power stage amplifier circuit 45 of the second block 12B by the second transformer 140. In addition, high-frequency signals in the same phase are input to the power stage amplifier circuits 45 of the two first blocks 12A, and high-frequency signals in the same phase are also input to the power stage amplifier circuits 45 of the two second blocks 12B.

Similarly to the second impedance conversion circuit 50 of the power amplification module (FIG. 5) according to the first embodiment, the second transformer 140 has a function of matching the output impedance of the preceding stage amplifier circuit 40 with the input impedance of the power stage amplifier circuit 45. For example, a ratio of the number of turns between an approximately two-turn primary coil 141 and an approximately ½-turn secondary coil 142 is about 4:1. The output impedance of the preceding stage amplifier circuit 40 is converted to about 1/16 times in accordance with the ratio of the number of turns between the primary coil 141 and the secondary coil 142. Further, the power stage amplifier circuit 45 performs a differential operation, and thus the output impedance is further converted to about ¼ times. As a result, the output impedance of the preceding stage amplifier circuit 40 is converted to about 1/64 times.

Further, the second transformer 140 has a function of converting the high-frequency signal output from the preceding stage amplifier circuit 40 into a differential signal and inputting the differential signal to the power stage amplifier circuit 45. One preceding stage amplifier circuit 40 and one second transformer 140 are shared by two transistor rows 12. The capacitors 68 and 69 connected to the signal input port and the signal output port of the power stage amplifier circuit 45 are provided in order to stabilize the high-frequency operation.

The signal output port of the first block 12A of one transistor row 12 and the signal output port of the second block 12B of the other transistor row 12 are connected by the primary coil 131 of the first transformer 130. The primary coil 131 is coupled to the secondary coil 132 of the first transformer 130. The power supply voltage Vcc1 is applied to a central position in the length direction of the primary coil 131. The primary coil 131 is grounded in an alternating manner in the center of the length direction.

The first transformer 130 has a function of converting the output impedance of the power stage amplifier circuit 45 into a high impedance, and also has a function of synthesizing the power of the high-frequency signals output from the plurality of power stage amplifier circuits 45. The high-frequency signal induced in the secondary coil 132 of the first transformer 130 is output from the signal output terminal 110 through the first auxiliary impedance conversion circuit 135. The first transformer 130 and the first auxiliary impedance conversion circuit 135 have a function similar to that of the first impedance conversion circuit 120 of the power amplification module (FIG. 5) according to the first embodiment. Accordingly, the output impedance of the power amplification module can be matched to the input impedance of the load, such as an antenna, connected to the signal output terminal 110. Note that, in a case where sufficient impedance matching is achieved only by the first transformer 130, the first auxiliary impedance conversion circuit 135 is not required.

Next, an excellent effect of the eighth embodiment will be described.

The plurality of power stage transistors 13 is grouped into two groups 70 so that the plurality of power stage transistors 13 belonging to the first block 12A of one transistor row 12 and the plurality of power stage transistors 13 belonging to the second block 12B of the other transistor row 12 belong to the same group 70. At this time, the two primary coils 131 of the first transformer 130 may be considered as individual reactance elements arranged corresponding to the two groups 70, respectively. Since the individual reactance element of the first transformer 130 is arranged for each group 70 of the plurality of power stage transistors 13, it is possible to arrange the individual reactance element closer to the signal output port of the power stage transistor 13 as compared with a case where one reactance element is connected to all of the plurality of power stage transistors 13.

For example, in the eighth embodiment, the four first lands 101 are arranged corresponding to the first block 12A and the second block 12B of two transistor rows 12, respectively, and the first lands 101 respectively are connected to the primary coil 131 of the first transformer 130. Therefore, the length of the signal path from the signal output port of the power stage transistor 13 to an input end of the first transformer 130 can be shorten without depending on the arrangement of the transistor row 12. Therefore, similarly to the case of the first embodiment, it is possible to suppress the loss occurring in the signal path from the signal output port of the plurality of power stage transistors 13 to the signal output terminal 110, and to achieve the high output.

In addition, in the eighth embodiment, an impedance conversion ratio can be changed by changing the ratio of the number of turns between the primary coil 141 and the secondary coil 142 of the second transformer 140. This makes it possible to bring the impedance matching between stages of the preceding stage amplifier circuit 40 and the power stage amplifier circuit 45 closer to a more ideal state. As a result, it becomes possible to increase the gain of the power amplification module. Further, in the eighth embodiment as well, similarly to the case of the first embodiment (the drawings of FIG. 1 to FIG. 5), it is possible to suppress the loss occurring in the signal path from the signal output port of the plurality of power stage transistors 13 to the signal output terminal 110, and to achieve the high output. Further, it is possible to obtain an excellent effect that a variation in operation between the plurality of power stage transistors 13 is reduced, an excellent effect that it is advantageous to reduce the parasitic resistance and the parasitic inductance, and an excellent effect that the heat dissipation effect can be enhanced.

Next, with reference to FIG. 22, a description will be given of a modification in which the ratio of the number of turns between the primary coil 141 and the secondary coil 142 of the second transformer 140 is different from that in the case of the eighth embodiment.

Figure 22:
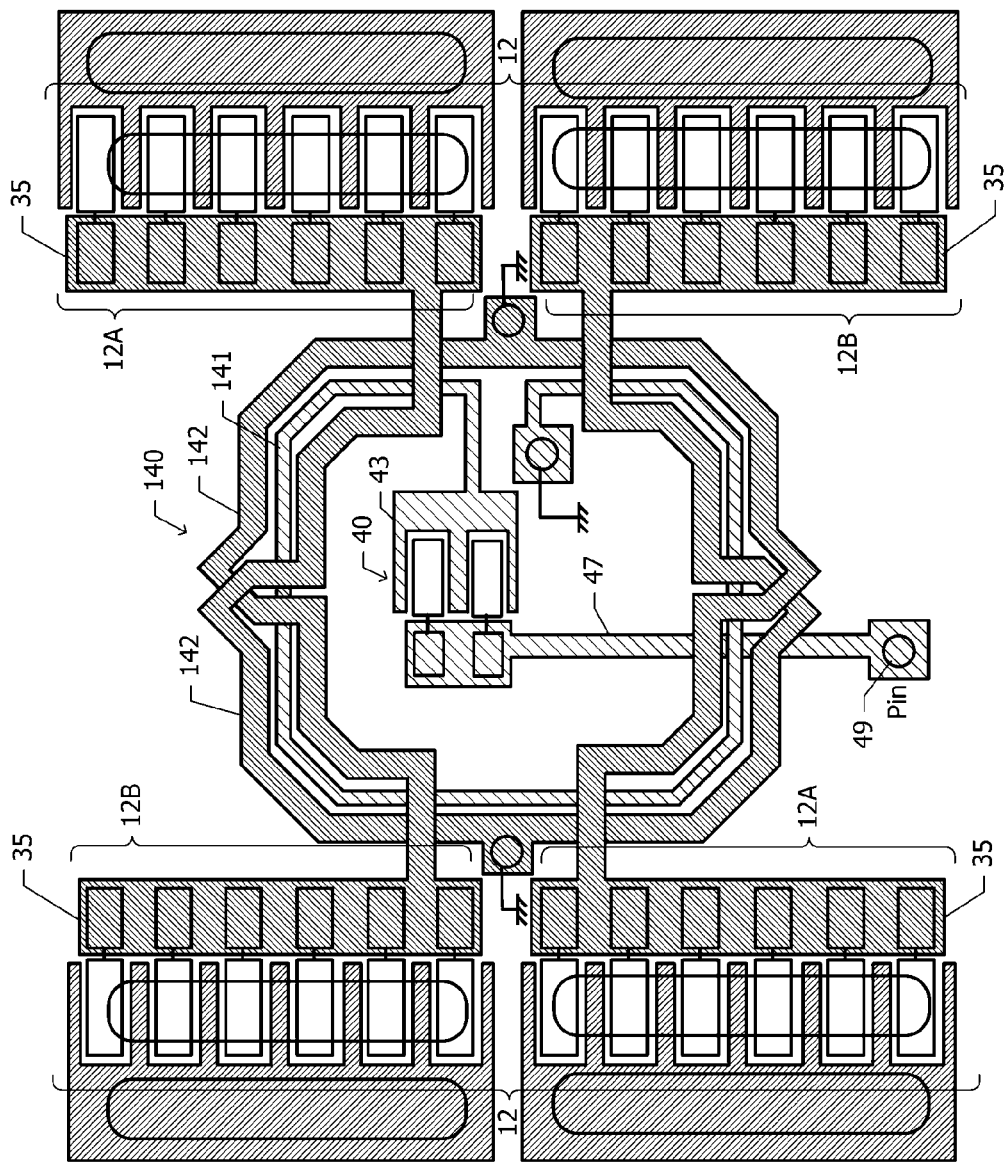
FIG. 22 is a diagram illustrating a positional relationship between a circuit that generates a differential signal input to a plurality of power stage transistors and components of a preceding stage amplifier circuit of a power amplification module according to the modification in a plan view.

FIG. 22 is a diagram illustrating a positional relationship of a circuit that generates a differential signal input to the plurality of power stage transistors 13 of a power amplification module according to the modification and components of the preceding stage amplifier circuit 40, in a plan view. In FIG. 22, an illustration of the capacitor 69 (FIG. 20) is omitted.

In the eighth embodiment, each of the secondary coils 142 connects the signal input port of the first block 12A and the signal input port of the second block 12B of the transistor rows 12 that are different from each other. On the other hand, in the modification, each of the secondary coils 142 connects the signal input port of the first block 12A and the signal input port of the second block 12B of the same transistor row 12. According to the difference in a connection configuration of the secondary coil 142, in the modification, each of the secondary coils 142 has approximately one turn around the preceding stage amplifier circuit 40. Similarly to the case of the eighth embodiment, each of the secondary coils 142 is grounded at the center in the length direction.

Further, in the eighth embodiment, the number of turns of the primary coil 141 of the second impedance conversion circuit 50 is about two, but in the modification, the number of turns is one. For this reason, in the modification, the ratio of the number of turns between the primary coil 141 and the secondary coil 142 of the second transformer 140 is about 1:1. Therefore, the impedance conversion in accordance with the ratio of the number of turns is not performed. The power stage amplifier circuit 45 performs the differential operation, thereby converting the output impedance of the preceding stage amplifier circuit 40 to ¼ times. Therefore, as a whole, the output impedance of the preceding stage amplifier circuit 40 is converted to ¼ times.

As in the eighth embodiment or the modification, the ratio of the number of turns between the primary coil 141 and the secondary coil 142 of the second transformer 140 may be set according to the required impedance conversion ratio.

Next, an excellent effect based on a shape of the first portion 131A (FIG. 19A) of the primary coil 131 will be described with reference to the drawings of FIG. 23A to FIG. 23D.

Figure 23A:
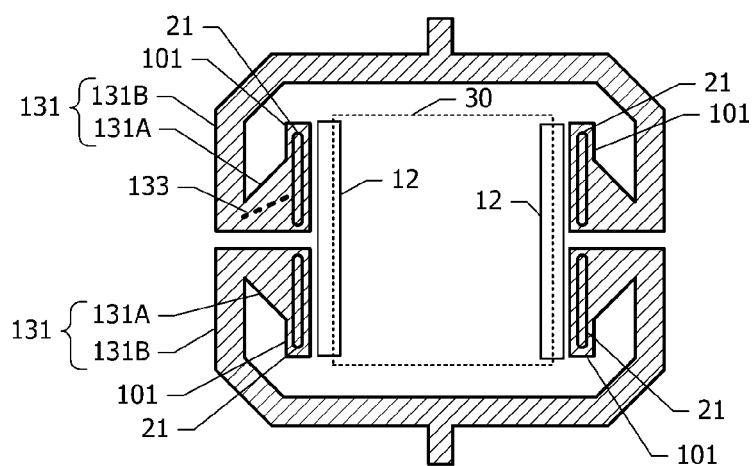
FIG. 23A is a diagram illustrating a shape of a primary coil of the power amplification module according to the eighth embodiment in a plan view, and FIG. 23B, FIG. 23C, and FIG. 23D respectively are a diagram illustrating a shape of a first portion according to a comparative example in a plan view.

FIG. 23A is a diagram illustrating the shape of the primary coil 131 of the power amplification module according to the eighth embodiment in a plan view. In a plan view, a region in which two transistor rows 12, four first bumps 21, and four first lands 101 are arranged is surrounded by two primary coils 131. Each of the two primary coils 131 connects the two first lands 101 to each other, the first lands facing each other across the convex polygon 30 in a plan view.

The first portion 131A of the primary coil 131 is connected to the first land 101 at one end thereof, and extends in a direction away from the transistor row 12 (in a direction toward the outer side portion of the convex polygon 30). The second portion 131B extends from the tip of the first portion 131A toward one side in a direction parallel to the length direction of the transistor row 12 (the circumferential direction of the convex polygon 30).

As described with reference to FIG. 19A, the first portion 131A has a substantially trapezoidal shape in a plan view. The first portion 131A is connected to the first land 101 at the lower base of the trapezoid, and is connected to the second portion 131B at the upper base. The lower base is longer than the upper base. A leg located on the center side of the transistor row 12 of two legs of the trapezoid and the lower base are orthogonal to each other. That is, the first portion 131A is unevenly distributed in the direction in which the length of the second portion 131B increases, from the first land 101 toward the tip of the first portion 131A.

Figure 23B:
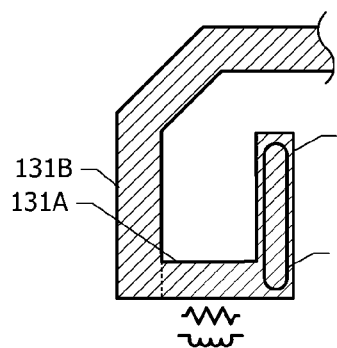
Figure 23C:
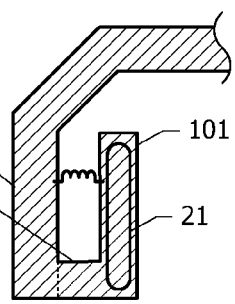
Figure 23D:
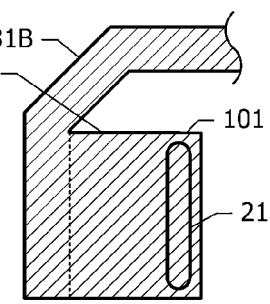

FIG. 23B, FIG. 23C, and FIG. 23D respectively are a diagram illustrating the shapes of the first portion 131A according to comparative examples in a plan view. In the comparative example illustrated in FIG. 23B, the first portion 131A is narrower in the entire region in the length direction as compared with the first portion 131A according to the eighth embodiment. For this reason, the parasitic resistance and the parasitic inductance of the first portion 131A are increased.

In the comparative example illustrated in FIG. 23C, the first portion 131A is shorter than that in the comparative example illustrated in FIG. 23B. In this case, the parasitic resistance and the parasitic inductance of the first portion 131A itself are reduced, but end portions of the first land 101 and the second portion 131B are close to each other. As a result, a magnetic coupling between both ends is increased. A portion of the second portion 131B magnetically coupled to the first land 101 does not function as the primary coil of the first transformer 130, and the performance of the first transformer 130 is lowered.

The comparative example illustrated in FIG. 23D, the first portion 131A is thicker than that in the comparative example illustrated in FIG. 23B. In this case, a portion of the second portion 131B connected to the first portion 131A does not function as the primary coil of the first transformer 130, and the performance of the first transformer 130 is lowered.

In the eighth embodiment, an average width of the first portion 131A is wider than that in the comparative example of FIG. 23B. Therefore, an increase in the parasitic resistance and the parasitic inductance of the first portion 131A can be suppressed. In addition, in the eighth embodiment, the end portion of the second portion 131B is farther away from the first land 101 as compared with the comparative example of FIG. 23C. Therefore, an increase in magnetic coupling between the first land 101 and the second portion 131B is suppressed. Further, in the eighth embodiment, the upper base is shorter than the lower base in the trapezoid corresponding to the shape of the first portion 131A in a plan view. Therefore, the expansion of the portion of the second portion 131B that does not function as the primary coil of the first transformer 130 is suppressed. In the eighth embodiment, a decrease in the output of the power amplification module can be suppressed due to these effects.

The shape of the first portion 131A of the primary coil 131 in a plan view is not limited to a substantially trapezoidal shape. For example, it is preferable that the width of the first portion 131A become narrower from the first land 101 toward the tip of the first portion 131A. Here, a width direction of the first portion 131A is defined as a direction parallel to the length direction of the transistor row 12 corresponding to the first portion 131A. Further, it is preferable that a line 133 connecting the center points in the width direction of the first portion 131A is inclined in the direction in which the second portion 131B becomes longer with reference to a direction orthogonal to the length direction of the transistor row 12.

Ninth Embodiment

Next, a power amplification module according to a ninth embodiment will be described with reference to FIG. 24, FIG. 25, and FIG. 26. Hereinafter, a description of a configuration common to that of the power amplification module (FIG. 19A, FIG. 20, and FIG. 21) according to the eighth embodiment will be omitted.

Figure 24:
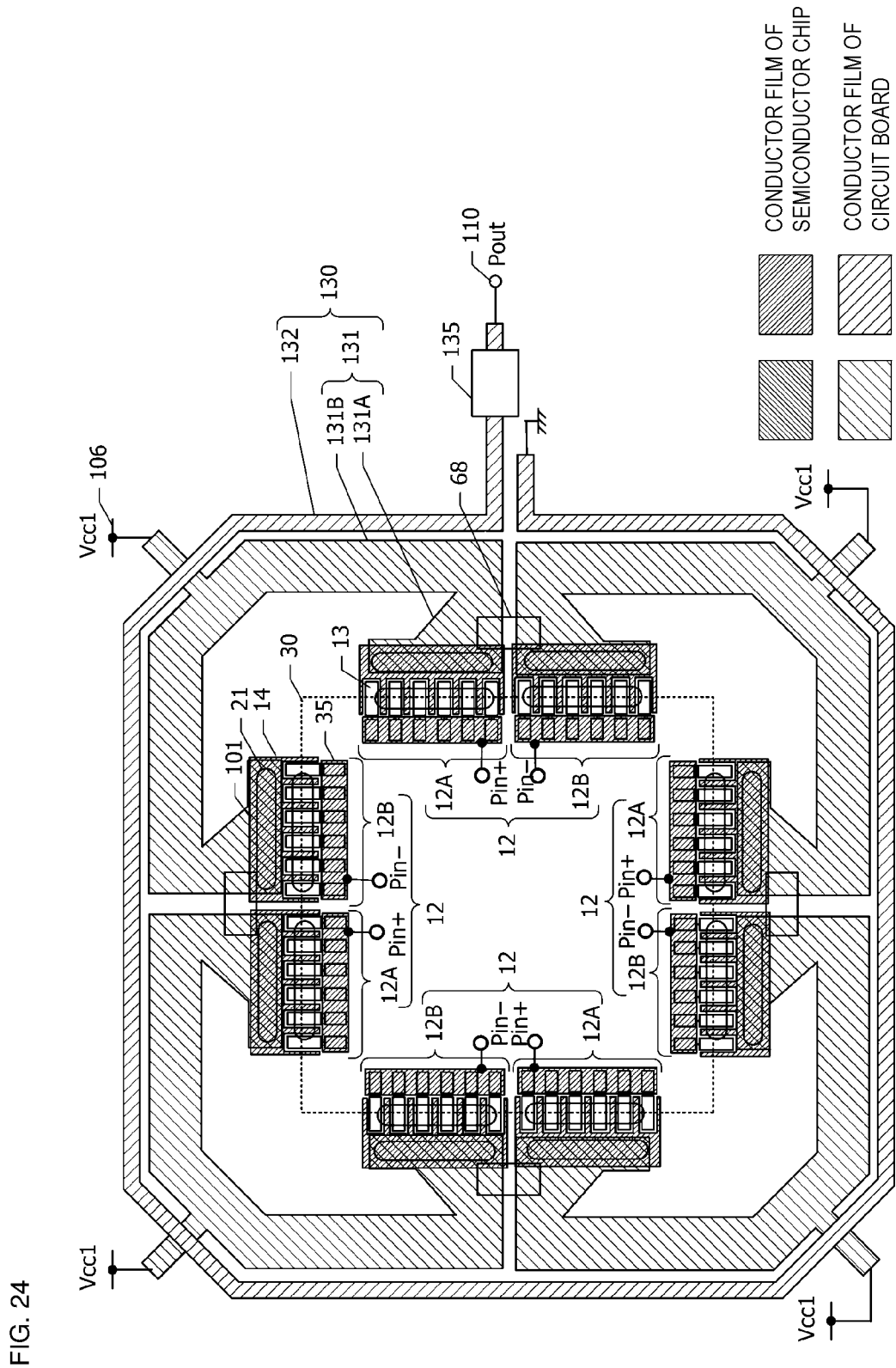
FIG. 24 is a diagram illustrating a positional relationship between a plurality of components of a power stage amplifier circuit and an output impedance conversion circuit of a power amplification module according to a ninth embodiment in a plan view.

FIG. 24 is a diagram illustrating a positional relationship of a plurality of components of a power stage amplifier circuit and an output impedance conversion circuit of the power amplification module according to the ninth embodiment in a plan view. In FIG. 24, similarly to FIG. 19A, a conductor film provided in the semiconductor chip 10 (FIG. 2) is marked with a relatively thick hatching, and a conductor film provided in the circuit board 100 (FIG. 2) is marked with a relatively thin hatching.

In the eighth embodiment (FIG. 19A), two transistor rows 12 are arranged, but in the ninth embodiment, the transistor rows 12 are arranged along four sides of the convex polygon 30 having a substantially square shape, respectively. Similarly to the case of the eighth embodiment, each of the transistor rows 12 is divided into the first block 12A and the second block 12B in the center in the length direction of the transistor row 12. The first block 12A and the second block 12B are alternately arranged in the circumferential direction of the convex polygon 30 in a plan view.

Similarly to the case of the eighth embodiment (FIG. 19A), the collector wiring 14, the first bump 21, and the inter-stage signal wiring 35 on the semiconductor chip 10 (FIG. 2), and the first land 101 on the circuit board 100 (FIG. 2) are arranged corresponding to each of the first block 12A and the second block 12B of the transistor row 12. The capacitor 68 having the MIM structure connects the collector wiring 14 corresponding to the first block 12A and the collector wiring 14 corresponding to the second block 12B of the same transistor row 12. The capacitor 68 is provided to stabilize the high-frequency operation.

The first lands 101 respectively corresponding to the first block 12A and the second block 12B that belong to the different transistor rows 12 adjacent to each other in the circumferential direction of the convex polygon 30 are connected by the primary coil 131 of the first transformer 130. Similarly to the case of the eighth embodiment (FIG. 19A), each of the primary coils 131 is configured by two first portions 131A and the second portion 131B that connects the two first portions 131A. The lengths of the four primary coils 131 are the same, and the four primary coils 131 are connected to the first power supply wiring 106 in the center in the length direction.

In the eighth embodiment, each of the primary coils 131 (FIG. 19A) has an approximately half turn around the convex polygon 30, but in the ninth embodiment, each of the primary coils 131 has an approximately ¼ turn around the convex polygon 30. There are four primary coils 131, which have approximately one turn around the convex polygon 30.

In the eighth embodiment, although the secondary coil 132 of the first transformer 130 (FIG. 19A) has approximately two turns around the convex polygon 30, in the ninth embodiment, the secondary coil 132 of the first transformer 130 has approximately one turn around the convex polygon 30.

A high-frequency input signal Pin+ is input to the signal input port of the first block 12A. An input signal Pin− that is opposite in phase to the input signal Pin+ is input to the signal input port of the second block 12B.

Figure 25:
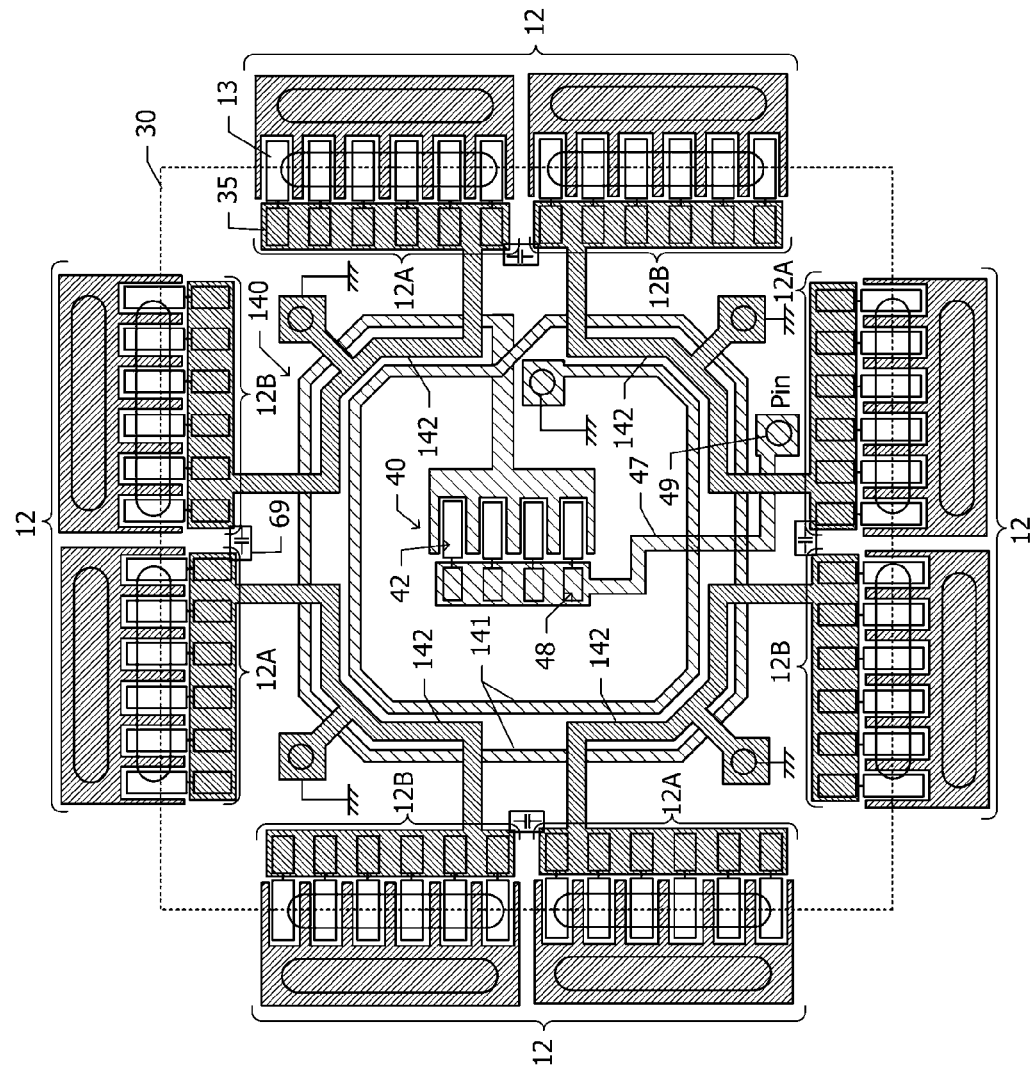
FIG. 25 is a diagram illustrating a positional relationship between a circuit that generates a differential signal input to a plurality of power stage transistors and components of a preceding stage amplifier circuit in a plan view.

FIG. 25 is a diagram illustrating a positional relationship of a circuit that generates a differential signal input to the plurality of power stage transistors 13 and components of the preceding stage amplifier circuit 40 in a plan view. The circuit that generates the differential signal and the preceding stage amplifier circuit 40 are provided in the semiconductor chip 10 (FIG. 2). The preceding stage amplifier circuit 40 is arranged inside the convex polygon 30 in a plan view.

The signal input port of the first block 12A and the signal input port of the second block 12B that belong to the different transistor rows 12 adjacent to each other in the circumferential direction of the convex polygon 30 are connected by the secondary coil 142. In the eighth embodiment, each of the two secondary coils 142 (FIG. 20) has an approximately half turn around the preceding stage amplifier circuit 40, but in the ninth embodiment, each of the four secondary coils 142 has an approximately ¼ turn around the preceding stage amplifier circuit 40. The lengths of the four secondary coils 142 are equal to each other, and are grounded in the center in the length direction.

The inter-stage signal wirings 35 respectively corresponding to the first block 12A and the second block 12B of the same transistor row 12 are connected by the capacitor 69 having the MIM structure. The capacitor 69 has a function of stabilizing the high-frequency operation.

In the eighth embodiment, the preceding stage amplifier circuit 40 (FIG. 20) is configured by two preceding stage transistors 42, however, in the ninth embodiment, the preceding stage amplifier circuit 40 is configured by four preceding stage transistors 42 connected in parallel to each other. The signal input wiring 47 is connected to the base of the four preceding stage transistors 42 via the capacitor 48. The primary coil 141 of the second transformer 140 connected to the collector (signal output port) of the preceding stage transistor 42 has two turns around the preceding stage amplifier circuit 40. In FIG. 25, the primary coil 141 and the signal input wiring 47 are marked with a relatively thin hatching.

Figure 26:
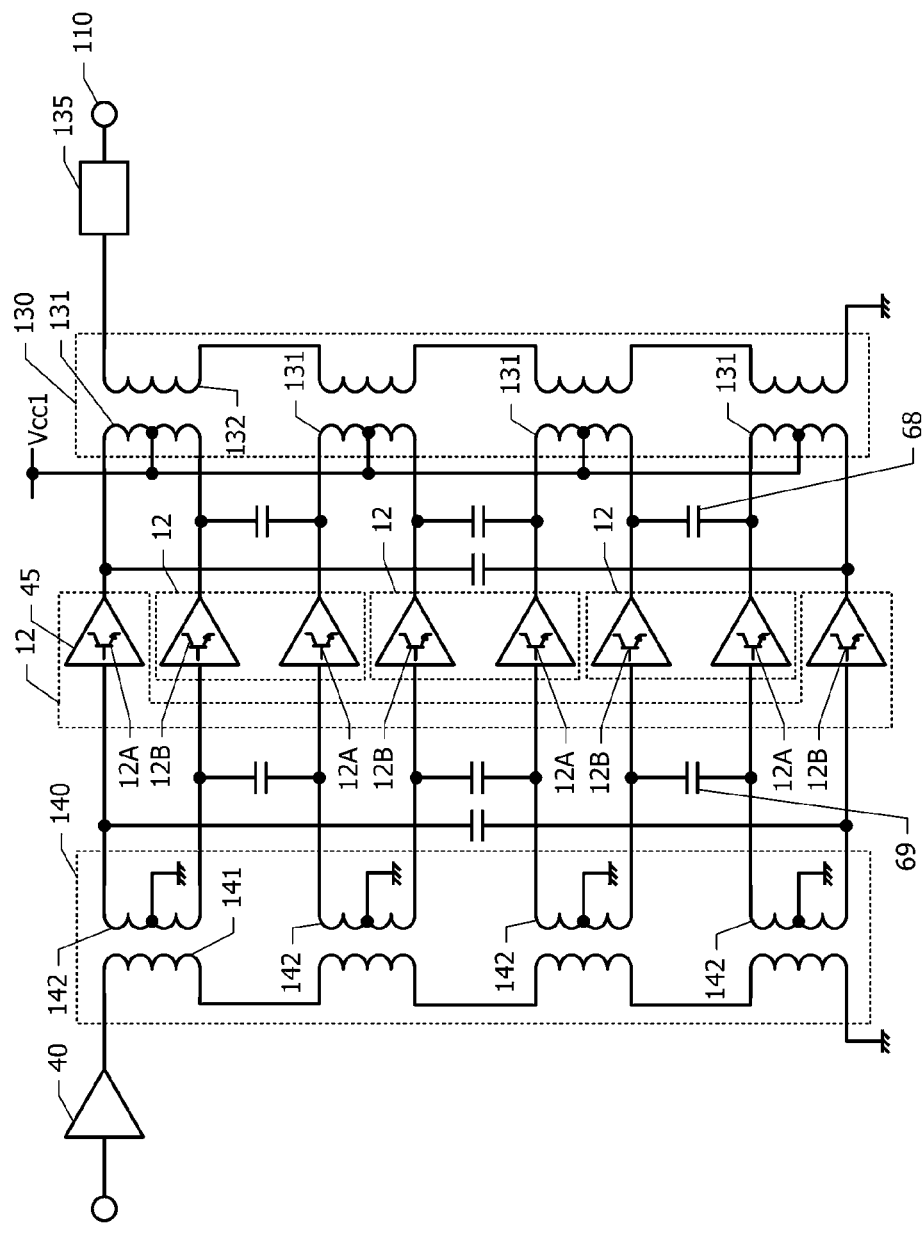
FIG. 26 is an equivalent circuit diagram of the power amplification module according to the ninth embodiment.

FIG. 26 is an equivalent circuit diagram of the power amplification module according to the ninth embodiment. The second transformer 140 is configured by the primary coil 141 and four secondary coils 142. The second transformer 140 has a function of an impedance matching circuit that converts the output impedance of the preceding stage amplifier circuit 40 and matches the input impedance of the power stage amplifier circuit 45. Further, the second transformer 140 functions as a differential signal generation circuit that supplies high-frequency signals with phases opposite to each other to the power stage amplifier circuit 45 corresponding to the first block 12A and the power stage amplifier circuit 45 corresponding to the second block 12B.

In the ninth embodiment, the ratio of the number of turns between an approximately two-turn primary coil 141 and the secondary coils 142 each having an approximately ¼-turn of the second transformer 140 is approximately 8:1. According to this ratio of the number of turns, the output impedance of the preceding stage amplifier circuit 40 is converted to about 1/64 times. Further, the power stage amplifier circuit 45 performs a differential operation, and thus the output impedance is further converted to ¼ times. As a result, the output impedance of the preceding stage amplifier circuit 40 is converted to about 1/256 times.

The first transformer 130 is configured by four primary coils 131 and the secondary coil 132. The first transformer 130 and the first auxiliary impedance conversion circuit 135 function as an impedance conversion circuit that converts the output impedance of the power stage amplifier circuit 45 into a high impedance. As such, the output impedance of the power stage amplifier circuit 45 can be matched to the input impedance of a load such as an antenna. Note that, in a case where sufficient impedance matching can be achieved only by the first transformer 130, the first auxiliary impedance conversion circuit 135 may be omitted. Further, the first transformer 130 has a function of synthesizing the power of the high-frequency signals output from eight power stage amplifier circuits 45.

Also in the ninth embodiment, similarly to the eighth embodiment, the primary coil 131 of the first transformer 130 is arranged for each group of the plurality of power stage transistors 13 grouped into a plurality of groups. The primary coil 131 may be considered as an individual reactance element of the first transformer 130 arranged corresponding to each of the plurality of groups.

Next, an excellent effect of the ninth embodiment will be described.

In the ninth embodiment as well, similarly to the case of the eighth embodiment (FIG. 19A, FIG. 20, and FIG. 21), it is possible to suppress the loss occurring in the signal path from the signal output port of the plurality of power stage transistors 13 to the signal output terminal 110, and to achieve the high output. Further, in the ninth embodiment, since the transistor rows 12 are arranged in four rows, the number of the power stage transistors 13 is increased as compared with the case of the eighth embodiment, and it is possible to achieve a higher output.

In addition, in the ninth embodiment, the impedance conversion ratio can be changed by changing the ratio of the number of turns between the primary coil 141 and the secondary coil 142 of the second transformer 140. This makes it possible to bring the impedance matching between stages of the preceding stage amplifier circuit 40 and the power stage amplifier circuit 45 closer to a more ideal state. As a result, it becomes possible to increase the gain of the power amplification module.

Figure 27:
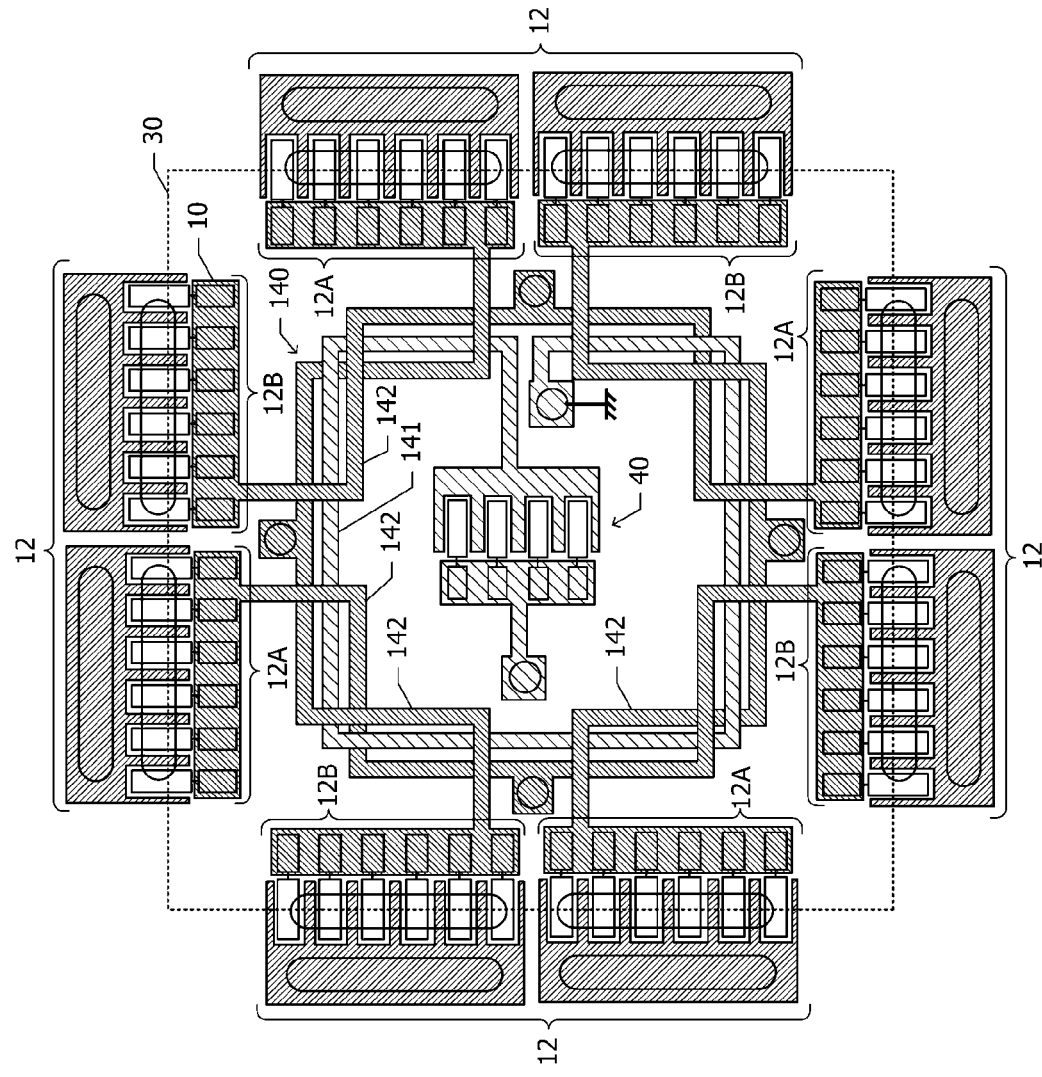
FIG. 27 is a diagram illustrating a positional relationship in a plan view between a plurality of power stage transistors of a second transformer, the second transformer, and components of a preceding stage amplifier circuit of a power amplification module according to a modification in which a ratio of the number of turns of the second transformer is 2:1.
Figure 28:
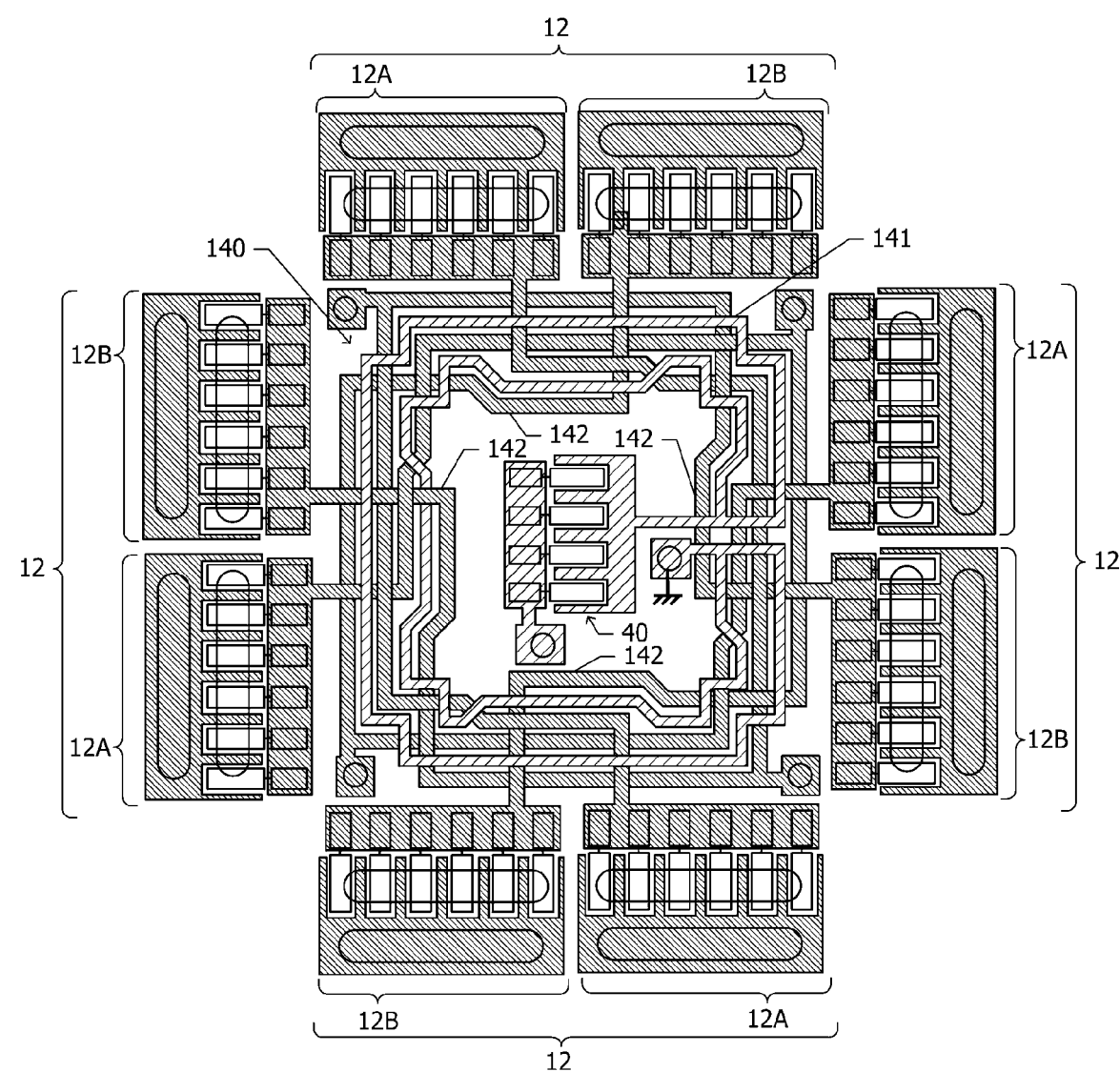
FIG. 28 is a diagram illustrating a positional relationship in a plan view of a plurality of power stage transistors of a second transformer, the second transformer, and components of a preceding stage amplifier circuit of a power amplification module according to a modification in which the ratio of the number of turns of the second transformer is 4:3.

Next, with reference to FIG. 27 and FIG. 28, a description will be given of a modification in which a ratio of the number of turns between the primary coil 141 and the secondary coil 142 of the second transformer 140 is different from that in the ninth embodiment. In FIG. 27 and FIG. 28, a relatively thin hatching is applied to the primary coil 141, and a relatively thick hatching is applied to the secondary coil 142.

FIG. 27 is a diagram illustrating a positional relationship in a plan view of the plurality of power stage transistors 13 of the second transformer 140, the second transformer 140, and components of the preceding stage amplifier circuit 40 of a power amplification module according to a modification in which the ratio of the number of turns of the second transformer 140 is about 2:1.

In the ninth embodiment, the signal input port of the first block 12A and the signal input port of the second block 12B that belong to the different transistor rows 12 adjacent to each other in the circumferential direction of the convex polygon 30 are connected by the secondary coil 142. On the other hand, in the modification, the signal input port of the first block 12A of one transistor row 12 and the signal input port of the second block 12B of the other transistor row 12, of the two transistor rows 12 along sides facing each other of the convex polygon 30 are connected by the secondary coil 142. The primary coil 141 of the second transformer 140 has one turn around the preceding stage amplifier circuit 40.

In the modification, the ratio of the number of turns of the second transformer 140 is about 2:1. According to this ratio of the number of turns, the output impedance of the preceding stage amplifier circuit 40 is converted to about ¼ times. Further, the power stage amplifier circuit 45 performs a differential operation, and thus the output impedance is further converted to ¼ times. As a result, the output impedance of the preceding stage amplifier circuit 40 is converted to about ¹⁄₁₆ times.

FIG. 28 is a diagram illustrating a positional relationship in a plan view of the plurality of power stage transistors 13 of the second transformer 140, the second transformer 140, and components of the preceding stage amplifier circuit 40 of a power amplification module according to a modification in which the ratio of the number of turns of the second transformer 140 is about 4:3.

This modification is common to the ninth embodiment in that a signal input end of the first block 12A and a signal input end of the second block 12B that belong to the different transistor rows 12 adjacent to each other in the circumferential direction of the convex polygon 30 are connected by the secondary coil 142. However, in the ninth embodiment, while each of the secondary coils 142 has an approximately ¼ turn around the preceding stage amplifier circuit 40, in the modification, each of the secondary coils 142 has an approximately ¾ turn around the preceding stage amplifier circuit 40.

The primary coil 141 of the second transformer 140 has one turn around the preceding stage amplifier circuit 40. Note that, although the primary coil 141 is configured by two annular wirings connected in parallel to each other, the number of turns of the primary coil is one. The secondary coil 142 is arranged on any of an inner side portion from the annular wiring on an inner peripheral side, between the annular wiring on the inner peripheral side and the annular wiring on an outer peripheral side, and on the outer side portion from the annular wiring on the outer peripheral side configuring the primary coil 141. The reason why the primary coil 141 is configured by two annular wirings is to reduce the variation in the strength of coupling between each of the secondary coils 142 and the primary coil 141.

In the modification, the ratio of the number of turns of the second transformer 140 is about 4:3. According to this ratio of the number of turns, the output impedance of the preceding stage amplifier circuit 40 is converted to about ⁹⁄₁₆ times. Further, the power stage amplifier circuit 45 performs a differential operation, and thus the output impedance is further converted to ¼ times. As a result, the output impedance of the preceding stage amplifier circuit 40 is converted to about ⁹⁄₆₄ times.

As the modification illustrated in FIG. 27 and FIG. 28, by adjusting the ratio of the number of turns of the second transformer 140, the impedance conversion ratio of the output impedance of the preceding stage amplifier circuit 40 can be changed. The ratio of the number of turns of the second transformer 140 may be selected according to the impedance conversion ratio required to match the impedance between the preceding stage amplifier circuit 40 and the power stage amplifier circuit 45. For example, the number of turns of the primary coil 141 of the second transformer 140 may be selected from any integer.

In the case where the transistor rows 12 are arranged in two rows as in the eighth embodiment (FIG. 19A and FIG. 20), the number of turns of the secondary coil 142 may be selected from a value that is an integer multiple of about ½. In the case where the transistor rows 12 are arranged in four rows as in the ninth embodiment (FIG. 24 and FIG. 25), the number of turns of the secondary coil 142 may be selected from a value that is an integer multiple of about ¼.

Connection Mode of Secondary Coil of Second Transformer

Next, a connection mode of the secondary coil of the second transformer 140 applied to the power amplification module according to the eighth embodiment, the ninth embodiment, and the modifications thereof will be described with reference to the drawings of FIG. 29A to FIG. 31F.

The drawings of FIG. 29A to FIG. 29D are schematic diagrams illustrating the connection mode of the secondary coil 142 of the second transformer 140 in the case where the transistor rows 12 are arranged in two rows. The transistor rows 12 are respectively arranged along two sides facing each other of the convex polygon 30 having a substantially rectangular shape. Each of the transistor rows 12 is divided into the first block 12A and the second block 12B. The first block 12A and the second block 12B are defined so that a direction from the first block 12A toward the second block 12B in each of the transistor rows 12 is equal to a direction in which the convex polygon 30 rotates clockwise in the circumferential direction. In the drawings of FIG. 29A to FIG. 29D, only one of the plurality of secondary coils 142 is displayed.

The signal input port of the second block 12B of each of the transistor row 12 and the signal input port of the first block 12A of the transistor row 12 at a position shifted by m rows, which is the number of the transistor row 12, clockwise in the circumferential direction of the convex polygon 30 are connected by the secondary coil 142. Here, a parameter m is a natural number.

FIG. 29A corresponds to a case where m=1. This connection configuration corresponds to the eighth embodiment illustrated in FIG. 20.

FIG. 29B corresponds to a case where m=2. That is, the signal input port of the second block 12B and a signal input port of the first block 12A of the same transistor row 12 are connected by the secondary coil 142 that has approximately one turn in the circumferential direction of the convex polygon 30. This connection configuration corresponds to the modification illustrated in FIG. 22.

FIG. 29C corresponds to a case where m=3. A combination in which the signal input ports of the first block 12A and the second block 12B are connected to each other is the same as in the case where m=1 (FIG. 29A), but in a case where m=3, the secondary coil 142 has about 1.5 turns in the circumferential direction of the convex polygon 30.

FIG. 29D corresponds to a case where m=4. A combination in which the signal input ports of the first block 12A and the second block 12B are connected to each other is the same as in the case where m=2 (FIG. 29B), but in a case where m=4, the secondary coil 142 has about two turns in the circumferential direction of the convex polygon 30.

The drawings of FIG. 30A to FIG. 31F are schematic diagrams illustrating a connection mode of the secondary coil 142 of the second transformer 140 in a case where the transistor rows 12 are arranged in four rows. The transistor rows 12 are respectively arranged along four sides of the convex polygon 30 having a substantially square shape. Each of the transistor rows 12 is divided into the first block 12A and the second block 12B. As in the case illustrated in the drawings of FIG. 29A to FIG. 29D, the first block 12A and the second block 12B are defined so that a direction from the first block 12A toward the second block 12B in each of the transistor rows 12 is equal to a direction in which the convex polygon 30 rotates clockwise in the circumferential direction. In the drawings of FIG. 30A to FIG. 31F, only one of the plurality of secondary coils 142 is displayed.

The secondary coil 142 connects the signal input port of the second block 12B of each of the transistor row 12 and the signal input port of the first block 12A of the transistor row 12 at a position shifted by m rows, which is the number of the transistor row 12, clockwise or counterclockwise in the circumferential direction of the convex polygon 30. Here, the parameter m is a natural number. FIG. 30A, FIG. 30C, FIG. 30E, FIG. 31A, FIG. 31C, and FIG. 31E are examples of the clockwise movement, and correspond to the case where m=1, m=2, m=3, m=4, m=5, and m=6, respectively. FIG. 30B, FIG. 30D, FIG. 30F, FIG. 31B, FIG. 31D, and FIG. 31F are examples of the counterclockwise movement, and correspond to the case where m=1, m=2, m=3, m=4, m=5, and m=6, respectively.

By changing the parameter m, the ratio of the number of turns of the second transformer 140 is changed, and as a result, the impedance conversion ratio can be changed. The number of turns of the secondary coil 142 of the second transformer 140 is denoted as $m_2$, and the number of turns of the primary coil 141 is denoted as $m_1$. In a case where the transistor rows 12 are arranged in two rows, the number of turns $m_2$ of the secondary coil can be set to an integral multiple of about ½, and in a case where the transistor rows 12 are arranged in four rows, the number of turns $m_2$ of the secondary coil can be set to an integral multiple of about ¼.

The output impedance of the preceding stage amplifier circuit 40 is converted by $(m_2/m_1)^2$ times in accordance with the ratio of the number of turns of the second transformer 140. Further, the impedance is converted to ¼ times by the differential operation of the power stage transistor 13. Therefore, as a whole, the impedance conversion ratio is $(m_2/m_1)^2/4$ times.

In the example illustrated in FIG. 29A to FIG. 31F, more strictly, the number of turns of the secondary coil 142 changes depending on a connection position of the secondary coil 142 to the inter-stage signal wiring 35 (FIG. 20, FIG. 25, and FIG. 27) connected to the signal input ports of the first block 12A and the second block 12B. Depending on the preferable number of turns, the connection position of the secondary coil 142 to the inter-stage signal wiring 35 may be determined.

Connection Mode of Primary Coil of First Transformer

Next, with reference to FIG. 32A to FIG. 33D, a description will be given of a connection mode of the primary coil 131 of the first transformer 130 applied to the power amplification module according to the eighth embodiment, the ninth embodiment, and the modifications thereof.

Figure 32A:
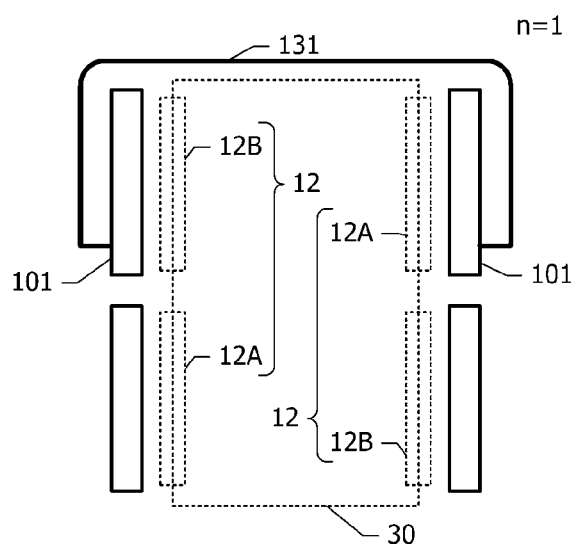
FIG. 32A and FIG. 32B are schematic diagrams illustrating a connection mode of a secondary coil of a first transformer in a case where the transistor rows are arranged in two rows.
Figure 32B:
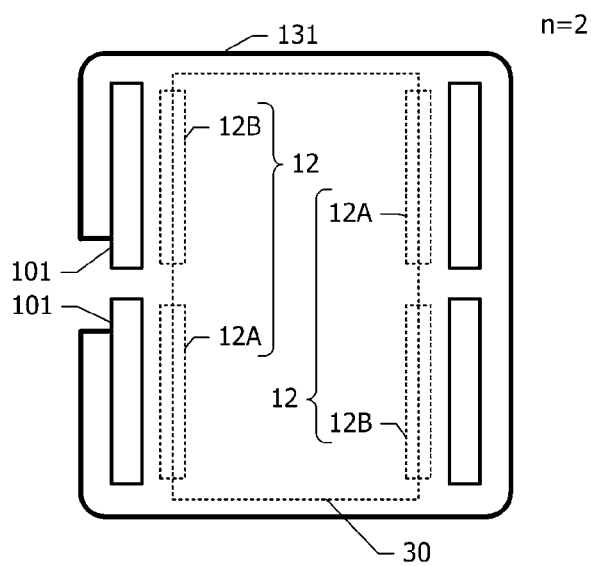
Figure 33A:
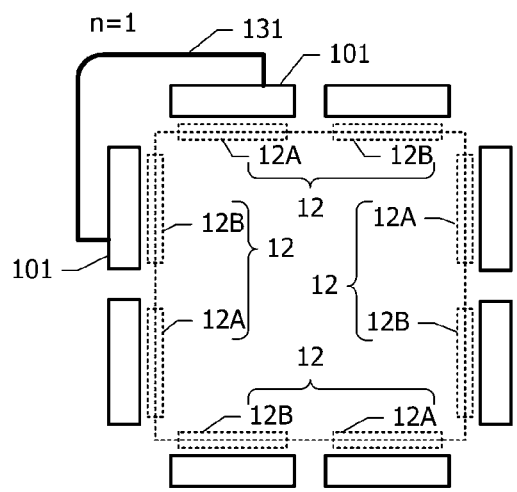
FIG. 33A to FIG. 33D are schematic diagrams illustrating a connection mode of the secondary coil of the first transformer in a case where the transistor rows are arranged in four rows.
Figure 33B:
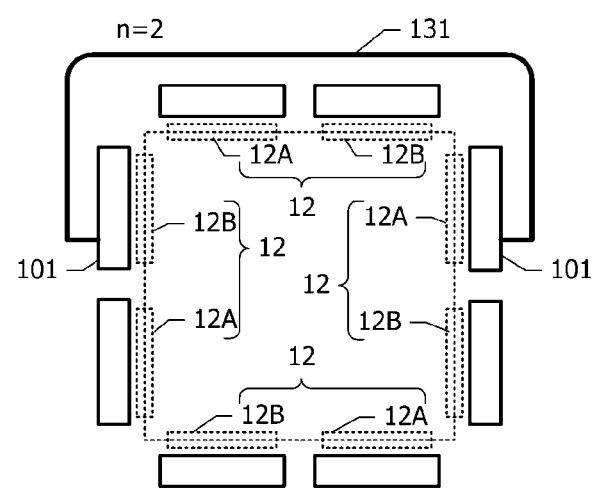
Figure 33C:
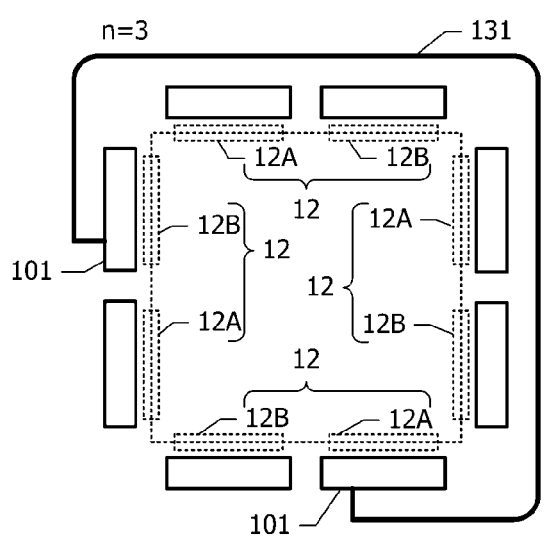
Figure 33D:
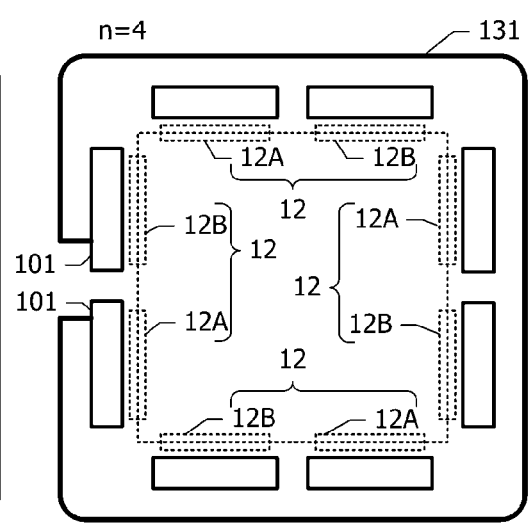

FIG. 32A and FIG. 32B are schematic diagrams illustrating a connection mode of the primary coil 131 of the first transformer 130 in the case where the transistor rows 12 are arranged in two rows. In FIG. 32A and FIG. 32B, only one of the plurality of primary coils 131 is displayed. The transistor rows 12 are respectively arranged along two sides facing each other of the convex polygon 30 having a substantially rectangular shape. Each of the transistor rows 12 is divided into the first block 12A and the second block 12B as in the case of the drawings of FIG. 29A to FIG. 29D.

The drawings of FIG. 33A to FIG. 33D are schematic diagrams illustrating a connection mode of the primary coil 131 of the first transformer 130 in the case where the transistor rows 12 are arranged in four rows. In the drawings of FIG. 33A to FIG. 33D, only one of the plurality of primary coils 131 is displayed. The transistor rows 12 are respectively arranged along four sides of the convex polygon 30 having a substantially square shape. Each of the transistor rows 12 is divided into the first block 12A and the second block 12B as in the case of the drawings of FIG. 30A to FIG. 31F.

As illustrated in the drawings of FIG. 32A to FIG. 33D, the first land 101 corresponding to the second block 12B of each of the plurality of transistor rows 12 and the first land 101 corresponding to the first block 12A of the transistor row 12 at a position shifted by n rows, which is the number of the transistor rows 12, clockwise in the circumferential direction of the convex polygon 30 are connected by the primary coil 131. Here, a parameter n is a natural number. The connection modes illustrated in FIG. 32A and FIG. 32B correspond to cases where n=1 and n=2, respectively. The connection modes illustrated in FIG. 33A, FIG. 33B, FIG. 33C, and FIG. 33D correspond to cases where n=1, n=2, n=3, and n=4, respectively.

By changing the parameter n, the ratio of the number of turns of the first transformer 130 can be changed. As a result, the impedance conversion ratio of the first transformer 130 can be changed.

Tenth Embodiment

Next, a power amplification module according to a tenth embodiment will be described with reference to FIG. 34 and FIG. 35. Hereinafter, a description of a configuration common to that of the power amplification module (FIG. 19A, FIG. 20, and FIG. 21) according to the eighth embodiment will be omitted.

Figure 34:
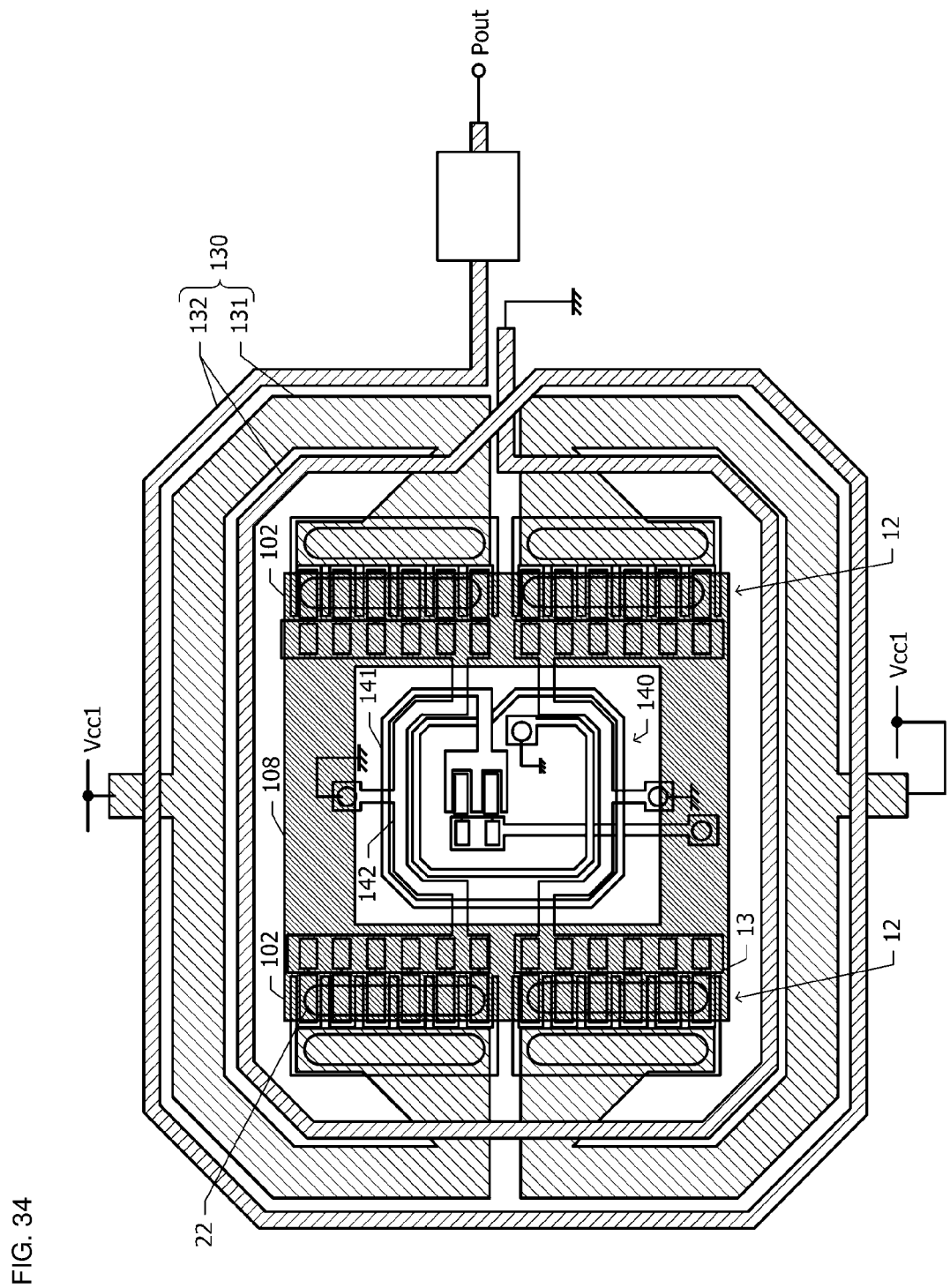
FIG. 34 is a diagram illustrating a positional relationship between a plurality of components of a power stage amplifier circuit and an output impedance conversion circuit of a power amplification module according to a tenth embodiment in a plan view.

FIG. 34 is a diagram illustrating a positional relationship of a plurality of components of a power stage amplifier circuit and an output impedance conversion circuit of the power amplification module according to the tenth embodiment in a plan view. In FIG. 19A corresponding to the eighth embodiment, the conductor film on the circuit board 100 (FIG. 2) connected to the emitter (ground port) of the power stage transistor 13 is not displayed, but in FIG. 34, a conductor film 108 connected to the emitter is displayed. In FIG. 34, among the conductor films on the circuit board 100 (FIG. 2), the conductor film connected to the collector (signal output port) of the power stage transistor 13 and the secondary coil 132 of the first transformer 130 are marked with a relatively thin hatching, and the conductor film connected to the emitter is marked with a relatively thick hatching.

The emitter of the power stage transistor 13 is connected to the second land 102 on the circuit board 100 (FIG. 2) via the second bump 22. The second land 102 is arranged for each of the transistor rows 12. The conductor film 108 including two second lands 102 in a portion thereof surrounds the second transformer 140 in a plan view.

Figure 35:
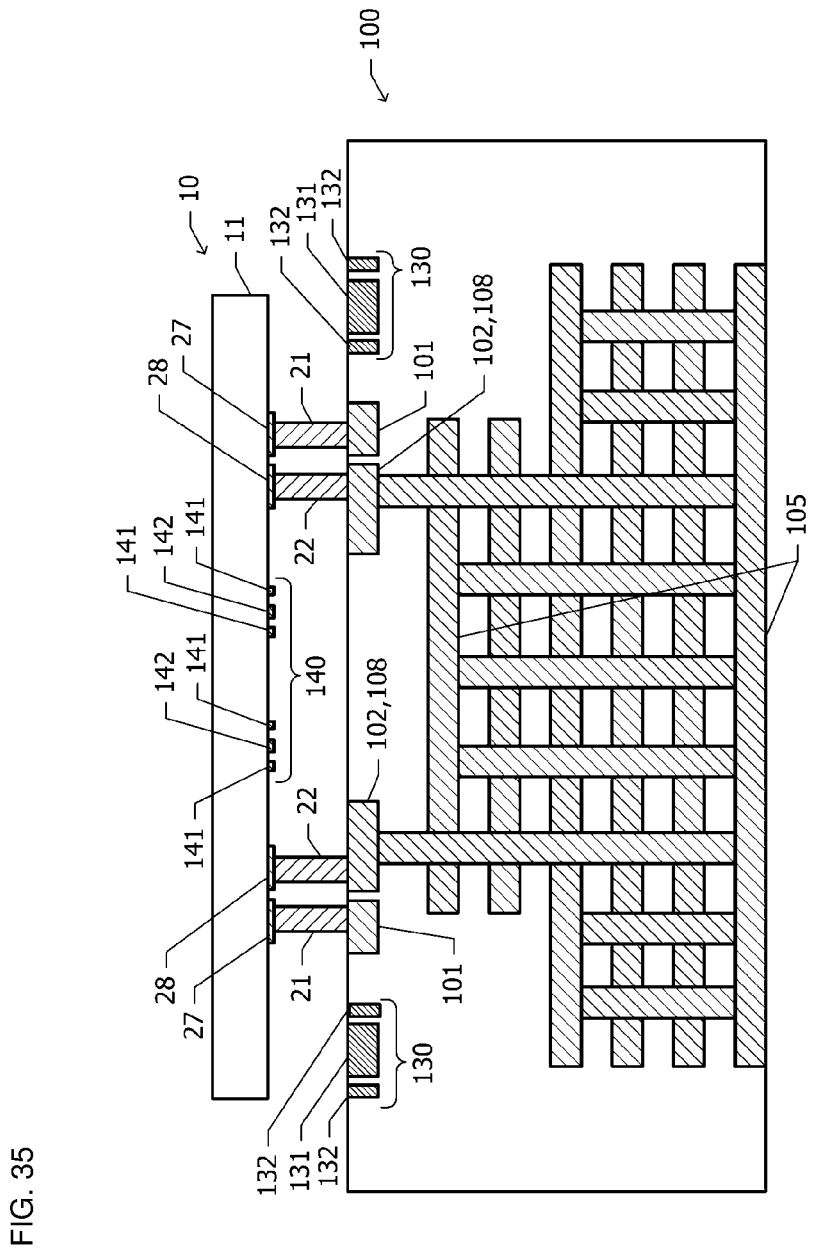
FIG. 35 is a cross-sectional view of the power amplification module according to the tenth embodiment.

FIG. 35 is a cross-sectional view of the power amplification module according to the tenth embodiment. The collector pad 27, the emitter pad 28, and the second transformer 140 are arranged on the surface of the substrate 11 of the semiconductor chip 10, the surface facing the circuit board 100. The second transformer 140 is configured by the primary coil 141 and the secondary coil 142.

The first land 101, the second land 102, and the first transformer 130 are arranged on the surface of the circuit board 100 on which the semiconductor chip 10 is mounted. The second land 102 configures a part of the annular conductor film 108 (FIG. 34). The collector pad 27 is connected to the first land 101 with the first bump 21 interposed therebetween, and the emitter pad 28 is connected to the second land 102 with the second bump 22 interposed therebetween. The first transformer 130 is configured by the primary coil 131 and the secondary coil 132. The second land 102 is connected to the ground pattern 105 provided in the circuit board 100.

Next, an excellent effect of the tenth embodiment will be described. A high-frequency magnetic field is generated by a high-frequency current flowing through the first transformer 130. When the high-frequency magnetic field interlinks with the primary coil 141 and the secondary coil 142 of the second transformer 140, a high-frequency current is induced in the primary coil 141 and the secondary coil 142 of the second transformer 140. When the high-frequency current is fed back to the power stage amplifier circuit 45, the operation of the power stage amplifier circuit 45 becomes unstable.

In the tenth embodiment, when the high-frequency current flows through the first transformer 130, a high-frequency current is induced in the annular conductor film 108. The magnetic field caused by the high-frequency current induced in the conductor film 108 cancels the magnetic field generated by the high-frequency current flowing through the first transformer 130. As a result, influence on the second transformer 140 can be reduced. This makes it possible to obtain an excellent effect that a phenomenon in which the operation of the power stage amplifier circuit 45 becomes unstable is less likely to occur.

Next, a power amplification module according to a modification of a tenth embodiment will be described with reference to FIG. 36.

Figure 36:
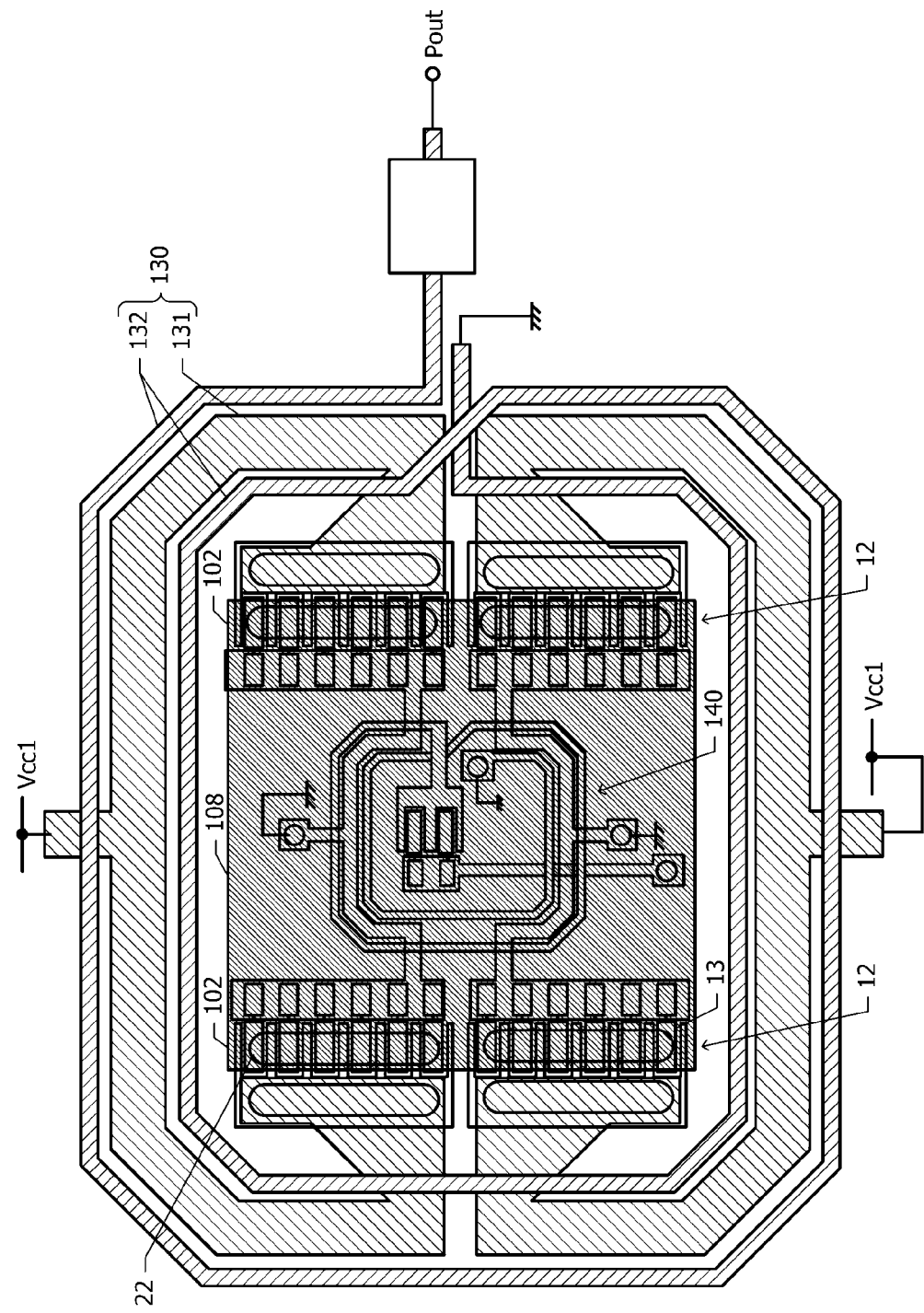
FIG. 36 is a diagram illustrating a positional relationship between a plurality of components of a power stage amplifier circuit and an output impedance conversion circuit of a power amplification module according to a modification of the tenth embodiment in a plan view.

FIG. 36 is a diagram illustrating a positional relationship between a plurality of components of a power stage amplifier circuit and an output impedance conversion circuit of the power amplification module in a plan view according to the modification of the tenth embodiment. In the tenth embodiment, the conductor film 108 has a substantially annular shape surrounding the second transformer 140 in a plan view. On the other hand, in the modification illustrated in FIG. 36, the conductor film 108 includes the second transformer 140 in a plan view.

In the modification, as compared with the case of the tenth embodiment, an effect that the second transformer 140 is less likely to be affected by the high-frequency magnetic field caused by the high-frequency current flowing through the first transformer 130 can be enhanced.

Next, another modification of the tenth embodiment will be described. In the tenth embodiment, the conductor film 108 is arranged in the uppermost layer (first layer counted from the mounting surface) of the circuit board 100, but may be arranged in the second layer counted from the mounting surface.

Eleventh Embodiment

Next, a power amplification module according to an eleventh embodiment will be described with reference to FIG. 37 and FIG. 38. Hereinafter, a description of a configuration common to that of the power amplification module (FIG. 19A, FIG. 20, and FIG. 21) according to the eighth embodiment will be omitted.

Figure 37:
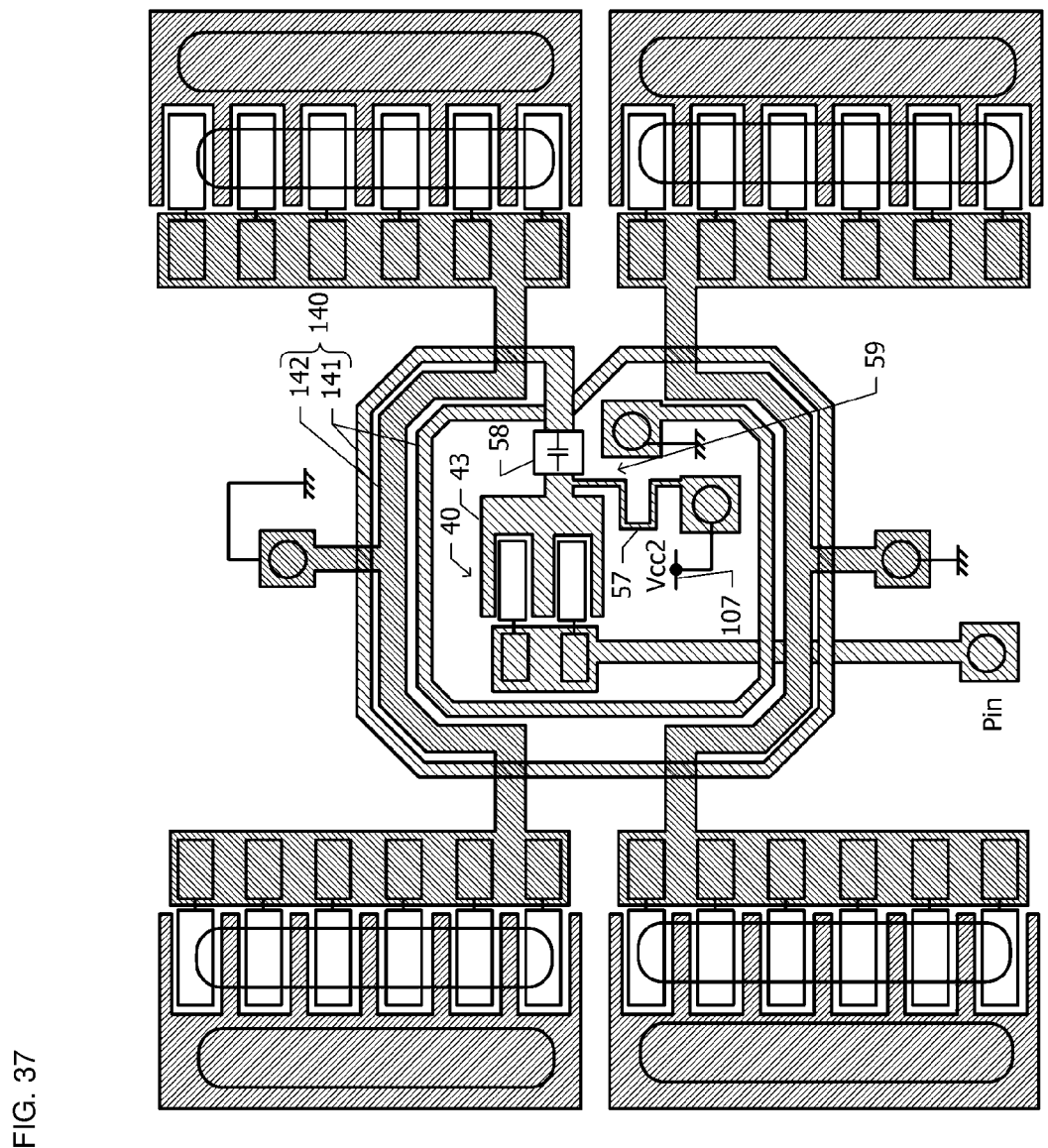
FIG. 37 is a diagram illustrating a positional relationship of a circuit that generates a differential signal input to a plurality of power stage transistors and components of a preceding stage amplifier circuit of a power amplification module according to an eleventh embodiment in a plan view.

FIG. 37 is a diagram illustrating a positional relationship in a plan view of a circuit that generates a differential signal input to the plurality of power stage transistors 13 and components of the preceding stage amplifier circuit 40 of the power amplification module according to the eleventh embodiment. In the eighth embodiment, the collector wiring 43 connected to the signal output port of the preceding stage amplifier circuit 40 (FIG. 20) is directly connected to the primary coil 141 of the second transformer 140. In contrast, in the modification illustrated in FIG. 37, a second auxiliary impedance conversion circuit 59 is inserted between the collector wiring 43 and the primary coil 141 of the second transformer 140.

The second auxiliary impedance conversion circuit 59 includes an inductor 57 and a capacitor 58 having the MIM structure. One end of the inductor 57 is connected to the collector wiring 43, and the other end thereof is connected to the second power supply wiring 107 of the circuit board 100 (FIG. 2). The capacitor 58 is inserted in series between the collector wiring 43 and the primary coil 141.

Figure 38:
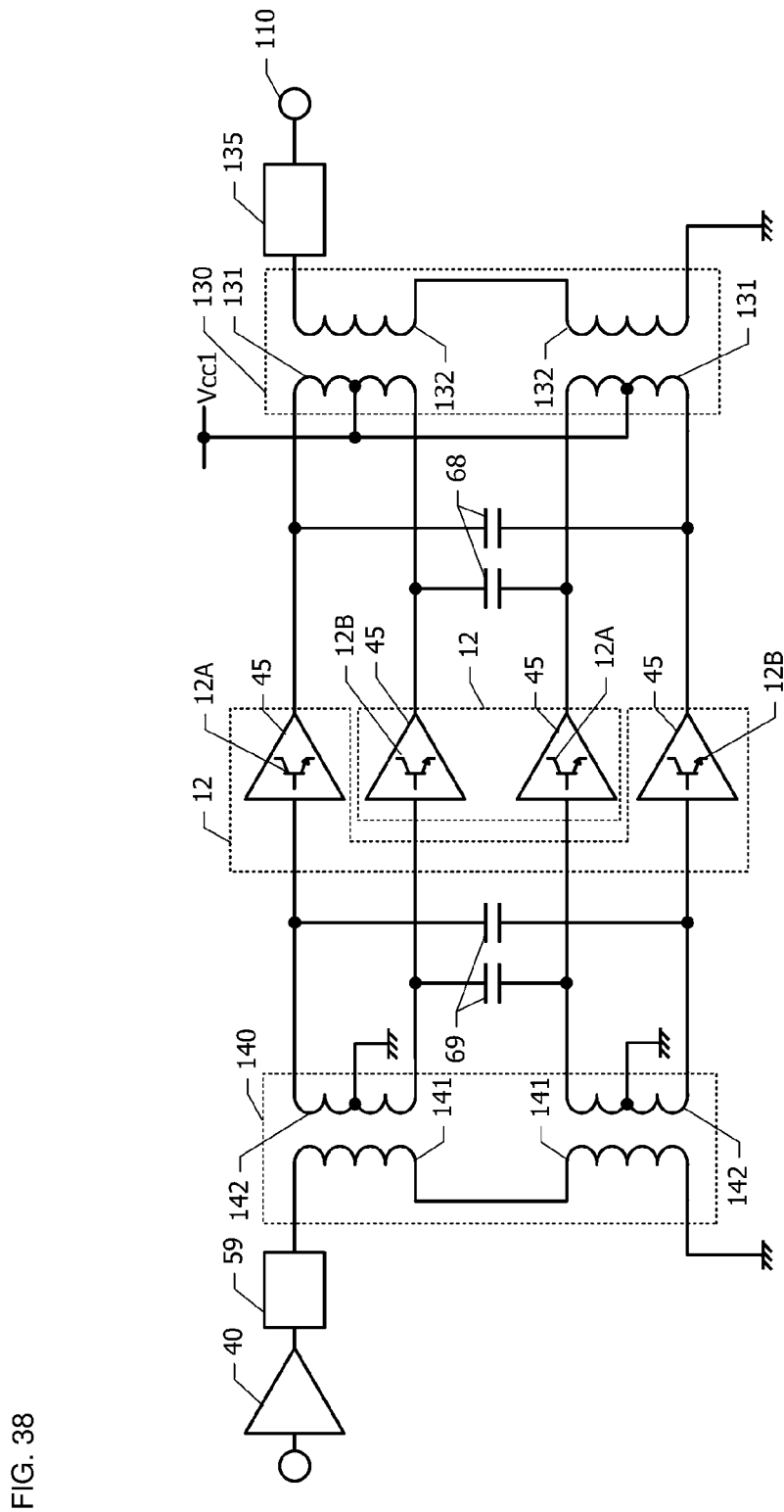
FIG. 38 is an equivalent circuit diagram of the power amplification module according to the eleventh embodiment.

FIG. 38 is an equivalent circuit diagram of the power amplification module according to the eleventh embodiment. The second auxiliary impedance conversion circuit 59 is inserted between the signal output port of the preceding stage amplifier circuit 40 and the primary coil 141 of the second transformer 140. Other configurations are the same as the equivalent circuit diagrams (FIG. 21) of the power amplification module according to the eighth embodiment.

Next, an excellent effect of the eleventh embodiment will be described.

In the power amplification module (FIG. 21) according to the eighth embodiment, the conversion ratio of the output impedance of the preceding stage amplifier circuit 40 is determined depending on the ratio of the number of turns of the second transformer 140, and thus it is difficult to continuously change the conversion ratio. In the eleventh embodiment, the second auxiliary impedance conversion circuit 59 is provided, whereby it is possible to finely adjust the impedance conversion ratio. As such, the impedance between the preceding stage amplifier circuit 40 and the power stage amplifier circuit 45 can be more accurately matched. As a result, it is possible to obtain an excellent effect that the gain of the power amplification module becomes larger.

By respectively arranging the plurality of transistor rows along the plurality of sides of the convex polygon, an increase in the length of the transistor row can be suppressed, as compared with a case in which the transistor row is arranged along one straight line. By arranging the individual reactance element of the first impedance conversion circuit corresponding to each of the groups of the power stage transistors, the signal path from the power stage transistor to the first impedance conversion circuit can be shortened. As a result, it is possible to suppress an increase in the parasitic resistance and an increase in the variation in the parasitic inductance of the signal path.

It will be appreciated that the embodiments described above are illustrative only, and that partial substitutions or combinations of the configurations described in different embodiments may be possible. Similar actions and effects according to the same configuration of the plurality of embodiments will not be described in order for each embodiment. Further, the present disclosure is not limited to the above-described embodiments. For example, it will be apparent to those skilled in the art that various modifications, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification module comprising a circuit board and a semiconductor chip mounted on the circuit board,
    the semiconductor chip including:
        a substrate;
        a plurality of transistor rows in or on the substrate, each of the plurality of transistor rows including a plurality of power stage transistors arranged in a straight line, and each of the plurality of power stage transistors being a bipolar transistor or an electric field effect transistor having an emitter or a source as a ground port, a collector or a drain as a signal output port, and a base or a gate as a signal input port;
        a plurality of first bumps arranged respectively corresponding to the plurality of transistor rows and connected to a signal output port of the plurality of power stage transistors included in a corresponding transistor row; and
        a plurality of second bumps arranged respectively corresponding to the plurality of transistor rows and connected to a ground port of the plurality of power stage transistors included in a corresponding transistor row,
    the plurality of transistor rows being respectively arranged along a plurality of sides of a convex polygon,
    the circuit board including:
        a plurality of first lands respectively connected to the plurality of first bumps;
        a plurality of second lands respectively connected to the plurality of second bumps;
        a ground pattern connected to the plurality of second lands;
        a signal output terminal; and
        a first impedance conversion circuit that connects the plurality of first lands
    and the signal output terminal, and
    the plurality of power stage transistors being grouped into a plurality of groups, and the first impedance conversion circuit including a plurality of individual reactance elements arranged for each of the plurality of groups.

2. The power amplification module according to claim 1, wherein
    a shape of each of the plurality of first bumps in a plan view is longer in a direction parallel to an arrangement direction of the plurality of power stage transistors belonging to a transistor row corresponding to each of the plurality of first bumps.

3. The power amplification module according to claim 1, wherein
    the plurality of first bumps is arranged corresponding to each of the plurality of transistor rows, and is arranged side by side in a direction parallel to an arrangement direction of the plurality of power stage transistors included in a corresponding transistor row.

4. The power amplification module according to claim 1, wherein
    the semiconductor chip further includes a capacitor connected between each of the plurality of first bumps and a signal output port of the plurality of power stage transistors included in a transistor row corresponding to each first bump.

5. The power amplification module according to claim 1, wherein
    when viewed from a geometric center of the convex polygon, each of the plurality of first bumps is arranged at a position farther than a corresponding second bump, and
    the semiconductor chip further includes:
        a preceding stage amplifier circuit that is arranged inside the convex polygon in a plan view and configured to output a high-frequency signal input to the plurality of power stage transistors; and
        a second impedance conversion circuit connected between the preceding stage amplifier circuit and the plurality of power stage transistors.

6. The power amplification module according to claim 5, wherein
    the second impedance conversion circuit includes:
        a reactance element arranged corresponding to each of the plurality of transistor rows; and
        another reactance element shared by the plurality of transistor rows.

7. The power amplification module according to claim 1, wherein
    the plurality of transistor rows and the plurality of groups are in a one-to-one correspondence.

8. The power amplification module according to claim 1, wherein
    each of the plurality of transistor rows is divided into a first block and a second block at a center in a length direction of each of the plurality of transistor rows in a manner such that the first block and the second block are alternately arranged in a circumferential direction of the convex polygon, the plurality of first bumps and the plurality of first lands are arranged respectively corresponding to the first block and the second block of the plurality of transistor rows, the circuit board further includes a power supply wiring, the first impedance conversion circuit includes a first transformer, each of the plurality of individual reactance elements of the first impedance conversion circuit connects, by using a parameter n as a natural number, a first land corresponding to the second block of each of the plurality of transistor rows and a first land corresponding to the first block of a transistor row at a position shifted by n rows, which is a number of transistor rows, in a first rotation direction in a circumferential direction of the convex polygon to configure a primary coil of the first transformer, the first transformer further includes a secondary coil connected to the signal output terminal, and lengths of the plurality of primary coils are equal to each other, and each of the plurality of primary coils is connected to the power supply wiring at a center in a length direction.

9. The power amplification module according to claim 8, wherein the convex polygon is a square or a rectangle, the plurality of transistor rows is configured by two transistor rows respectively arranged along two sides facing each other of the convex polygon, the parameter n is 1, and a plurality of primary coils of the first transformer surrounds the convex polygon.

10. The power amplification module according to claim 8, wherein the convex polygon is a square, the plurality of transistor rows is configured by four transistor rows respectively arranged along four sides of the convex polygon, the parameter n is 1, and a plurality of primary coils of the first transformer surrounds the convex polygon.

11. The power amplification module according to claim 8, wherein the circuit board further includes a first auxiliary impedance conversion circuit inserted between a secondary coil of the first transformer and the signal output terminal.

12. The power amplification module according to claim 8, wherein in a plan view, each of the plurality of primary coils includes a first portion extending from the first land toward an outer side portion of the convex polygon and a second portion extending from a tip of the first portion in a circumferential direction of the convex polygon, and a width of the first portion becomes narrower from the first land toward a tip of the first portion.

13. The power amplification module according to claim 8, wherein at least one preceding stage transistor is shared by the plurality of transistor rows.

14. The power amplification module according to claim 8, wherein the convex polygon is a square or a rectangle;

the plurality of transistor rows is configured by two transistor rows respectively arranged along two sides facing each other of the convex polygon, when viewed from a geometric center of the convex polygon, each of the plurality of first bumps is arranged at a position farther than a corresponding second bump, the semiconductor chip further includes:

a preceding stage amplifier circuit that is arranged inside the convex polygon in a plan view and configured to output a high-frequency signal input to the plurality of power stage transistors; and a second impedance conversion circuit connected between the preceding stage amplifier circuit and a plurality of power stage transistors, and the second impedance conversion circuit is configured to input high-frequency signals in the same phase to the plurality of power stage transistors of the first block of the two transistor rows, and input a high-frequency signal that is opposite in phase to a high-frequency signal input to the plurality of power stage transistors of the first block to the plurality of power stage transistors of the second block of the two transistor rows.

15. The power amplification module according to claim 14, wherein the second impedance conversion circuit includes a second transformer, the second transformer includes:

a primary coil connected to the preceding stage amplifier circuit; and two secondary coils that connect a signal input port of the plurality of power stage transistors of the first block of the two transistor rows and a signal input port of the plurality of power stage transistors of the second block of respectively the same transistor row or another transistor row, and each of the two secondary coils is grounded at a center in a length direction.

16. The power amplification module according to claim 8, wherein the convex polygon is a square, the plurality of transistor rows is configured by four transistor rows respectively arranged along four sides of the convex polygon, when viewed from a geometric center of the convex polygon, each of the plurality of first bumps is arranged at a position farther than a corresponding second bump, and the semiconductor chip further includes:

a preceding stage amplifier circuit that is arranged inside the convex polygon in a plan view, and includes a signal output end from which a high-frequency signal is output; and a second impedance conversion circuit inserted in a signal path between the preceding stage amplifier circuit and a signal input port of a plurality of power stage transistors respectively included in the first block and the second block of each of the four transistor rows, and the second impedance conversion circuit is configured to input high-frequency signals in the same phase to the plurality of power stage transistors of the first block of the four transistor rows, and input a high-frequency signal that is opposite in phase to a high-frequency signal input to the plurality of power stage transistors of the first block to the plurality of power stage transistors of the second block of the four transistor rows.

17. The power amplification module according to claim 16, wherein the second impedance conversion circuit includes a second transformer, and the second transformer includes:
- a primary coil connected to the preceding stage amplifier circuit; and
- a plurality of secondary coils that connects, when a parameter m is a natural number, a signal input port of the plurality of power stage transistors of the second block and a signal input port of the plurality of power stage transistors of the first block of a transistor row at a position shifted by m rows, which is a number of transistor rows, in a first rotation direction in a circumferential direction of the convex polygon, of each of the four transistor rows, and
- each of the plurality of secondary coils is grounded at a center in a length direction.

18. The power amplification module according to claim 15, wherein
- the circuit board further includes a conductor film connected to the plurality of second lands, and
- the plurality of second lands and the conductor film surround the second transformer in a plan view.

19. The power amplification module according to claim 15, wherein
- the circuit board further includes a conductor film connected to the second land, and
- the conductor film includes the second transformer in a plan view.

20. The power amplification module according to claim 15, wherein
- the semiconductor chip further includes an auxiliary impedance conversion circuit inserted in a signal path between the preceding stage amplifier circuit and the second transformer.

* * * * *